United States Patent
Yamauchi et al.

(10) Patent No.: US 9,340,122 B2
(45) Date of Patent: May 17, 2016

(54) BATTERY SYSTEM MONITORING APPARATUS

(75) Inventors: Tatsumi Yamauchi, Hitachinaka (JP);
Akihiro Machida, Hitachinaka (JP);
Akihiko Kudo, Hitachinaka (JP);
Akihiko Emori, Hitachinaka (JP);
Mutsumi Kikuchi, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 284 days.

(21) Appl. No.: 14/122,463

(22) PCT Filed: Aug. 18, 2011

(86) PCT No.: PCT/JP2011/068697
§ 371 (c)(1),
(2), (4) Date: Feb. 7, 2014

(87) PCT Pub. No.: WO2012/164761
PCT Pub. Date: Dec. 6, 2012

(65) Prior Publication Data
US 2014/0152261 A1  Jun. 5, 2014

(30) Foreign Application Priority Data

May 31, 2011  (JP) .................................. 2011-122730
May 31, 2011  (JP) .................................. 2011-122731

(51) Int. Cl.
*B60L 11/18* (2006.01)
*H02J 7/00* (2006.01)
(Continued)

(52) U.S. Cl.
CPC ........... *B60L 11/1866* (2013.01); *B60L 3/0046* (2013.01); *B60L 11/1803* (2013.01); *B60L 11/1859* (2013.01); *H01M 10/425* (2013.01);
(Continued)

(58) Field of Classification Search
CPC .................................................. B60L 11/1866
USPC .......................................................... 320/118
See application file for complete search history.

(56) References Cited

U.S. PATENT DOCUMENTS

| | | | |
|---|---|---|---|
| 2011/0316549 A1 | 12/2011 | Coenen | |
| 2014/0225622 A1* | 8/2014 | Kudo | B60L 3/0046 324/433 |
| 2014/0327400 A1* | 11/2014 | Kudo | H02J 7/0016 320/118 |

FOREIGN PATENT DOCUMENTS

| | | |
|---|---|---|
| EP | 2 230 529 A1 | 9/2010 |
| JP | 2003-032907 A | 1/2003 |

(Continued)

*Primary Examiner* — Sun Lin
(74) *Attorney, Agent, or Firm* — Volpe and Koenig, P.C.

(57) ABSTRACT

A battery system monitoring apparatus that monitors a battery system is provided having a cell group having a plurality of unit cells connected in series, including: a first control device that controls the cell group; and a plurality of voltage detection lines that connect positive electrodes and negative electrodes of the unit cells to the first control device, for measuring inter-terminal voltages of the unit cells. The first control device includes a balancing switch connected between the voltage detection line connected to the positive electrode of each unit cell and the voltage detection line connected to the negative electrode thereof for conducting balancing discharge of the unit cell, for each of the unit cells. A first resistor is disposed in series with each of the voltage detection lines, a first capacitor is connected between the voltage detection line, and a GND which is a lowest-level potential of the cell group.

22 Claims, 37 Drawing Sheets

(51) Int. Cl.
　　　*H01M 10/42*　　　(2006.01)
　　　*H01M 10/48*　　　(2006.01)
　　　*H01M 10/44*　　　(2006.01)
　　　*B60L 3/00*　　　(2006.01)

(52) U.S. Cl.
　　　CPC ........ *H01M 10/4264* (2013.01); *H01M 10/441* (2013.01); *H01M 10/482* (2013.01); *H02J 7/0016* (2013.01); *H02J 7/0021* (2013.01); *B60L 2200/26* (2013.01); *B60L 2240/545* (2013.01); *B60L 2240/547* (2013.01); *B60L 2240/549* (2013.01); *H01M 2010/4271* (2013.01); *H01M 2220/20* (2013.01); *Y02T 10/7005* (2013.01); *Y02T 10/7055* (2013.01); *Y02T 10/7061* (2013.01)

(56) References Cited

FOREIGN PATENT DOCUMENTS

| | | | |
|---|---|---|---|
| JP | 2003-084015 A | 3/2003 |
| JP | 2005-318750 A | 11/2005 |
| JP | 2005-318751 A | 11/2005 |
| JP | 4092580 B2 | 3/2008 |
| JP | 2008-092656 A | 4/2008 |
| JP | 2008-295299 A | 12/2008 |
| JP | 2009-027915 A | 2/2009 |
| JP | 2009-027916 A | 2/2009 |
| JP | 2009-050155 A | 3/2009 |
| JP | 2009-089488 A | 4/2009 |
| JP | 2009-183025 A | 8/2009 |
| JP | 2009-236711 A | 10/2009 |
| JP | 2010-178400 A | 8/2010 |
| JP | 2010-193589 A | 9/2010 |
| JP | 2010-233359 A | 10/2010 |
| JP | 2010-249793 A | 11/2010 |
| JP | 2011-055702 A | 3/2011 |
| JP | 2011-166867 A | 8/2011 |
| JP | 2011-217606 A | 10/2011 |
| JP | 2011-234506 A | 11/2011 |
| JP | 2011-253777 A | 12/2011 |
| JP | 2012-090474 A | 5/2012 |
| JP | 2013-085468 A | 5/2013 |
| JP | 2013-108991 A | 6/2013 |
| JP | 2013-122452 A | 6/2013 |
| JP | 2013-152231 A | 8/2013 |

* cited by examiner

| MEASUREMENT NO. | M1X1-12 | M2X1-12 | M3X1-12 | M4X1-12 | M5X1-12 | M6X1-12 | M7X1-12 | M8X1-12 | M9X1-12 | M10X1-12 | M11X1-12 | M12X1-12 |
|---|---|---|---|---|---|---|---|---|---|---|---|---|
| MEASUREMENT CELL | CELL 1-12 | CELL 1-12 | CELL 1-12 | CELL 1-12 | CELL 1-12 | CELL 1-12 | CELL 1-12 | CELL 1-12 | CELL 1-12 | CELL 1-12 | CELL 1-12 | CELL 1-12 |
| SWX1 | ON | OFF | OFF | OFF | OFF | OFF | OFF | OFF | OFF | OFF | OFF | OFF |
| SWX2 | OFF | ON | OFF | OFF | OFF | OFF | OFF | OFF | OFF | OFF | OFF | OFF |
| SWX3 | OFF | OFF | ON | OFF | OFF | OFF | OFF | OFF | OFF | OFF | OFF | OFF |
| SWX4 | OFF | OFF | OFF | ON | OFF | OFF | OFF | OFF | OFF | OFF | OFF | OFF |
| SWX5 | OFF | OFF | OFF | OFF | ON | OFF | OFF | OFF | OFF | OFF | OFF | OFF |
| SWX6 | OFF | OFF | OFF | OFF | OFF | ON | OFF | OFF | OFF | OFF | OFF | OFF |
| SWX7 | OFF | OFF | OFF | OFF | OFF | OFF | ON | OFF | OFF | OFF | OFF | OFF |
| SWX8 | OFF | OFF | OFF | OFF | OFF | OFF | OFF | ON | OFF | OFF | OFF | OFF |
| SWX9 | OFF | OFF | OFF | OFF | OFF | OFF | OFF | OFF | ON | OFF | OFF | OFF |
| SWX10 | OFF | OFF | OFF | OFF | OFF | OFF | OFF | OFF | OFF | ON | OFF | OFF |
| SWX11 | OFF | OFF | OFF | OFF | OFF | OFF | OFF | OFF | OFF | OFF | ON | OFF |
| SWX12 | OFF | OFF | OFF | OFF | OFF | OFF | OFF | OFF | OFF | OFF | OFF | ON |

MPX INPUT SHORT-CIRCUITING SWITCH STATE (b)

| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 |
|---|---|---|---|---|---|---|---|---|---|---|---|---|
| M1X1-12 | 0 | 1 | 1 | 1 | 1 | 1 | 1 | 1 | 1 | 1 | 1 | 1 |
| M2X1-12 | 1 | 0 | 1 | 1 | 1 | 1 | 1 | 1 | 1 | 1 | 1 | 1 |
| M3X1-12 | 1 | 1 | 0 | 1 | 1 | 1 | 1 | 1 | 1 | 1 | 1 | 1 |
| M4X1-12 | 1 | 1 | 1 | 0 | 1 | 1 | 1 | 1 | 1 | 1 | 1 | 1 |
| M5X1-12 | 1 | 1 | 1 | 1 | 0 | 1 | 1 | 1 | 1 | 1 | 1 | 1 |
| M6X1-12 | 1 | 1 | 1 | 1 | 1 | 0 | 1 | 1 | 1 | 1 | 1 | 1 |
| M7X1-12 | 1 | 1 | 1 | 1 | 1 | 1 | 0 | 1 | 1 | 1 | 1 | 1 |
| M8X1-12 | 1 | 1 | 1 | 1 | 1 | 1 | 1 | 0 | 1 | 1 | 1 | 1 |
| M9X1-12 | 1 | 1 | 1 | 1 | 1 | 1 | 1 | 1 | 0 | 1 | 1 | 1 |
| M10X1-12 | 1 | 1 | 1 | 1 | 1 | 1 | 1 | 1 | 1 | 0 | 1 | 1 |
| M11X1-12 | 1 | 1 | 1 | 1 | 1 | 1 | 1 | 1 | 1 | 1 | 0 | 1 |
| M12X1-12 | 1 | 1 | 1 | 1 | 1 | 1 | 1 | 1 | 1 | 1 | 1 | 0 |

DETECTED VOLTAGE RESULT

FIG. 17
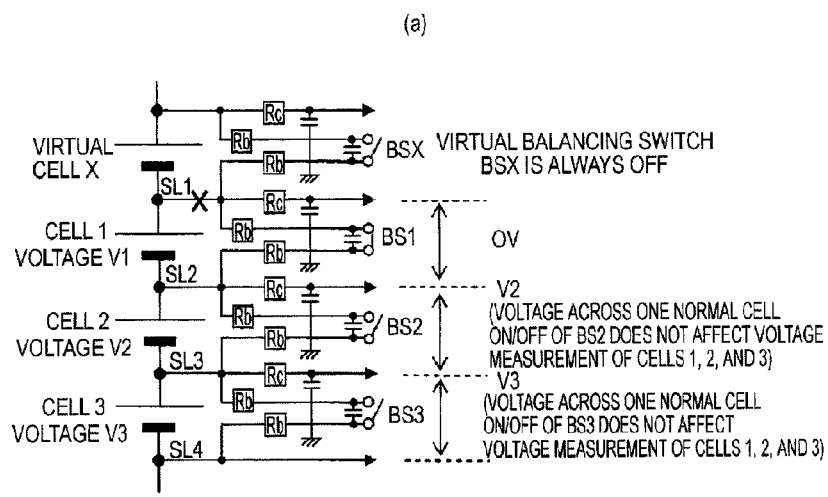
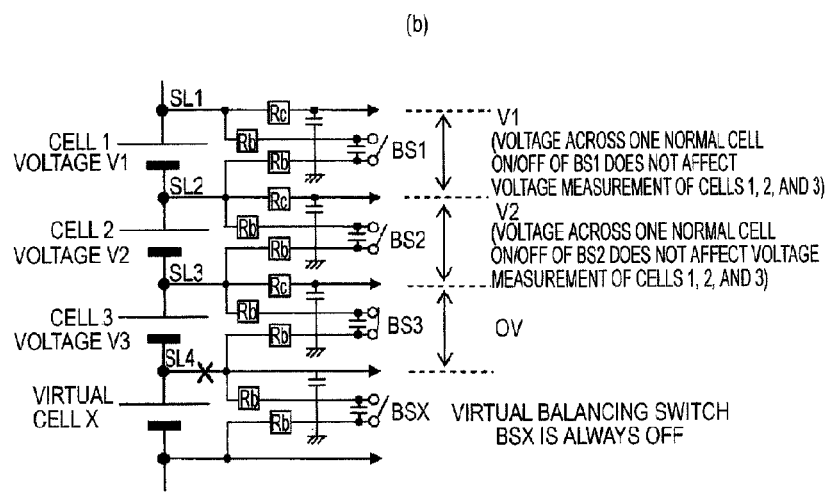

| MEASUREMENT NO. | M1A | M2A | M3A | M4A | M5A | M6A | M7A | M8A | M9A | M10A | M11A | M12A | M13A | M14A |
|---|---|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 | CELL 11 | CELL 12 |
| BS1 | ON | OFF | B | B | B | B | B | B | B | B | B | B | B | B |
| BS2 | B | ON | OFF | B | B | B | B | B | B | B | B | B | B | B |
| BS3 | B | B | ON | OFF | B | B | B | B | B | B | B | B | B | B |
| BS4 | B | B | B | ON | OFF | B | B | B | B | B | B | B | B | B |
| BS5 | B | B | B | B | ON | OFF | B | B | B | B | B | B | B | B |
| BS6 | B | B | B | B | B | ON | OFF | B | B | B | B | B | B | B |
| BS7 | B | B | B | B | B | B | ON | OFF | B | B | B | B | B | B |
| BS8 | B | B | B | B | B | B | B | ON | OFF | B | B | B | B | B |
| BS9 | B | B | B | B | B | B | B | B | ON | OFF | B | B | B | B |
| BS10 | B | B | B | B | B | B | B | B | B | ON | OFF | B | B | B |
| BS11 | B | B | B | B | B | B | B | B | B | B | ON | OFF | B | B |
| BS12 | B | B | B | B | B | B | B | B | B | B | B | B | ON | OFF |

BALANCING SW STATE (b)

| MEASUREMENT NO. | M1A | M2A | M3A | M4A | M5A | M6A | M7A | M8A | M9A | M10A | M11A | M12A | M13A | M14A | DISCONNECTION FLAG |
|---|---|---|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 | CELL 11 | CELL 12 | |
| S1 DISCONNECTION | 0 | 1 | 1 | 1 | 1 | 1 | 1 | 1 | 1 | 1 | 1 | 1 | 1 | 1 | FL1=1 |
| S2 DISCONNECTION | (0,1) | 0 | 1 | 1 | 1 | 1 | 1 | 1 | 1 | 1 | 1 | 1 | 1 | 1 | FL2=1 |
| S3 DISCONNECTION | 1 | (0,1) | 0 | 1 | 1 | 1 | 1 | 1 | 1 | 1 | 1 | 1 | 1 | 1 | FL3=1 |
| S4 DISCONNECTION | 1 | 1 | (0,1) | 0 | 1 | 1 | 1 | 1 | 1 | 1 | 1 | 1 | 1 | 1 | FL4=1 |
| S5 DISCONNECTION | 1 | 1 | 1 | (0,1) | 0 | 1 | 1 | 1 | 1 | 1 | 1 | 1 | 1 | 1 | FL5=1 |
| S6 DISCONNECTION | 1 | 1 | 1 | 1 | (0,1) | 0 | 1 | 1 | 1 | 1 | 1 | 1 | 1 | 1 | FL6=1 |
| S7 DISCONNECTION | 1 | 1 | 1 | 1 | 1 | (0,1) | 0 | 1 | 1 | 1 | 1 | 1 | 1 | 1 | FL7=1 |
| S8 DISCONNECTION | 1 | 1 | 1 | 1 | 1 | 1 | (0,1) | 0 | 1 | 1 | 1 | 1 | 1 | 1 | FL8=1 |
| S9 DISCONNECTION | 1 | 1 | 1 | 1 | 1 | 1 | 1 | (0,1) | 0 | 1 | 1 | 1 | 1 | 1 | FL9=1 |
| S10 DISCONNECTION | 1 | 1 | 1 | 1 | 1 | 1 | 1 | 1 | (0,1) | 0 | 1 | 1 | 1 | 1 | FL10=1 |
| S11 DISCONNECTION | 1 | 1 | 1 | 1 | 1 | 1 | 1 | 1 | 1 | (0,1) | 0 | 1 | 1 | 1 | FL11=1 |
| S12 DISCONNECTION | 1 | 1 | 1 | 1 | 1 | 1 | 1 | 1 | 1 | 1 | (0,1) | 0 | 1 | 1 | FL12=1 |
| S13 DISCONNECTION | 1 | 1 | 1 | 1 | 1 | 1 | 1 | 1 | 1 | 1 | 1 | 1 | (0,1) | 0 | FL13=1 |

DETECTED VOLTAGE RESULT AND DISCONNECTION DETERMINATION

| MEASUREMENT NO. | M1B | M2B | M3B | M4B | M5B | M6B | M7B | M8B | M9B | M10B | M11B | M12B | M13B |
|---|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 | |
| BS1 | ON | OFF | B | B | B | B | B | B | B | B | B | B | B |
| BS2 | B | ON | OFF | B | B | B | B | B | B | B | B | B | B |
| BS3 | B | B | ON | OFF | B | B | B | B | B | B | B | B | B |
| BS4 | B | B | B | ON | OFF | B | B | B | B | B | B | B | B |
| BS5 | B | B | B | B | ON | OFF | B | B | B | B | B | B | B |
| BS6 | B | B | B | B | B | ON | OFF | B | B | B | B | B | B |
| BS7 | B | B | B | B | B | B | ON | OFF | B | B | B | B | B |
| BS8 | B | B | B | B | B | B | B | ON | OFF | B | B | B | B |
| BS9 | B | B | B | B | B | B | B | B | ON | OFF | B | B | B |
| BS10 | B | B | B | B | B | B | B | B | B | ON | OFF | B | B |
| BS11 | B | B | B | B | B | B | B | B | B | B | ON | OFF | B |
| BS12 | B | B | B | B | B | B | B | B | B | B | B | ON | ON |

BALANCING SW STATE (b)

| MEASUREMENT NO. | M1B | M2B | M3B | M4B | M5B | M6B | M7B | M8B | M9B | M10B | M11B | M12B | M13B | DISCONNECTION FLAG |
|---|---|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 | | |
| S1 DISCONNECTION | 0 | 1 | 1 | 1 | 1 | 1 | 1 | 1 | 1 | 1 | 1 | 1 | 1 | FL1=1 |
| S2 DISCONNECTION | (0,1) | 2 | 1 | 1 | 1 | 1 | 1 | 1 | 1 | 1 | 1 | 1 | 1 | FL2=1 |
| S3 DISCONNECTION | 1 | 1 | 2 | 1 | 1 | 1 | 1 | 1 | 1 | 1 | 1 | 1 | 1 | FL3=1 |
| S4 DISCONNECTION | 1 | 1 | 1 | 2 | 1 | 1 | 1 | 1 | 1 | 1 | 1 | 1 | 1 | FL4=1 |
| S5 DISCONNECTION | 1 | 1 | 1 | 1 | 2 | 1 | 1 | 1 | 1 | 1 | 1 | 1 | 1 | FL5=1 |
| S6 DISCONNECTION | 1 | 1 | 1 | 1 | 1 | 2 | 1 | 1 | 1 | 1 | 1 | 1 | 1 | FL6=1 |
| S7 DISCONNECTION | 1 | 1 | 1 | 1 | 1 | 1 | 2 | 1 | 1 | 1 | 1 | 1 | 1 | FL7=1 |
| S8 DISCONNECTION | 1 | 1 | 1 | 1 | 1 | 1 | 1 | 2 | 1 | 1 | 1 | 1 | 1 | FL8=1 |
| S9 DISCONNECTION | 1 | 1 | 1 | 1 | 1 | 1 | 1 | 1 | 2 | 1 | 1 | 1 | 1 | FL9=1 |
| S10 DISCONNECTION | 1 | 1 | 1 | 1 | 1 | 1 | 1 | 1 | 1 | 2 | 1 | 1 | 1 | FL10=1 |
| S11 DISCONNECTION | 1 | 1 | 1 | 1 | 1 | 1 | 1 | 1 | 1 | 1 | 2 | 1 | 1 | FL11=1 |
| S12 DISCONNECTION | 1 | 1 | 1 | 1 | 1 | 1 | 1 | 1 | 1 | 1 | 1 | 2 | (0,1) | FL12=1 |
| S13 DISCONNECTION | 1 | 1 | 1 | 1 | 1 | 1 | 1 | 1 | 1 | 1 | 1 | 1 | 0 | FL13=1 |

DETECTED VOLTAGE RESULT AND DISCONNECTION DETERMINATION

| MEASUREMENT NO | M1C | M2C | M3C | M4C | M5C | M6C | M7C | M8C | M9C | M10C | M11C | M12C |
|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 |
| BS1 | ON | OFF | B | B | B | B | B | B | B | B | B | B |
| BS2 | OFF | ON | OFF | B | B | B | B | B | B | B | B | B |
| BS3 | B | OFF | ON | OFF | B | B | B | B | B | B | B | B |
| BS4 | B | B | OFF | ON | OFF | B | B | B | B | B | B | B |
| BS5 | B | B | B | OFF | ON | OFF | B | B | B | B | B | B |
| BS6 | B | B | B | B | OFF | ON | OFF | B | B | B | B | B |
| BS7 | B | B | B | B | B | OFF | ON | OFF | B | B | B | B |
| BS8 | B | B | B | B | B | B | OFF | ON | OFF | B | B | B |
| BS9 | B | B | B | B | B | B | B | OFF | ON | OFF | B | B |
| BS10 | B | B | B | B | B | B | B | B | OFF | ON | OFF | B |
| BS11 | B | B | B | B | B | B | B | B | B | OFF | ON | OFF |
| BS12 | B | B | B | B | B | B | B | B | B | B | OFF | ON |

BALANCING SW STATE (b)

| MEASUREMENT NO | M1C | M2C | M3C | M4C | M5C | M6C | M7C | M8C | M9C | M10C | M11C | M12C | DISCONNECTION FLAG |
|---|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 | |
| S1 DISCONNECTION | 0 | 1 | 1 | 1 | 1 | 1 | 1 | 1 | 1 | 1 | 1 | 1 | FL1=1 |
| S2 DISCONNECTION | 0 | 0 | 1 | 1 | 1 | 1 | 1 | 1 | 1 | 1 | 1 | 1 | FL2=1 |
| S3 DISCONNECTION | 1 | 0 | 0 | 1 | 1 | 1 | 1 | 1 | 1 | 1 | 1 | 1 | FL3=1 |
| S4 DISCONNECTION | 1 | 1 | 0 | 0 | 1 | 1 | 1 | 1 | 1 | 1 | 1 | 1 | FL4=1 |
| S5 DISCONNECTION | 1 | 1 | 1 | 0 | 0 | 1 | 1 | 1 | 1 | 1 | 1 | 1 | FL5=1 |
| S6 DISCONNECTION | 1 | 1 | 1 | 1 | 0 | 0 | 1 | 1 | 1 | 1 | 1 | 1 | FL6=1 |
| S7 DISCONNECTION | 1 | 1 | 1 | 1 | 1 | 0 | 0 | 1 | 1 | 1 | 1 | 1 | FL7=1 |
| S8 DISCONNECTION | 1 | 1 | 1 | 1 | 1 | 1 | 0 | 0 | 1 | 1 | 1 | 1 | FL8=1 |
| S9 DISCONNECTION | 1 | 1 | 1 | 1 | 1 | 1 | 1 | 0 | 0 | 1 | 1 | 1 | FL9=1 |
| S10 DISCONNECTION | 1 | 1 | 1 | 1 | 1 | 1 | 1 | 1 | 0 | 0 | 1 | 1 | FL10=1 |
| S11 DISCONNECTION | 1 | 1 | 1 | 1 | 1 | 1 | 1 | 1 | 1 | 0 | 0 | 1 | FL11=1 |
| S12 DISCONNECTION | 1 | 1 | 1 | 1 | 1 | 1 | 1 | 1 | 1 | 1 | 0 | 0 | FL12=1 |
| S13 DISCONNECTION | 1 | 1 | 1 | 1 | 1 | 1 | 1 | 1 | 1 | 1 | 1 | 0 | FL13=1 |

DETECTED VOLTAGE RESULT AND DISCONNECTION DETERMINATION

FIG. 24
(a)
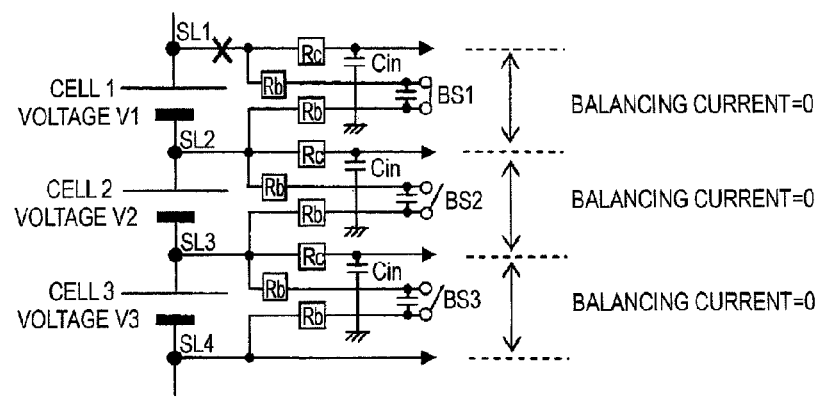
(b)
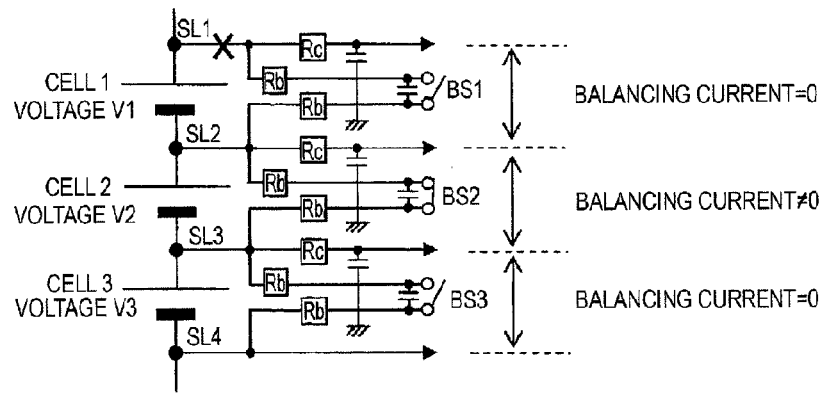

FIG. 28
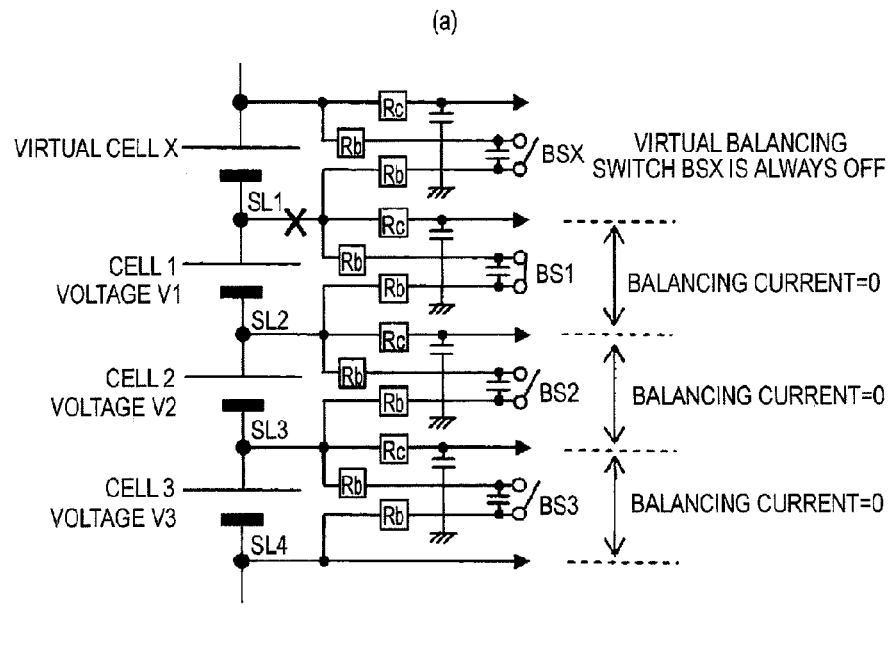
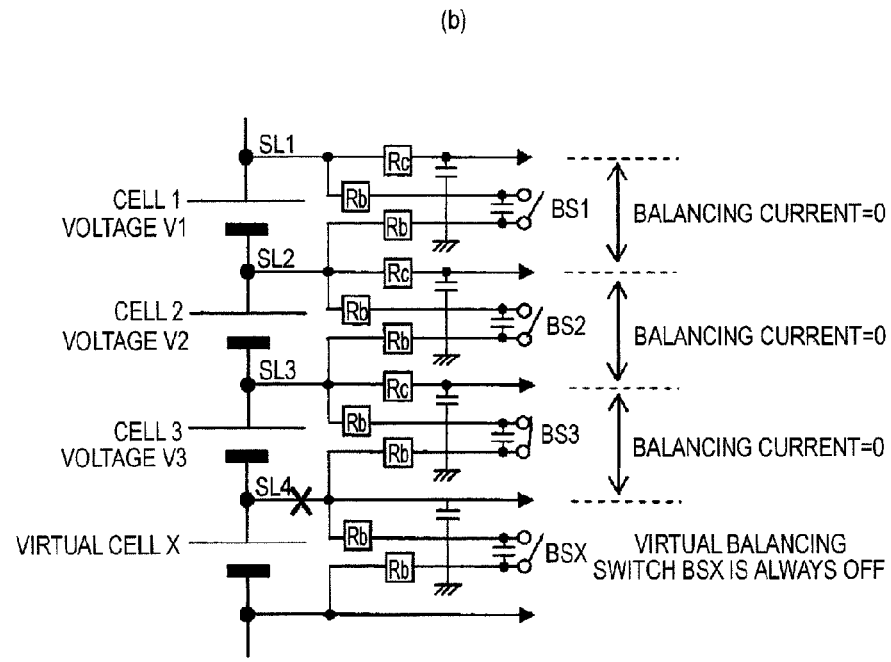

| MEASUREMENT CELL | M1CC | M2CC | M3CC | M4CC | M5CC | M6CC | M7CC | M8CC | M9CC | M10CC | M11CC | M12CC | M13CC | M14CC | M15CC | M16CC | M17CC | M18CC | M19CC | M20CC | M21CC | M22CC | M23CC | M24CC | |
|---|---|---|---|---|---|---|---|---|---|---|---|---|---|---|---|---|---|---|---|---|---|---|---|---|---|
| MEASUREMENT CELL | CELL 1 | CELL 2 | CELL 3 | CELL 4 | CELL 5 | CELL 6 | CELL 7 | CELL 8 | CELL 9 | CELL 10 | CELL 11 | CELL 12 | CELL 13 | CELL 14 | CELL 15 | CELL 16 | CELL 17 | CELL 18 | CELL 19 | CELL 20 | CELL 21 | CELL 22 | CELL 23 | CELL 24 | BALANCING DUTY RATIO |
| BS1 | ON | OFF | B | B | B | B | B | B | B | B | B | B | B | B | B | B | B | B | B | B | B | B | B | B | 91.6% |
| BS2 | OFF | ON | OFF | B | B | B | B | B | B | B | B | B | B | B | B | B | B | B | B | B | B | B | B | B | 87.5% |
| BS3 | B | OFF | ON | OFF | B | B | B | B | B | B | B | B | B | B | B | B | B | B | B | B | B | B | B | B | 87.5% |
| BS4 | B | B | OFF | ON | OFF | B | B | B | B | B | B | B | B | B | B | B | B | B | B | B | B | B | B | B | 87.5% |
| BS5 | B | B | B | OFF | ON | OFF | B | B | B | B | B | B | B | B | B | B | B | B | B | B | B | B | B | B | 87.5% |
| BS6 | B | B | B | B | OFF | ON | OFF | B | B | B | B | B | B | B | B | B | B | B | B | B | B | B | B | B | 87.5% |
| BS7 | B | B | B | B | B | OFF | ON | OFF | B | B | B | B | B | B | B | B | B | B | B | B | B | B | B | B | 87.5% |
| BS8 | B | B | B | B | B | B | OFF | ON | OFF | B | B | B | B | B | B | B | B | B | B | B | B | B | B | B | 87.5% |
| BS9 | B | B | B | B | B | B | B | OFF | ON | OFF | B | B | B | B | B | B | B | B | B | B | B | B | B | B | 87.5% |
| BS10 | B | B | B | B | B | B | B | B | OFF | ON | OFF | B | B | B | B | B | B | B | B | B | B | B | B | B | 87.5% |
| BS11 | B | B | B | B | B | B | B | B | B | OFF | ON | OFF | B | B | B | B | B | B | B | B | B | B | B | B | 87.5% |
| BS12 | B | B | B | B | B | B | B | B | B | B | OFF | ON | OFF | B | B | B | B | B | B | B | B | B | B | B | 87.5% |
| BS13 | B | B | B | B | B | B | B | B | B | B | B | OFF | ON | OFF | B | B | B | B | B | B | B | B | B | B | 87.5% |
| BS14 | B | B | B | B | B | B | B | B | B | B | B | B | OFF | ON | OFF | B | B | B | B | B | B | B | B | B | 87.5% |
| BS15 | B | B | B | B | B | B | B | B | B | B | B | B | B | OFF | ON | OFF | B | B | B | B | B | B | B | B | 87.5% |
| BS16 | B | B | B | B | B | B | B | B | B | B | B | B | B | B | OFF | ON | OFF | B | B | B | B | B | B | B | 87.5% |
| BS17 | B | B | B | B | B | B | B | B | B | B | B | B | B | B | B | OFF | ON | OFF | B | B | B | B | B | B | 87.5% |
| BS18 | B | B | B | B | B | B | B | B | B | B | B | B | B | B | B | B | OFF | ON | OFF | B | B | B | B | B | 87.5% |
| BS19 | B | B | B | B | B | B | B | B | B | B | B | B | B | B | B | B | B | OFF | ON | OFF | B | B | B | B | 87.5% |
| BS20 | B | B | B | B | B | B | B | B | B | B | B | B | B | B | B | B | B | B | OFF | ON | OFF | B | B | B | 87.5% |
| BS21 | B | B | B | B | B | B | B | B | B | B | B | B | B | B | B | B | B | B | B | OFF | ON | OFF | B | B | 87.5% |
| BS22 | B | B | B | B | B | B | B | B | B | B | B | B | B | B | B | B | B | B | B | B | OFF | ON | OFF | B | 87.5% |
| BS23 | B | B | B | B | B | B | B | B | B | B | B | B | B | B | B | B | B | B | B | B | B | OFF | ON | OFF | 87.5% |
| BS24 | B | B | B | B | B | B | B | B | B | B | B | B | B | B | B | B | B | B | B | B | B | B | OFF | ON | 91.6% |

BALANCING SW STATE

FIG. 33 (b)

BATTERY SYSTEM MONITORING APPARATUS

TECHNICAL FIELD

The present invention relates to a battery system monitoring apparatus.

BACKGROUND ART

In hybrid electric vehicles (HEV) and electric vehicles (EV), in order to ensure a desired high voltage, a battery pack (battery system) in which a large number of unit cells in a secondary battery are connected in series with each other is used. In the battery pack thus configured, for the purpose of conducting capacity calculation or protection management of the respective unit cells, the unit cells are managed with the use of a monitoring IC for monitoring a state of the unit cells and a control IC for controlling a charge/discharge state of the unit cells (for example, refer to PTL 1).

In particular, in the battery system using a lithium ion battery, when the lithium ion battery is overcharged with a high energy density, there is a possibility that the lithium ion battery is damaged. For that reason, as disclosed in PTL 2, a voltage across each of the unit cells is measured by the respective control IC and monitoring IC to detect an overcharge state, and if any IC detects the overcharge, the charge/discharge of the battery is ceased, thereby enhancing the reliability and safety.

The monitoring IC detects the voltages across the unit cells, individually, and for example, if there is a unit cell of the overcharge state, the monitoring IC transmits overcharge information to the control IC through a communication. A test signal is transmitted from the control IC to diagnose whether an abnormality such as disconnection occurs in a communication line, or not, so that the overcharge information is surely transmitted to the control IC.

In detecting the voltages across the unit cells, a given unit cell is selected by a multiplexer, and the voltage is detected by a voltage detection unit. A connection of the multiplexer is switched to others, thereby being capable of detecting the voltages across all of the unit cells. In order to acquire correct cell voltages across the respective unit cells, a cell voltage measurement system including the multiplexer is required to correctly operate. For that reason, in the invention disclosed in PTL 3, a sum of cell voltage measured values of the respective unit cells is compared with a total cell voltage measured value measured by a total voltage measurement system, and if those values are remarkably different from each other, it is determined that the failure occurs in the cell voltage measurement system including the multiplexer.

If a voltage detection line is not normally connected to each unit cell, the voltage across the unit cell cannot be normally detected. In the invention disclosed in PTL 4, the cell voltages across the unit cells are measured while operating a balancing circuit intended to uniformize the charge state of the unit cells, and operation for detecting disconnection is automatically conducted within an integrated circuit on the basis of the cell voltages.

In recent years, a demand to speed up a diagnosis of the voltage measurement system including the disconnection of the voltage detection lines has been increased. For example, if the multiplexer is diagnosed as described above, the multiplexer is diagnosed on the basis of the measured voltage between terminals of each unit cell up to now.

Since the inter-terminal voltage of the unit cell is originally measured to determine the overcharge or overdischarge state of each unit cell, there is a need to measure the inter-terminal voltage with precision. For that reason, a voltage measurement circuit having a resistance to noise is used for measuring the inter-terminal voltage. For example, there are a voltage measurement circuit using a double integrating type AD converter as disclosed in PTL 1, and a voltage measurement circuit to which a voltage is input after the removal of noise with the configuration of an RC filter having an input capacitor disposed between the voltage detection lines as disclosed in PTL 4.

This voltage measurement circuit resistant to the noise takes a long measurement time for removing a noise component, as a result of which it also takes time to diagnose the disconnection of the voltage detection lines or the voltage measurement system such as the multiplexer, which is conducted by the aid of the voltage measurement.

Also, as in the invention disclosed in PTL 3, when a failure of the cell voltage measurement system is determined by comparing the cell voltage measured value of the unit cell selected by the multiplexer with the total voltage of the battery, there arises the following problems. For example, in a state where the multiplexer breaks down to always select only a specific unit cell, if the charge states of the respective unit cells are substantially equal to each other, there is substantially no difference between the summed voltage and the total voltage. This leads to a possibility that even if the voltage detection line of the cell other than the selected unit cell is disconnected, no abnormality is detected, and the voltage detection system including the multiplexer is determined as normality. Also, when the unit cells are selected by the multiplexer, even if the multiplexer operates normally, the summed value of the cell voltages and the total voltage may be different from each other in the interest of synchronism of the cell voltage measurement if a voltage fluctuation is steep, resulting in a possibility of erroneous determination. Therefore, in order to surely detect the overcharge, there is a need to separate the monitoring IC and the control IC from each other to enhance the reliability as described above.

Also, in PTL 4, in the hybrid electric vehicle (HEV) and the electric vehicle (EV), for the purpose of ensuring a desired high voltage, the battery pack (battery system) in which a large number of unit cells in the secondary battery are connected in series with each other is used. In the battery pack of this type, for the purpose of conducting the capacity calculation or protection management of the respective unit cells, an integrated circuit that measures and equalizes the cell voltages is used within a monitoring apparatus of the battery pack to manage the unit cells. In order to enhance the reliability, the integrated circuit not only measures and equalize the cell voltage, but also conducts a variety of diagnoses including the disconnection detection of the cell voltage detection lines to enhance the reliability.

The monitoring apparatus of this battery pack always monitors the total voltage and charge/discharge currents of the battery pack, calculates a state of charge (SOC) and a direct current resistance (DCR) as the battery pack, transfers a maximum input/output power or current as the battery pack from that value to a high-level controller, and the high-level controller controls a charge/discharge power (current) from that value. For that reason, the total voltage detection of the battery pack is essential, and a variety of total voltage detector circuits have been proposed (for example, refer to PTL 5).

Because an output of the battery pack configured by a large number of unit cells is high voltage, the battery pack of the high voltage is isolated from a chassis (GND) of a vehicle in the total voltage measurement circuit of this type. Also, a dedicated voltage measurement circuit using a voltage divider circuit of high resistance is employed.

Also, a communication of a battery monitoring integrated circuit and the high-level controller is also isolated, and a photocoupler is generally used as an insulating element for isolation. In order to conduct the communication through the photocoupler at a high speed, a flowing current at a light emitting diode side needs to increase, and its power supply is supplied from the battery pack, and cannot be increased greatly. For that reason, when the photocoupler is used, a communication system is divided, and the communication is conducted at a slightly low speed.

In recent years, the battery pack formed of the secondary battery such as the lithium battery is remarkably increasingly used in the electric vehicle (EV) or a plug-in hybrid vehicle (PHV). When the secondary battery is used in the EV or the PHV, because a use range of the SOC of the secondary battery is wider than that when the secondary battery is used in the hybrid electric vehicle (HEV), also because a fluctuation of the SOC due to a large current output is quick, there is required to voltage-monitor and diagnose all of the cells at a high speed.

The normal battery system includes a plurality of cell groups each having a plurality of unit cells connected in series, and the battery monitoring integrated circuit is disposed for each of the cell groups. Therefore, in order to voltage-monitor and diagnose all of the cells at a high speed, high-speed communication means between the battery monitoring integrated circuit and the high-level controller is required.

Also, the number of unit cells connected in series in the battery pack is increased. In the cell group where the plurality of unit cells are connected in series, which is a unit of the secondary battery which is monitored by the battery monitoring integrated circuit, for example, ten or more unit cells are connected to each other, and an inter-terminal voltage of the cell groups is several tens or more volts. Because the inter-terminal voltage of the cell groups becomes high voltage, a problem of a dark current in the battery monitoring integrated circuit when the vehicle operation stops becomes actualized.

Further, since a capacity of the unit cells is increased, the monitoring and control of the battery system corresponding to this increased capacity is necessary.

CITATION LIST

Patent Literature

PTL 1: JP-A-2005-318750
PTL 2: Japanese Patent No. 4092580
PTL 3: JP-A-2008-92656
PTL 4: JP-A-2009-89488
PTL 5: JP-A-2009-236711

SUMMARY OF INVENTION

Technical Problem

A first problem to be solved by the present invention resides in that in a conventional electric storage device having the control IC for monitoring a state of the battery system formed of the lithium battery or the like, the inter-terminal voltage measurement circuit of the secondary battery cannot be diagnosed at a high speed.

For example, as disclosed in the invention mentioned in Patent literature 4, in a method of measuring the inter-terminal voltages of the respective unit cells to detect the disconnection, in order to measure the inter-terminal voltage (cell voltage) of the unit cells, a noise removal filter is inserted into a cell voltage detection input side. Because of an influence of a time constant of this filter, there arises such a problem that when a balancing switch of the balancing circuit turns on/off to switch from a normal measurement state of the inter-terminal voltage to a voltage detection state for detection of the disconnection, it takes time for the cell voltage across the unit cell to settle into a voltage determinable as the disconnection.

Further, for example, in a method of automatically detecting the disconnection by the integrated circuit (cell controller) mentioned in Patent Literature 4, the reliability of the disconnection detection result is not sufficient. For example, when the disconnection is detected, and the integrated circuit sets a flag in a register, it cannot be determined whether the disconnection is really detected, or the register breaks down. Alternatively, when the register breaks down on a normal side, the disconnection cannot be detected.

A second problem to be solved by the present invention resides in that in the conventional monitoring device for monitoring the state of the battery system formed of the lithium battery or the like, the dedicated voltage measurement circuit for measuring the total voltage of the battery system becomes necessary, causing the monitoring device to be upsized. Also, a dark current in the monitoring device is increased with an increase in the inter-terminal voltage of the cell group.

A third problem to be solved by the present invention resides in that in the conventional monitoring device for monitoring the state of the battery system formed of the lithium battery or the like, the voltage measurement circuit for measuring the inter-terminal voltages of the unit cells, and the balancing circuit of the unit cells are connected to a common terminal. For that reason, if an RC filter is disposed on an input side of the voltage measurement circuit for noise removal for measuring the voltage with high precision, a large current cannot flow into the balancing circuit, and it takes time to uniformize the charge state of the unit cells.

Solution to Problem (1) According to a first aspect of the present invention, there is provided a battery system monitoring apparatus that monitors a battery system including a cell group having a plurality of unit cells connected in series, the battery system monitoring apparatus including: a first control device that controls the cell group; and a plurality of voltage detection lines that connect positive electrodes and negative electrodes of the unit cells to the first control device, for measuring inter-terminal voltages of the unit cells, in which the first control device includes a balancing switch connected between the voltage detection line connected to the positive electrode of each unit cell and the voltage detection line connected to the negative electrode thereof for conducting balancing discharge of the unit cell, for each of the unit cells, in which a first resistor is disposed in series with each of the voltage detection lines, and a first capacitor is connected between the voltage detection line and a GND which is a lowest-level potential of the cell group, which are arranged between the first resistor disposed in the voltage detection line and a connection terminal of the first control device to the voltage detection line, in which a balancing discharge circuit including the balancing switch, and a second resistor connected in series with the balancing switch is connected between the voltage detection line connected to the positive electrode of the unit cell, and the voltage detection line connected to the negative electrode thereof, and in which a connection point between the balancing discharge circuit and the voltage detection line connected to the positive electrode of the unit cell, and a connection point between the balancing discharge circuit and the voltage detection line connected to the negative electrode of the unit cell are each disposed on the cell group side with respect to the first resistor.

(2) According to a second aspect of the present invention, in the battery system monitoring apparatus according to the first aspect, it is preferable that the first control device includes: a selection unit that selects, in order to measure an inter-terminal voltage of one unit cell, the respective voltage detection lines connected to the positive electrode and the negative electrode of the one unit cell, and outputs a positive potential and a negative potential of the one unit cell; a voltage measurement unit that measures the inter-terminal voltage of the one unit cell according to the positive potential and the negative potential of the one unit cell, which are output from the selection unit; a voltage comparison unit that compares the inter-terminal voltage of the one unit cell, which is measured by the voltage measurement unit, with a given voltage to compare the measured voltage with a given threshold value; a detection result storage unit that stores comparison results of the voltage comparison unit therein; a disconnection determination unit that determines a disconnection of the voltage detection line on the basis of the comparison results stored in the detection result storage unit; and a diagnosis storage unit that stores determination results of the disconnection determination unit therein.

(3) According to a third aspect of the present invention, in the battery system monitoring apparatus according to the second aspect, it is preferable that the first control device determines whether the voltage detection line connected to the one unit cell is disconnected, or not, on the basis of the inter-terminal voltage of the one unit cell corresponding to a first balancing switch, which is detected when the first balancing switch corresponding to one unit cell, and a second balancing switch corresponding to a unit cell connected adjacent to and in series with the one unit cell turn on or off, with the use of the disconnection determination unit, and stores the determination results in the diagnosis result storage unit.

(4) According to a fourth aspect of the present invention, in the battery system monitoring apparatus according to the second aspect, it is preferable that the first control device further includes a balancing current detection unit that detects whether a balancing current is present when the balancing switch turns on, or not, for each of the unit cells, in which detection results of the balancing current detected by the balancing current detection unit are stored in the detection result storage unit, and in which the disconnection determination unit determines whether the voltage detection line connected to the one unit cell is disconnected, or not, on the basis of the presence or absence of the balancing current in the first balancing switch when the first balancing switch corresponding to the one unit cell turns on, and the second balancing switch corresponding to the unit cell connected adjacent to and in series with the unit cell turns off, and stores the determination results in the diagnosis storage unit.

(5) According to a fifth aspect of the present invention, in the battery system monitoring apparatus according to the third aspect, it is preferable that the first control device sequentially measures the inter-terminal voltages of the unit cells with respect to all of the unit cells in the cell group, and the disconnection determination unit determines whether the disconnection is present in all of the voltage detection lines that connect the cell group to the first control device, or not, on the basis of measurement results of the inter-terminal voltages of all of the unit cells, and stores the determination results in the diagnosis storage unit.

(6) According to a sixth aspect of the present invention, in the battery system monitoring apparatus according to the fourth aspect, it is preferable that the first control device sequentially detects whether the balancing current is present in all of the unit cells in the cell group, or not, and the disconnection determination unit determines whether the disconnection is present in all of the voltage detection lines that connect the cell group to the first control device, or not, on the basis of detection results of whether the balancing current is present in all of the unit cells, or not, and stores the determination results in the diagnosis storage unit.

(7) According to a seventh aspect of the present invention, in the battery system monitoring apparatus according to the second aspect, it is preferable that the first control device further includes an input short-circuiting switch that short-circuits the two voltage detection lines, for each of the unit cells, between the two adjacent voltage detection lines connected to the selection unit, the first control device turns on or off the input short-circuiting switch to input 0V or the inter-terminal voltage of the unit cell to the selection unit, as a potential difference between the two voltage detection lines connected to the selection unit, and the disconnection determination unit determines whether the selection unit operates normally, or not, on the basis of the detection results of the voltage comparison unit.

(8) According to an eighth aspect of the present invention, in the battery system monitoring apparatus according to the fourth or six aspect, it is preferable that the balancing current detection unit includes: a reference voltage source; a comparator that compares the inter-terminal voltage of the balancing switch with the reference voltage source to detect whether the balancing current is present, or not; and an input switching unit for reversing a comparison relationship between a voltage of the reference power supply and a terminal voltage of the balancing switch by the comparator, the first control device operates the input switching unit, and switches an input of the voltage of the reference voltage source and the inter-terminal voltage of the balancing switch to the comparator, to thereby switch an output value of the comparator, and output the same output value as that when the voltage detection line connected with the balancing switch is disconnected, and the disconnection determination unit determines whether the voltage detection line is disconnected, or not, on the basis of the output of the comparator, and stores the determination results in the diagnosis storage unit.

(9) According to a ninth aspect of the present invention, there is provided a battery system monitoring apparatus that monitors a battery system having a cell group having a plurality of unit cells connected in series, the battery system monitoring apparatus including: a first control device that controls the cell group; a plurality of voltage detection lines that connect positive electrodes and negative electrodes of the unit cells to the first control device, for measuring inter-terminal voltages of the unit cells; and a power supply line that applies the inter-terminal voltage of the cell group to the first control device, in which the first control device includes: a power supply unit; a cell group voltage input unit that divides the inter-terminal voltage of the cell group; a voltage measurement unit that measures the voltage; and a selection unit that selects an output from the cell group voltage input unit, and inputs the output to the voltage measurement unit, in which a first resistor is disposed in series with each of the voltage detection lines, in which the power supply line is connected to the positive electrode of a highest-level unit cell of the cell group, the inter-terminal voltage of the cell group is input to the power supply unit through the power supply line, and in which the power supply unit includes an energization switch that applies the inter-terminal voltage of the cell group to the cell group voltage input unit.

(10) According to a tenth aspect of the present invention, in the battery system monitoring apparatus according to the ninth aspect, it is preferable that the first control device includes a balancing switch connected between the voltage detection line connected to the positive electrode of each unit cell and the voltage detection line connected to the negative electrode thereof for conducting balancing discharge of the unit cell, for each of the unit cells, in which a balancing discharge circuit including the balancing switch, and a second resistor connected in series with the balancing switch is connected between the voltage detection line connected to the positive electrode of the unit cell, and the voltage detection line connected to the negative electrode thereof, and in which a connection point between the balancing discharge circuit and the voltage detection line connected to the positive electrode of the unit cell, and a connection point between the balancing discharge circuit and the voltage detection line connected to the negative electrode of the unit cell are each disposed on the cell group side with respect to the first resistor.

(11) According to an eleventh aspect of the present invention, in the battery system monitoring apparatus according to the ninth or tenth aspect, it is preferable that the power supply unit turns on the energization switch to apply the inter-terminal voltage of the cell group to the cell group voltage input unit when the power supply unit starts according to a start signal from an external which is received by the first control device.

(12) According to a twelfth aspect of the present invention, in the battery system monitoring apparatus according to any one of the ninth to eleventh aspects, it is preferable that the cell group voltage input unit includes: a voltage divider circuit that divides the inter-terminal voltage of the cell group, which is input from the power supply unit; and a sample and hold circuit that holds the inter-terminal voltage divided by the voltage divider circuit.

(13) According to the thirteenth aspect of the present invention, in the battery system monitoring apparatus according to any one of the first to eighth aspects, and the twelfth aspect, it is preferable that there are provided N (N≥1) of the cell groups that are connected in series with each other; M (M≥1) of the first control devices that control the N cell groups; and a second control device which is a high-level control device of the M first control devices, in which a highest-level first control device among the M first control devices, and the second control device are connected to each other by a communication line through an insulating element, in which a lowest-level first control device among the M first control devices, and the second control device are connected to each other by a communication line through an insulating element, in which the M first control devices are connected to each other by communication lines, and in which the M first control devices are controlled according to a control signal and control data from the second control device.

(14) According to a fourteenth aspect of the present invention, in the battery system monitoring apparatus according to the thirteenth aspect, it is preferable that the second control device transmits voltage measurement instruction signals for allowing the M first control devices to measure the inter-terminal voltages of the N cell groups substantially at the same time to the M first control devices, and calculates a total voltage of the battery system according to voltages obtained by dividing the inter-terminal voltages of the cell groups which are measured by the respective first control devices, which are transmitted from the M first control devices to the second control device.

(15) According to a fifteenth aspect of the present invention, in the battery system monitoring apparatus according to the thirteenth or fourteenth aspect, it is preferable that in the first control device, the cell group voltage input unit further includes an RC filter circuit that removes noise of the inter-terminal voltage of the cell groups, which is input from the power supply unit, and further includes a filter connection terminal for connecting a capacitor of the RC filter circuit in the cell group voltage input unit by an external of the first control device, and the capacitor of the RC filter circuit is installed outside the first control device through the filter connection terminal.

(16) According to a sixteenth aspect of the present invention, in the battery system monitoring apparatus according to the fifteenth aspect, it is preferable that the first control device further includes a voltage divider resistor connection terminal for connecting a voltage divider resistor of the voltage divider circuit in the cell group voltage input unit by the external of the first control device, and wherein the voltage divider resistor of the voltage divider circuit is installed outside the first control device through the voltage divider resistor connection terminal.

(17) According to a seventeenth aspect of the present invention, in the battery system monitoring apparatus according to the first aspect, it is preferable to include a second capacitor which is connected in parallel to the balancing switch of the balancing discharge circuit.

(18) According to an eighteenth aspect of the present invention, in the battery system monitoring apparatus according to the seventeenth aspect, it is preferable that a time constant of the RC filter including the first resistor and the first capacitor is larger than a time constant of the RC filter including the second resistor and the second capacitor.

(19) According to a nineteenth aspect of the present invention, there is provided a battery system monitoring apparatus that controls a cell group in which a plurality of unit cells are connected in series, the battery system monitoring apparatus including: a first control unit that measures inter-terminal voltages of the unit cells; a second control unit that conducts balancing discharge of the unit cells; and a plurality of voltage detection lines that connect positive electrodes and negative electrodes of the unit cells to the first control unit, for measuring the inter-terminal voltages of the unit cells, in which a first resistor is disposed in each of the voltage detection lines, and a first capacitor is connected between two adjacent voltage detection lines, which is arranged between the first resistor disposed in the voltage detection line and a connection terminal of the voltage detection line of the first control unit, in which the second control unit is connected with balancing lines branched from the respective voltage detection lines on the unit cell side with respect to the first resistor, in which a second resistor is disposed in each of the balancing lines, and a second capacitor is connected between two adjacent balancing lines, which is arranged between the second resistor disposed in each of the balancing lines and a connection terminal of the balancing line of the second control unit, and in which the second control device includes a balancing switch that conducts balancing discharge of the unit cell, which is connected between the balancing line connected to the positive electrode of the unit cell and the balancing line connected to the negative electrode thereof, for each of the unit cells.

(20) According to a twentieth aspect of the present invention, in the battery system monitoring apparatus according to the nineteenth aspect, it is preferable to include: N (N≥1) of the cell groups that are connected in series with each other; M (M≥1) of the first control units and M (M≥1) of the second control units, which control the N cell groups; and a high-level control device of the M first control units and the M second control units, in which a highest-level first control unit among the M first control units, and the high-level control device are connected to each other by a communication line through an insulating element, in which a lowest-level first control unit among the M first control units, and the high-level control device are connected to each other by a communication line through an insulating element, in which the highest-level second control unit among the M second control units, and the high-level control device are connected to each other by a communication line through an insulating element, in which the lowest-level second control unit among the M second control units, and the high-level control device are connected to each other by a communication line through an insulating element, in which the M first control units are connected to each other by a first communication line, in which the M second control units are connected to each other by a second communication line, and in which the M first control units and the M second control units are controlled according to a control signal and control data from the high-level control device.

(21) According to a twenty-first aspect of the present invention, in the battery system monitoring apparatus according to the eighteenth or nineteenth aspect, it is preferable that a time constant of an RC filter including the first resistor and the first capacitor is larger than a time constant of an RC filter including the second resistor and the second capacitor.

Advantageous Effects of Invention

With the use of the battery system monitoring apparatus according to the present invention, it can be surely determined whether a multiplexer for selecting a voltage detection target cell operates normally, or not, when measuring the inter-terminal voltages of the unit cells. Also, the disconnection detection can be automatically sequentially conducted without detecting the inter-terminal voltages (cell voltages) of the unit cells at the time of detecting the disconnection. As a result, a time for the disconnection detection can be reduced, and the safety and reliability of the system can be enhanced. Further, the battery system monitoring apparatus can be configured with the use of one cell controller IC without separating the monitoring IC and the control IC from each other.

BRIEF DESCRIPTION OF DRAWINGS

FIG. 12 (a) illustrates a control state of multiplexer input short-circuiting switches 224 in a voltage measurement for diagnosing whether a cell voltage input is normally switched, or not, and (b) illustrates detection results of the cell voltage measured in a control state of the multiplexer input short-circuiting switches in the respective measurements illustrated in (a).

FIG. 17 is a diagram illustrating that a method of detecting the disconnection of the highest-level and lowest-level voltage detection lines can be also applied to the disconnection of the highest-level and lowest-level voltage detection assuming virtual cells and balancing switch circuits in FIG. 12 or 16. (a) is a diagram assuming further virtual cells and balancing switch circuits to a higher level of the highest-level voltage detection line. (b) is a diagram assuming further virtual cells and balancing switch circuits to a lower level of the lowest-level voltage detection line.

FIG. 18 is a diagram illustrating the cell voltages detected when two adjacent balancing switches turn on/off. (a) is a diagram illustrating the control state of the balancing switches in the measurement of the respective cell voltages, and (b) is a diagram illustrating the cell voltages detected in the control state of the balancing switches illustrated in (a).

FIG. 19 is an illustrative view of one method for sequentially measuring the inter-terminal voltages of cells 1 to 12, and detecting the inter-terminal voltage of 0V to conduct the disconnection diagnosis. (a) is a diagram illustrating the control state of the two adjacent balancing switches in the measurement of the respective cell voltages, and (b) is a diagram illustrating voltage detection results in the respective cell voltage measurements illustrated in (a), and the disconnection determination of the voltage detection lines based on the voltage detection results.

FIG. 20 is an illustrative view of another method for sequentially measuring the inter-terminal voltages of the cells 1 to 12, and detecting the inter-terminal voltages for two unit cells by the voltage detection lines except for the highest-level and lowest-level voltage detection lines to conduct the disconnection diagnosis. (a) is a diagram illustrating the control state of the two adjacent balancing switches in the measurement of the respective cell voltages, and (b) is a diagram illustrating the voltage detection results in the respective cell voltage measurements illustrated in (a) and the disconnection determination of the voltage detection lines based on the voltage detection results. FIG. 20 is a determination true table of the disconnection diagnosis in the disconnection diagnosis method using the detected cell voltage values.

FIG. 21 is an illustrative view of still another method for sequentially measuring the inter-terminal voltages of the cells 1 to 12, and detecting the inter-terminal voltage of 0V to conduct the disconnection diagnosis. (a) is a diagram illustrating the control state of the three adjacent balancing switches in the measurement of the respective cell voltages, and (b) is a diagram illustrating the voltage detection results in the respective cell voltage measurements illustrated in (a), and the disconnection determination of the voltage detection lines based on the voltage detection results.

FIG. 22 is an illustrative view illustrating control setting operation of the balancing switches in still another method for sequentially measuring the inter-terminal voltages of the cells 1 to 12, and detecting the inter-terminal voltages for two unit cells by the voltage detection lines except for the highest-level and lowest-level voltage detection lines to conduct the disconnection diagnosis. (a) is a diagram illustrating the control state of the three adjacent balancing switches in the measurement of the respective cell voltages, and (b) is a diagram illustrating the voltage detection results in the respective cell voltage measurements illustrated in (a), and the disconnection determination of the voltage detection lines based on the voltage detection results.

FIG. 23 is an illustrative view illustrating the control setting operation of the multiplexer input short-circuiting switches in a method for turning on/off the multiplexer input short-circuiting switches to develop the inter-terminal voltage of 0V, sequentially measuring the inter-terminal voltages of cells 1 to 12, and detecting the inter-terminal voltage of 0V to diagnose the circuit and logic of the disconnection detection. (a) is a diagram illustrating the control state of the multiplexer input short-circuiting switches in the measurement of the respective cell voltages, and (b) is a diagram illustrating the voltage detection results in the respective cell voltage measurements illustrated in (a), and the disconnection determination of the voltage detection lines based on the voltage detection results.

FIG. 24 is an illustrative view illustrating a method for detecting the disconnection of the highest-level voltage detection line according to presence or absence of the balancing current detection with the use of the battery system monitoring apparatus according to the present invention. (a) and (b) illustrate the presence or absence of the balancing current detection in the respective different switching states.

FIG. 28 is a diagram illustrating that a method of detecting the disconnection of the highest-level and lowest-level voltage detection lines can be also applied to the disconnection of the highest-level and lowest-level voltage detection assuming the virtual cells and balancing switch circuits in FIG. 24 or 27. (a) is a diagram assuming further virtual cells and balancing switch circuits to a higher level of the highest-level voltage detection line. (b) is a diagram assuming further virtual cells and balancing switch circuits to a lower level of the lowest-level voltage detection line.

FIG. 29 is an illustrative view illustrating the control setting operation of the balancing switches in a method for turning on/off the balancing switches to sequentially detect the balancing currents of the cells 1 to 12, and detecting that no balancing current flows (0 in (b)) to diagnose the circuit and logic of the disconnection detection. (a) is a diagram illustrating the control state of the balancing switches in the measurement of the respective cell voltages, and (b) is a diagram illustrating the detection results of the respective cells illustrated in (a), and the disconnection determination of the voltage detection lines based on the detection results.

FIG. 30 is an illustrative view illustrating the control setting operation of the balancing switches in a method of diagnosing the circuit and logic for switching switch circuits 228 of the balancing switch state detector circuits 223 to artificially generate outputs of comparators 229 of a state in which no balancing current flows, and detecting the disconnection according to the presence or absence of the balancing current. (a) illustrates the control state of the balancing switches of the respective cells. (b) illustrates a state in which an output of a comparator 229 indicative of an artificial disconnection state, which is generated on the basis of (a), is written into a detection result register. (c) is a diagram illustrating artificial detection results of the balancing currents of the respective cells illustrated in (a), and the disconnection determination of the voltage detection lines based on the artificial detection results.

FIG. 33 is an illustrative view illustrating a case in which when two cell groups are connected in series with each other, the same disconnection diagnosis as that of FIG. 21 is conducted by sequentially measuring the inter-terminal voltage of the unit cells (cells 1 to 24) of the two cell groups. (a) is a diagram illustrating the control state of three adjacent balancing switches in the measurement of the respective cell voltages, and (b) is a diagram illustrating the voltage detection results in the voltage measurement of the respective cells illustrated in (a), and the disconnection determination of the voltage detection lines based on the voltage detection results.

DESCRIPTION OF EMBODIMENT

Figure 1:
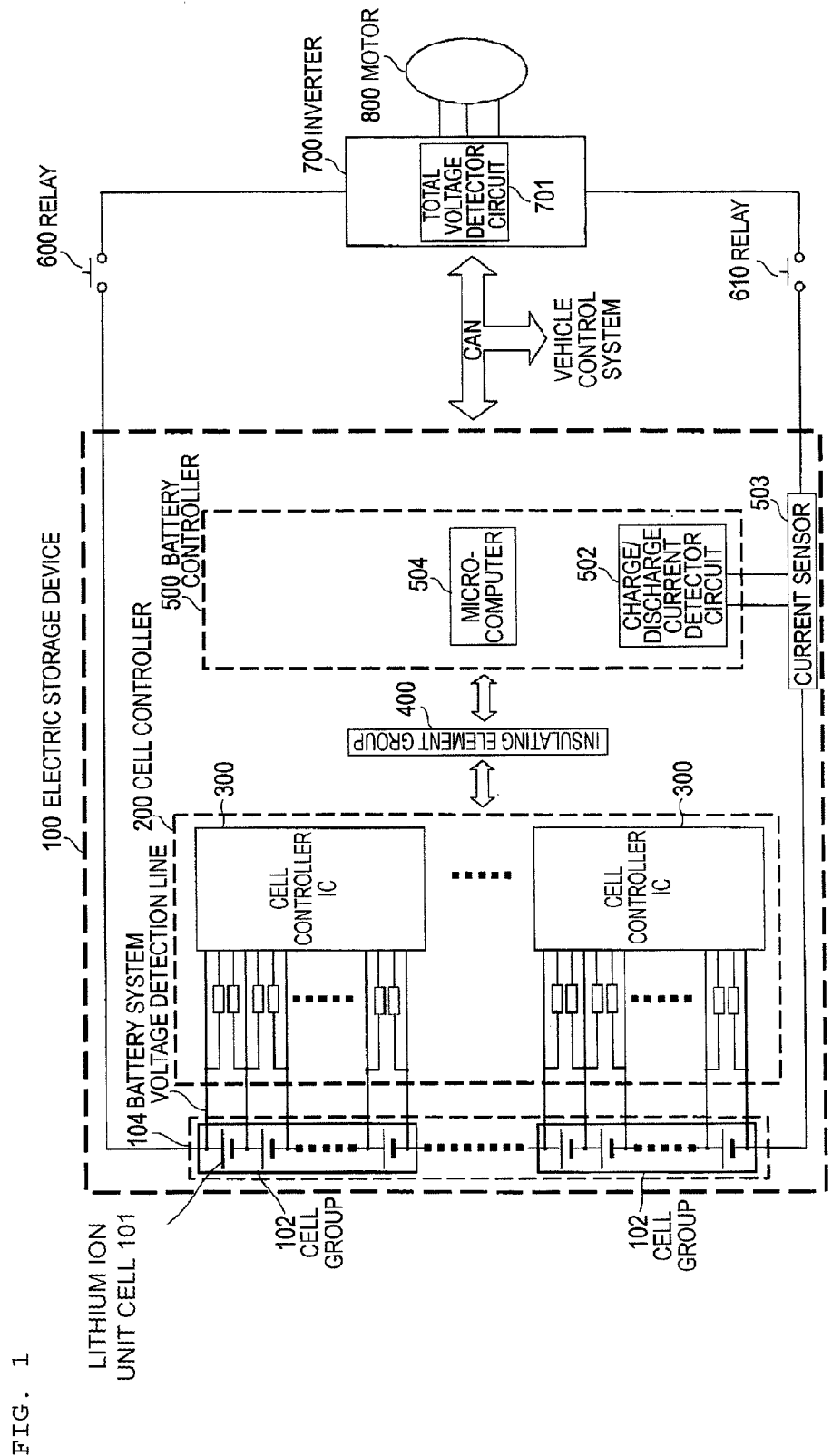
FIG. 1 illustrates a configuration example of a driver system for a hybrid electric vehicle with an electric storage device including a battery system monitoring apparatus according to a first embodiment of the present invention.

Hereinafter, embodiments of the present invention will be described with reference to FIGS. 1 to 33. The embodiments described below exemplify a case in which an electric storage device having a battery system monitoring apparatus according to the present invention is applied to an electric storage device having a battery system used in a hybrid electric vehicle (HEV) or the like. The present invention is not limited to the HEV, but can be extensively applied to a variety of electric storage devices mounted on a plug-in hybrid electric vehicle (PHEV), an electric vehicle (EV), a rail car, and the like. In the following embodiments, a lithium ion battery having a voltage ranging from 3.0 to 4.2V (mean output voltage: 3.6V) is assumed as an electric storage/discharge device which is a minimum unit of control. However, the present invention is applicable to any other devices that can store and discharge electricity such that the use of the device is restricted when an SOC (state of charge) is too high (overcharge), or is too low (overdischarge). In this specification, those devices are collectively called "electric cells" or "unit cells". In the embodiments described below, a plurality (roughly several to dozen) of unit cells connected in series is called "cell group", and a plurality of cell groups connected in series is called "battery module". Further, a plurality of cell groups or battery modules connected in series or series-parallel is called "battery system". The cell group, the battery module, and the battery system are collectively called "battery pack". A cell controller IC that detects a cell voltage of each unit cell, and monitors a battery state while conducting balancing operation is disposed for each of the cell groups.

First Embodiment

First, an example in which an electric storage device according to the present invention is applied to a driver system for hybrid electric vehicles will be described.

An electric storage device 100 is connected to an inverter 700 through relays 600 and 610, and the inverter 700 is connected to a motor 800. When a vehicle starts moving, or accelerates, a discharge power is supplied from the electric storage device 100 to the motor 800 through the inverter 700 to assist an engine not shown. When the vehicle stops or decelerates, a regenerative power is charged into the electric storage device 100 from the motor 800 through the inverter 700. In this example, the inverter 700 includes an inverter circuit having a plurality of semiconductor switching elements, a gate driver circuit of the semiconductor switching elements, and a motor controller that generates a pulse signal for PWM controlling the gate driver circuit. However, those components are omitted from FIG. 1.

The electric storage device 100 mainly includes cell groups 102 each having a plurality of lithium ion unit cells 101, a battery system 104 having a plurality of the cell groups 102 connected in series, a cell controller 200 having a plurality of cell controller ICs 300 that detect voltages across the respective unit cells 101, and conduct balancing operation, and a battery controller 500 that controls the operation of the cell controller 200, and determines states of the respective unit cells. In an example of the electric storage device according to this embodiment, 96 lithium ion unit cells each having a rating capacity of 5.5 Ah are connected in series. The battery controller 500 communicates with the plurality of cell controller ICs 300 through an insulating element group 400, and controls the cell controller ICs. As described above, the cell controller IC 300 is provided in each of the cell groups 102. Voltage detection lines between the battery system 104 and the cell controller 200 are connected to the cell controller 200 by connectors not shown.

The battery controller 500 includes a current detector circuit 502 connected to a current sensor 503 which detects a charge/discharge current flowing in the battery system 104, and a microcomputer 504 that conducts an overall control of the battery controller 500 including a communication with the cell controller 200, the inverter 700, and a high-level vehicle controller not shown. Also, a total voltage measurement circuit 701 that measures a total voltage of the battery system 104 is disposed within the inverter 700. Also, although not shown, the battery controller 500 measures a temperature of the unit cells 101, and corrects a temperature of a parameter of a battery state.

Figure 2:
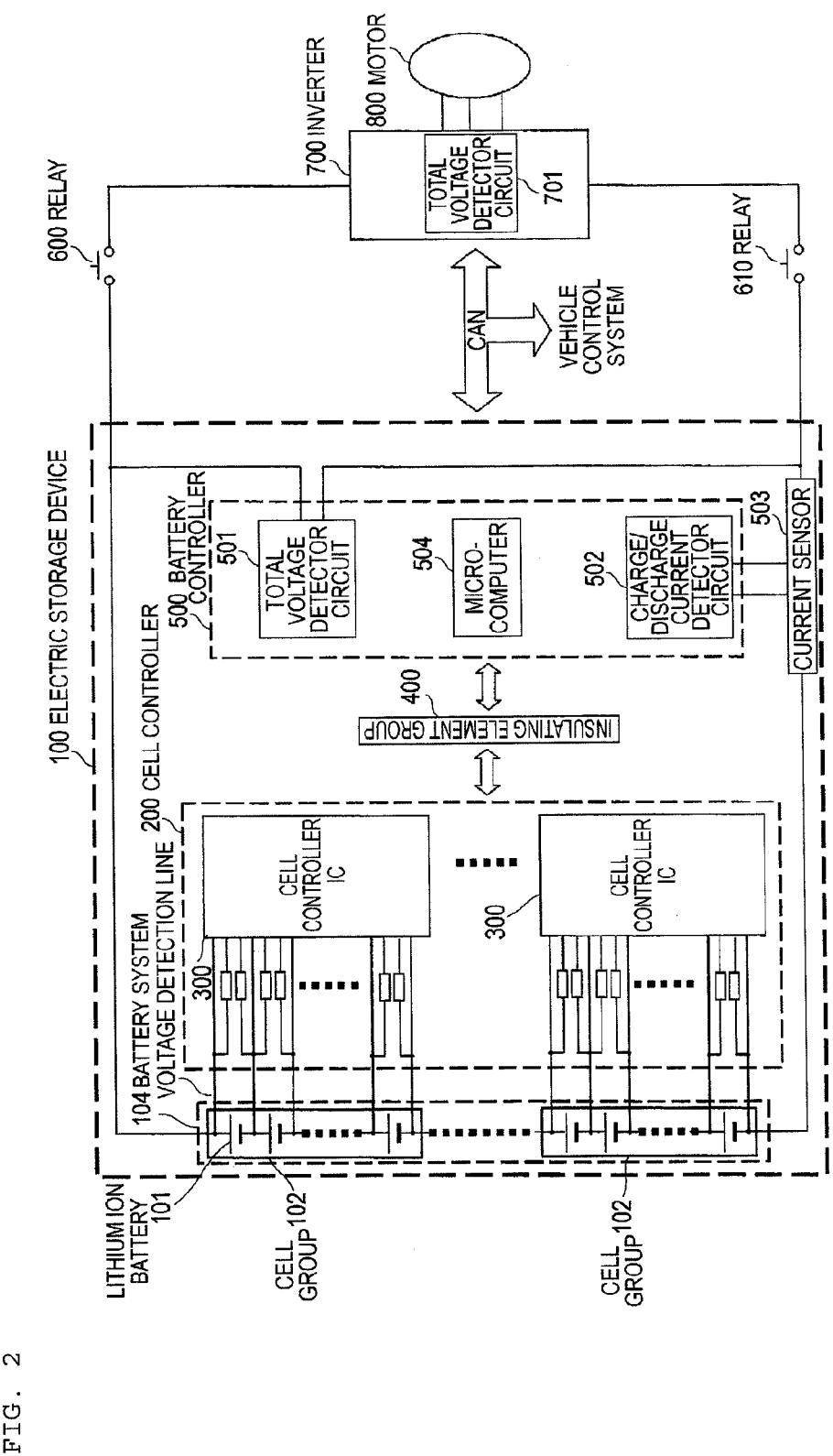
FIG. 2 illustrates a configuration example of the driver system for the hybrid electric vehicle having a total voltage detector circuit incorporated into a battery controller in the electric storage device illustrated in FIG. 1.

FIG. 2 illustrates an example in which a total voltage detector circuit 501 is also installed in the battery controller 500. As will be described later, the total voltage detector circuit 501 may not be disposed within the battery controller 500 as illustrated in FIG. 1 if the total voltage detector circuit 501 can measure a total voltage across the battery system 104.

After the electric storage device 100 starts, the following operation is conducted. The battery controller 500 transmits an instruction for allowing the cell controller 200 to conduct OCV (open-circuit voltage) measurement of all the unit cells through the insulating element group 400. Measured data of OCV of the respective unit cells is transmitted to the battery controller 500 from the cell controller 200 through the insulating element group 400 on a cell group basis. The battery controller 500 converts the received OCV of the respective unit cells into SOC, and calculates a deviation of the SOC of all the unit cells. The unit cells having the deviation of the SOC larger than a given value, for example, a mean of the SOC of all the unit cells is intended to conduct the balancing discharge. A time until the deviation of the SOC of the unit cells intended to conduct the balancing discharge becomes 0 is calculated, and an instruction for conducting control operation to turn on the balancing switch within the cell controller ICs 300 for this time is transmitted from the battery controller 500 to the cell controller 200 to conduct the balancing discharge of the unit cells to be subjected to the balancing.

After the SOC of the battery system 104 is calculated (calculation method is omitted) according to the above measured OCV of the respective unit cells, the inverter 700 or a vehicle controller (not shown) which is a high-level controller turns on the relays 600 and 610 to connect the electric storage device 100 to the inverter 700 and the motor 800. When the inverter 700 receives a charge/discharge instruction from the vehicle controller, the inverter 700 operates to drive the motor 800, and the charge/discharge operation of the electric storage device 100 is conducted.

Since the relays 600 and 610 are turned on, and the electric storage device 100 starts the charge/discharge, the battery controller 500 measures the charge/discharge current and the total voltage every given time. The battery controller 500 calculates the charge state (SOC) of the battery pack and a direct current resistance (DCR) of the battery according to values of the obtained total voltage and charge/discharge current in real time (calculation method is omitted). Further, the battery system 104 calculates the chargeable/dischargeable current or power according to those values in real time, and transmits the calculated current or power to the inverter 700, and the inverter 700 controls the charge/discharge current or the power within this calculated current or power. In FIG. 1, the battery controller 500 does not measure the total voltage, but a total voltage value is obtained from the cell controller 200 in a method to be described later.

Figure 3:
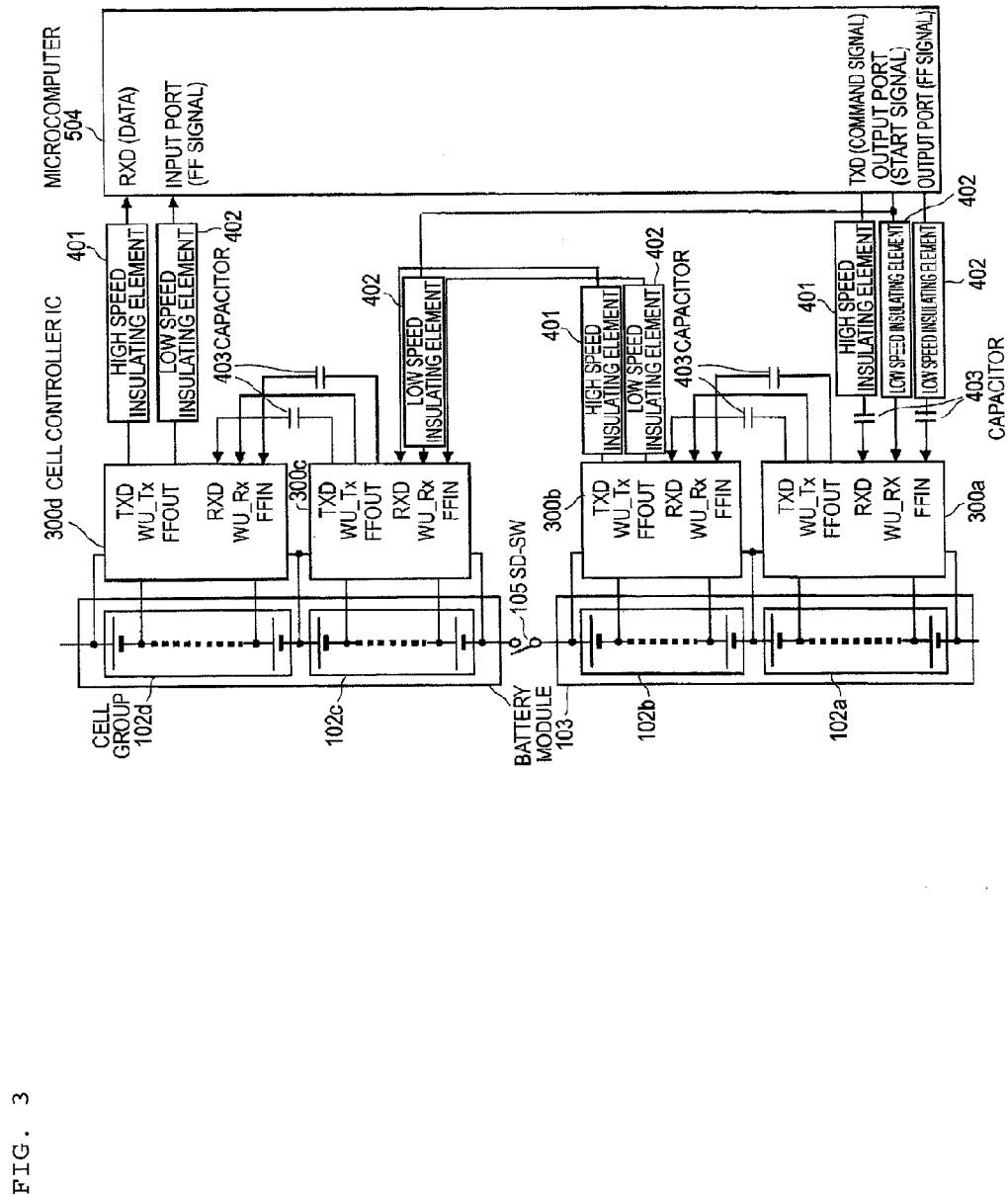
FIG. 3 is a diagram illustrating one connection example of communication lines between cell controller ICs 300 within a cell controller 200, and a microcomputer 504 within a battery controller 500, illustrated in FIG. 1 or 2.

FIG. 3 is a diagram illustrating one communication connection example between cell controller ICs 300*a* to 300*d* within the cell controller 200, and the microcomputer 504 within the battery controller 500. The microcomputer 504 includes a start signal output port that outputs a start signal for staring the cell controller ICs 300*a* to 300*d* within the cell controller 200, a transmit port TXD for transmitting a command and data, and an FF signal output port for outputting a data packet (FF signal) for detecting an overcharge state.

In an example of FIG. 3, battery modules 103 in which two of the cell groups 102 each having a plurality of unit cells connected in series are connected in series are arranged on upper and lower sides of a service disconnect switch (SD-SW) 105. The number of cell groups configuring each of the battery modules 103 is not limited to two, but three or more cell groups may be provided. Also, the respective cell controller ICs 300*a* to 300*d* are disposed in correspondence with those cell groups 102*a* to 102*d*.

In this example, in FIG. 3, the lowermost cell controller ICs 300*a* configures a highest-level cell controller IC that first receives a signal from the microcomputer 504. In FIG. 3, the uppermost cell controller ICs 300*d* may configure the highest-level cell controller IC.

Hereinafter, if the cell controller IC or the cell controller ICs 300 are merely referred to, the cell controller ICs 300*a* to 300*d* are not particularly restricted. Likewise, if the cell groups 102*a* to 102*d* are not particularly restricted, those cell groups are called "cell group" or "cell group 102".

The service disconnect switch (hereinafter referred to as "SD-SW") 105 is frequently used in the high-voltage battery pack, and during maintenance and inspection, the SD-SW 105 is opened to block a current path of the battery pack for the purpose of preventing an operator from getting an electric shock. If the SD-SW 105 is kept opened, the series connection of the batteries is cut. As a result, even if a person touches a highest-level terminal and a lowest-level terminal of the battery pack, no high voltage is applied to a human body, thus being capable of preventing the person from getting an electric shock.

In a communication line of a command and a data signal, the command and the data signal are transmitted from a transmit port TXD of the microcomputer 504 to a communication receive terminal RXD of the highest-level cell controller IC 300*a* through a high speed insulating element 401 and a capacitor 403. The start signal output port is connected to a start signal input terminal WU_Rx of the cell controller IC 300*a* through a low speed insulating element 402. Also, in the communication line of the FF signal, the FF signal is transmitted from the FF signal output port to an FF input terminal FFIN of the cell controller IC 300*a* through the low speed insulating element 402 and the capacitor 403. The highest-level cell controller IC 300*a* has its communication output terminal TXD connected to the communication receive terminal RXD of the second highest-level cell controller IC 300*b* by a capacitive coupling. Also, an FF output terminal FFOUT is connected to the FF input terminal FFIN of the cell controller IC 300 by a capacitive coupling. Further, a start signal output terminal WU_Tx of the cell controller IC 300*a* is connected to the start signal input terminal WU_Rx of the second highest cell controller IC 300*b*.

The high speed insulating element 401, the low speed insulating element 402, and an insulating element used in the communication path between the microcomputer 504 and the highest-level cell controller IC 300*a* by the capacitor 403 are collectively called "insulating element group 400" (FIG. 1).

A communication between the highest-level cell controller IC 300*c* of the cell controller IC connected to an upper battery module 103 of the service disconnect switch (SD-SW) 105, and the lowest-level cell controller IC 300*b* of the cell controller IC connected to the lower battery module 103 needs to be conducted by isolation. This is because the number of unit cells connected in series with the respective upper and lower battery modules 103 is large, and therefore the inter-terminal voltage of the battery modules 103 becomes high. For that reason, the high speed insulating element 401 is inserted into the communication line of the command and the data signal, and the low speed insulating element 402 is inserted into the FF signal communication line. If those communication lines are connected directly to each other, the battery packs are connected in series through that connection. As a result, even if the SD-SW 105 is cut, the series connection of the battery pack is maintained. For that reason, the energization of the battery pack cannot be blocked, resulting in a possibility that the operator gets electric shock. The start signal is also output to the upper (lower-level side) cell controller IC 300*c* of the SD-SW 105 from the start signal output port of the microcomputer 504 through the low speed insulating element 402.

In the lowest-level cell controller IC 300*d*, the communication output terminal TXD is connected to the communication receive terminal RXD of the microcomputer 504 through the high speed insulating element 401. Likewise, the FF output terminal FFOUT of the cell controller IC 300*d* is connected to an FF signal input port of the microcomputer 504 through the low speed insulating element 402.

When the cell controller 200 starts, the microcomputer 504 outputs the start signal, and the cell controller IC 300*a* and the cell controller IC 300*c* receive the start signal through the low speed insulating element 402 to start. The started cell controller IC outputs the start signal to a subsequent cell controller IC. In this way, all of the cell controller ICs 300 sequentially start.

The low speed insulating element 402 is formed of an insulating element that can also transmit a DC signal such as a photocoupler, and the start signal from the microcomputer 504 to the cell controller IC 300*a* and the cell controller IC 300*c* is configured by the DC signal or a pulse signal having a relatively wide duration. This is because the noise or the voltage fluctuation is liable to occur when the electric storage device 100 starts, and therefore this influence is removed. A signal for starting the subsequent cell controller IC from the cell controller IC 300*a* or 300*c* which has first started is configured by a short pulse or AC pulse signal.

After the cell controller 200 starts, the microcomputer 504 transmits the command signal and data (data packet) to the receive terminal RXD of the cell controller IC 300*a* through the high speed insulating element 401. The cell controller IC 300*a* receives the command signal and the data packet, and further transmits those signal and data packet from the output terminal TXD to the subsequent cell controller IC 300*d*. In this way, all of the cell controller ICs 300*a* to 300*d* receive the command signal and the data, and operate according to the command signal and the data. When the cell controller ICs 300*a* to 300*d* obtain data such as the inter-terminal voltages (called "cell voltages") of the unit cells in the cell groups 102*a* to 102*d* which are controlled by the cell controller ICs 300*a* to 300*d*, the respective cell controller ICs 300*a* to 300*d* add the data to the data packets, transmit the data packets from the transmit ports TXD to the RXD terminals of the subsequent cell controller ICs, and the data packets are finally received by the RXD terminal of the microcomputer 504. The microcomputer 504 receives the data packet with the inclusion of the command signal transmitted by the microcomputer 504 per se, and if the command signal is normally transferred, and the data added by the cell controller ICs 300*a* to 300*d* is included in the command signal, the data is received by the microcomputer 504.

A loop that passes through the FF input terminals FFIN and the FF output terminals FFOUT of the cell controller ICs 300 to 300*d* of the FF signals represents a loop for detecting the overcharge or overdischarge state of the unit cells. The reliability of the detection of the overcharge important for ensuring the safety of the lithium ion unit cells is detected by a system different from the communication line that passes through the TXD terminal and the RXD terminal. The FF signal assumes a rectangular wave signal having a given cycle, and for example, the rectangular wave signal is a rectangular wave of 1 kHz in a normal state, and a rectangular wave of 2 KHz in an overcharge state. When the cell controller IC 300 receives the rectangular wave of 1 kHz at an FF input terminal FFIN input, it is recognized that the high-level cell controller IC 300 is in a normal state (no overcharge). When it is detected that the detected cell voltage value of the cell controller IC 300 is the overcharge voltage, even when a frequency of the input signal of the FF input terminal FFIN is either 1 kHz or 2 kHz, a rectangular wave of 2 kHz is output to the FF output terminal FFOUT output, and the overcharge state is output to the lower-level cell controller IC 300. Also, if the frequency of the input signal at the FFIN terminal is neither 1 kHz nor 2 kHz, no rectangular wave is output to the FF output terminal FFOUT.

Even if one cell controller IC 300 does not detect the overcharge voltages of the unit cells of the cell group controlled by the one cell controller IC 300, if a rectangular wave of 2 kHz is input to the FF input terminal FFIN from another cell controller IC 300, the subject cell controller IC outputs the rectangular wave of 2 kHz to the FF output terminal FFOUT. In this way, the FF signal loop outputs that any cell controller IC 300 detects the overcharge, and the microcomputer 504 can detect the overcharge in a path different from the high-speed communication signal loop.

It is assumed that the microcomputer 504 normally outputs the rectangular wave indicative of a normal state of 1 kHz to the highest-level cell controller IC 300*a*. If the microcomputer 504 outputs the rectangular wave indicative of the overcharge of 2 kHz, the microcomputer 504 can confirm that the FF loop operates normally if the rectangular wave of the returned FF signal is 2 kHz even if all of the cell controller ICs 300*a* to 300*d* do not detect the overcharge voltage. Also, if a failure occurs in the FF loop, for example, if the disconnection occurs, since the rectangular wave is not transmitted, the microcomputer 504 can identify its state.

Figure 4:
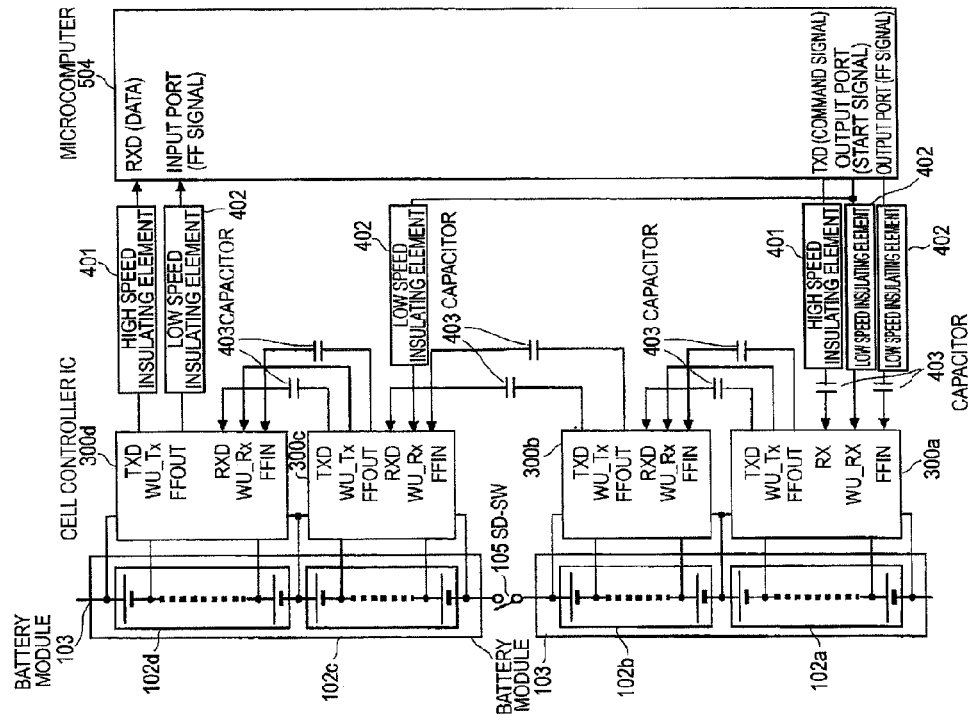
FIG. 4 is a diagram illustrating another connection example of the communication lines between the cell controller ICs 300 within the cell controller 200, and the microcomputer 504 within the battery controller 500, illustrated in FIG. 1 or 2.

FIG. 4 is a diagram illustrating an example in which the cell controller ICs 300*a* to 300*d* within the cell controller 200 and the microcomputer 504 within the battery controller 500 are connected to each other by another method. A difference from FIG. 3 resides in that the capacitors 403 are used in communication connection lines between the switches 105 in the middle of the battery pack. The command signal and the FF signal are rectangular wave signals of the short pulse, and data communication can be conducted even by using capacitive coupling. Therefore, with the application of such a circuit, the insulating element requiring a power supply such as a photocoupler can be reduced, and a current consumption by this insulating element can be reduced.

Figure 5:
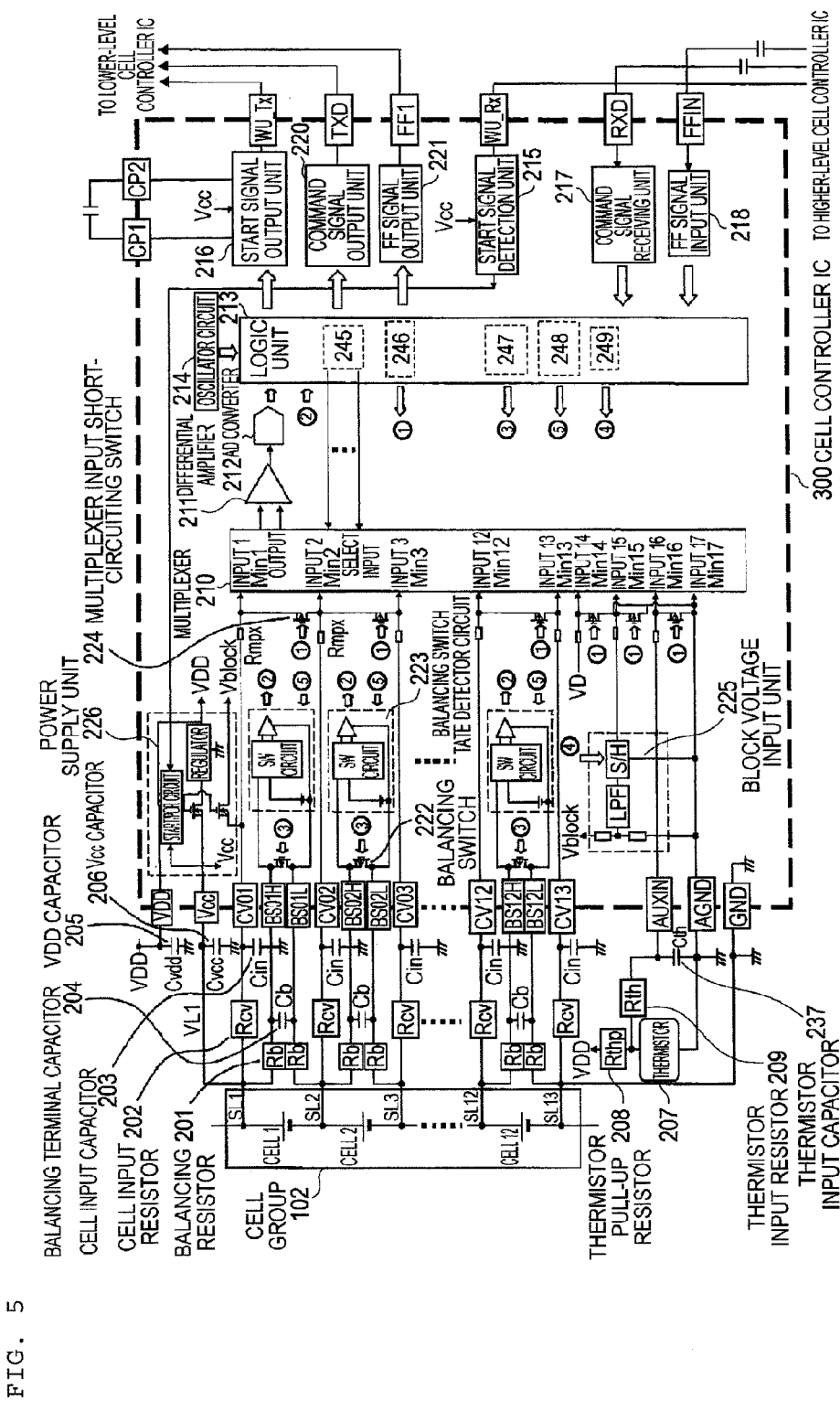
FIG. 5 is a diagram illustrating an internal configuration example of the cell controller ICs 300.
Figure 6:
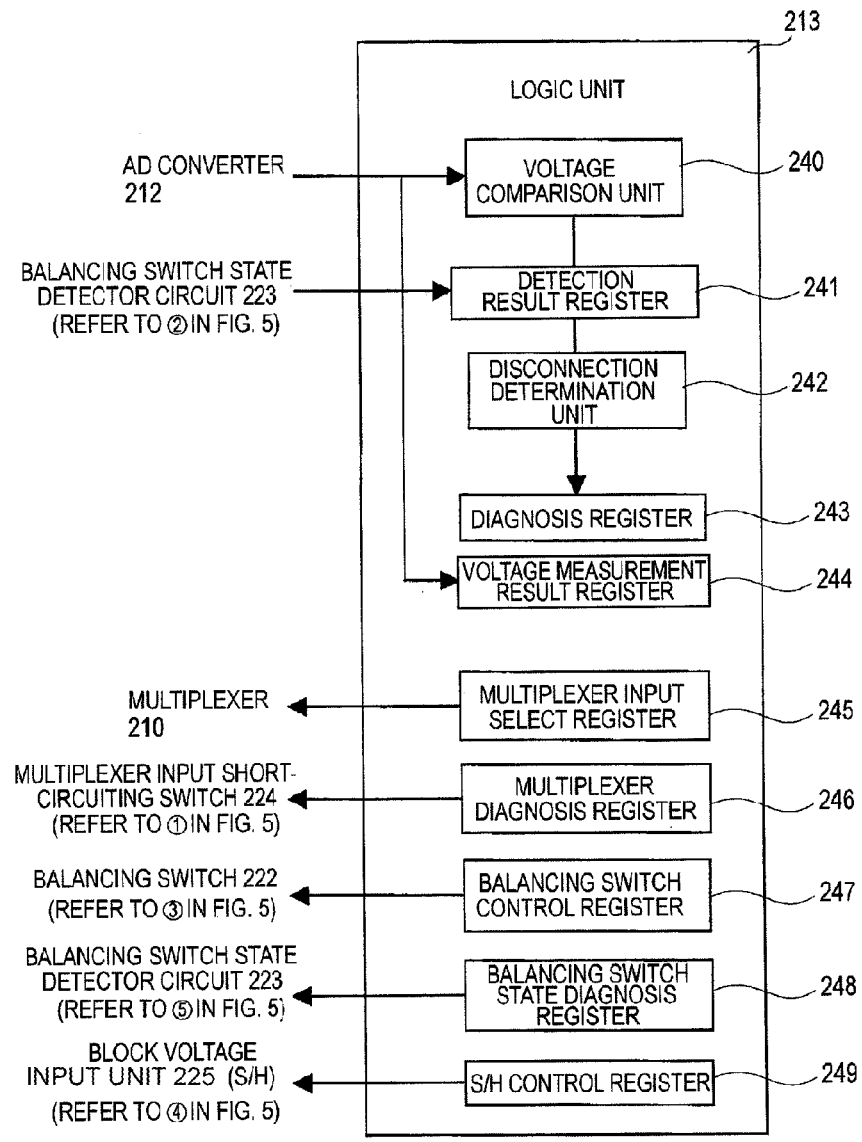
FIG. 6 illustrates a configuration example of a logic unit of the cell controller ICs 300.

FIG. 5 is an illustrative view illustrating an internal configuration of one cell controller IC 300. Also, a configuration outline of a logic unit 213 is illustrated in FIG. 6.

In this example, the cell group 102 includes 12 unit cells 101 (cells 1 to 12). The cell group 102 and the cell controller IC 300 that controls the cell group 102 are connected to the respective voltage detection CV terminals (CV1 to 13 terminals) and respective BS terminals (BS01H to BS12H terminals and BS01L to BS12L terminals) that conduct the balancing operation through voltage detection lines SL1 to SL13 that detect the voltages across the respective unit cells. Both ends of each unit cell, that is, a positive terminal and a negative terminal are connected to the CV terminal through a cell input resistor Rcv 202. A cell input capacitor Cin 203 is connected between each CV terminal and the lowest-level GND terminal.

The cell input resistor Rcv 202 and the cell input capacitor Cin 203 configure an RC filter to suppress noise mainly including a ripple voltage superimposed on the cell voltage, which is attributable to the operation of the inverter 700. Voltage terminals on both ends of the unit cell are each connected to a balancing switch terminal (BS terminal) through a balancing resistor (Rb) 201. The IC interior is connected with a balancing switch (BS) 222 that supplies a balancing current. When the BS 222 is turned on, the balancing current of the cell flows through the balancing resistor 201. A balancing terminal capacitor (Cb) 204 is connected between the BS terminals. This configuration is intended to prevent malfunction at the time of balancing switch diagnosis which will be described later, and prevents the maldetection from being conducted by the noise such as the ripple voltage attributable to the operation of the inverter 700. Referring to FIG. 5, two of the balancing resistors 201 are so disposed as to sandwich the balancing switch therebetween for each of the balancing switches. Alternatively, only one balancing resistor 201 may be provided.

The balancing discharge BS terminal and the inter-terminal voltage measurement CV terminal of each unit cell are disposed as respective dedicated terminals. Also, each balancing discharge circuit configured by the balancing resistors Rb 201 and the balancing switch BS 222 is connected to the voltage detection line on the unit cell side by the cell input resistor Rcv 202. As a result, because the balancing current does not flow in the cell input resistor Rcv 202, the inter-terminal voltage can be accurately measured. In a normal state where no disconnection is present in the voltage detection line, the balancing resistors Rb 201, the balancing terminal capacitor Cb 204, and the on/off operation of the balancing switch 222 in the balancing discharge circuit do not affect the inter-terminal voltage measurement. Up to now, as disclosed in JP-A-2010-249793, a part of the balancing discharge circuit is frequently shared by the circuit (voltage detection line and cell input resistor) for the inter-terminal voltage measurement. When the balancing discharge is conducted, the inter-terminal voltage is reduced. Therefore, the accurate inter-terminal voltage measurement is implemented by stopping the balancing discharge.

Also, up to now, the cell input capacitor Cin 203 is connected between the voltage detection lines connected to the positive and negative electrodes of each unit cell. However, in the configuration according to the present invention, the negative electrode side of the cell input capacitor Cin 203 is connected to the GND. With the application of the circuit configuration, in the normal state where no disconnection is present, the capacitor Cin 203 is not discharged by turning on/off the balancing switch, and therefore, the inter-terminal voltages of the respective unit cells can be accurately measured during the balancing discharge.

The CV terminals are connected to the input terminals (Min terminal Min1 to Min 13) of a multiplexer 210 within the cell controller IC 300. The multiplexer 210 selects the respective cells, outputs a positive potential and a negative potential of the selected cell, and is controlled by an output of a multiplexer input select register 245 in the logic unit 213. The output of the multiplexer 210 is converted into an inter-terminal voltage of each unit cell through a differential amplifier 211, and the converted voltage is converted into a digital value by an AD converter 212. The operation of the AD converter 212 is controlled by the logic unit 213, and the output of the AD converter 212 is processed by the logic unit 213. That is, the differential amplifier 211 and the AD converter 212 conduct the voltage measurement.

The AD converter 212 is applied with a high-speed AD converter of, for example, a successive approximation type. With the application of this high-speed AD converter, the diagnosis of the multiplexer, which will be described later, or the like, can be conducted at a high speed.

If a noise component is included in a signal, the high-speed AD converter detects the signal as it is, and subjects the signal to AD conversion. For that reason, the cell input resistor Rcv 202 and the cell input capacitor Cin 203 are disposed in each of the voltage detection lines connected to the CV terminals for the inter-terminal voltage measurement to configure the RC filter so that after the removal of the noise, the signal is input to the AD converter 212 through the multiplexer 210 and the differential amplifier 211.

For example, a cutoff frequency of the RC filter of the CV terminal is set to about 50 Hz. With this configuration, the noise (about 20% and about 20 kHz in p-p) caused by the semiconductor switching element in the inverter 700 can be set to $1/100$ or lower.

The capacitor Cb 204 connected to the balancing terminal (BS terminal) is a bypass capacitor provided for measure against the noise in the balancing switch. Since a time constant of the balancing discharge circuit of the RC filter configured by the balancing resistors Rb 201 and the balancing terminal capacitor Cb 204 is small, the disconnection determination in the balancing current detection can be conducted at a high speed as will be described later. Also, since the disconnection determination in this method is conducted by determining whether the balancing current flows, or not, a threshold value of the determination can be set so that the noise from the inverter does not become a problem. As will be described at once later, the cutoff frequency of the RC filter of the balancing discharge circuit is set to about ten times of the cutoff frequency of the RC filter of the CV terminal for the inter-terminal voltage measurement described above.

In order to set the cutoff frequency of the RC filter of the CV terminal to be higher than the value described above to remove the non-removable noise component, sampling is conducted by the AD converter by plural times, and a plurality of sampling results can be averaged to remove the noise component.

Referring to FIG. 5, the respective voltage detection lines extend from the positive electrodes or the negative electrodes of the unit cells (cells 1 to 12) to the input terminals Min1 to Min13 of the multiplexer 210. The disconnection detection of the voltage detection lines which will be described later is intended for the detection of a disconnection between the positive electrode or negative electrode of the unit cells (cells 1 to 12) and an input of the cell controller 200 (refer to FIG. 1 or 2).

The multiplexer input short-circuiting switch 224 is disposed between two adjacent voltage input lines among the voltage input lines (that is, voltage detection lines) connected to the input terminals Min1 to Min13 of the multiplexer 210, that is, the voltage detection line connected to the positive electrode of each unit cell and the voltage detection line connected to the negative electrode thereof. It is assumed that the multiplexer input short-circuiting switches 224 corresponding to the respective unit cells are SWX1 to SWX12. Also, a multiplexer input protection resistor Rmpx is disposed in each of the voltage input lines.

Input terminals Min14 to Min17 of the multiplexer 210 are provided to receive an output voltage from the block voltage input unit 225 which will be described later, and multiplexer input short-circuiting switches SWX14 to SWX16 are also disposed between input lines of those input terminals.

FIG. 6 illustrates an outline of the configuration of the logic unit 213. The operation and function of the logic unit will be described in a disconnection detection method and a diagnosis method thereof which will be described later. In this example, the configuration will be described in brief.

A detection voltage signal is input to the logic unit 213 from the AD converter 212, and the detection voltage signal is compared with a given threshold value by a voltage comparison unit 240. For example, if the detection voltage signal is larger than the given threshold value, a detection result "1" is stored in a detection result register 241 assuming that a normal voltage is detected in a measurement order of the input selected by the multiplexer 210.

When the balancing switch state detector circuits 223 operate to detect whether the balancing current is present, or not, or diagnose the balancing switch 222, their results are stored directly in the detection result register 241 (refer to 2 in FIG. 5).

A disconnection determination unit 242 determines the disconnection of the voltage detection lines on the basis of the detection results stored in the detection result register 241 according to a disconnection detection method which will be described later. The disconnection determination is conducted with reference to two or more results of the sequential measurements (the presence or absence of inter-terminal voltages of the unit cells and the balancing currents). The results of the disconnection determination of the voltage detection lines are stored in a diagnosis result register 243.

Although will be described later, even when the measurement for diagnosing a circuit or logic involved in the disconnection detection is conducted, those measurement results are stored in the diagnosis result register 243. In the diagnosis of the circuit and logic involved in the disconnection detection based on the measurement results in the above diagnosis, a diagnosis of a portion corresponding to the measurement is conducted by the disconnection determination unit 242 by one sequential measurement, and stored in the diagnosis result register, likewise.

As described above, an output of the AD converter 212 is the inter-terminal voltage of the unit cell selected by the multiplexer 210, or a voltage between two voltage detection lines connected to the input terminals Min1 to Min13. In the operation of the normal electric storage device 100 other than the disconnection detection or diagnosis, the inter-terminal voltages of the respective unit cells are stored in a voltage measurement result register 244. Also, as will be described later, even when the disconnection detection is conducted with the use of the measured values of the inter-terminal voltages of the unit cells, the inter-terminal voltages of the respective unit cells are stored in the voltage measurement result register 244.

The disconnection detection results or diagnosis results stored in the diagnosis result register 243, and the inter-terminal voltages of the respective unit cells stored in the voltage measurement result register 244 are transmitted to the high-level controller (battery controller 500) from the cell controller IC 300 through the communication lines, as described above.

The logic unit 213 includes a register that controls a variety of switches provided in the cell controller IC 300.

Figure 10:
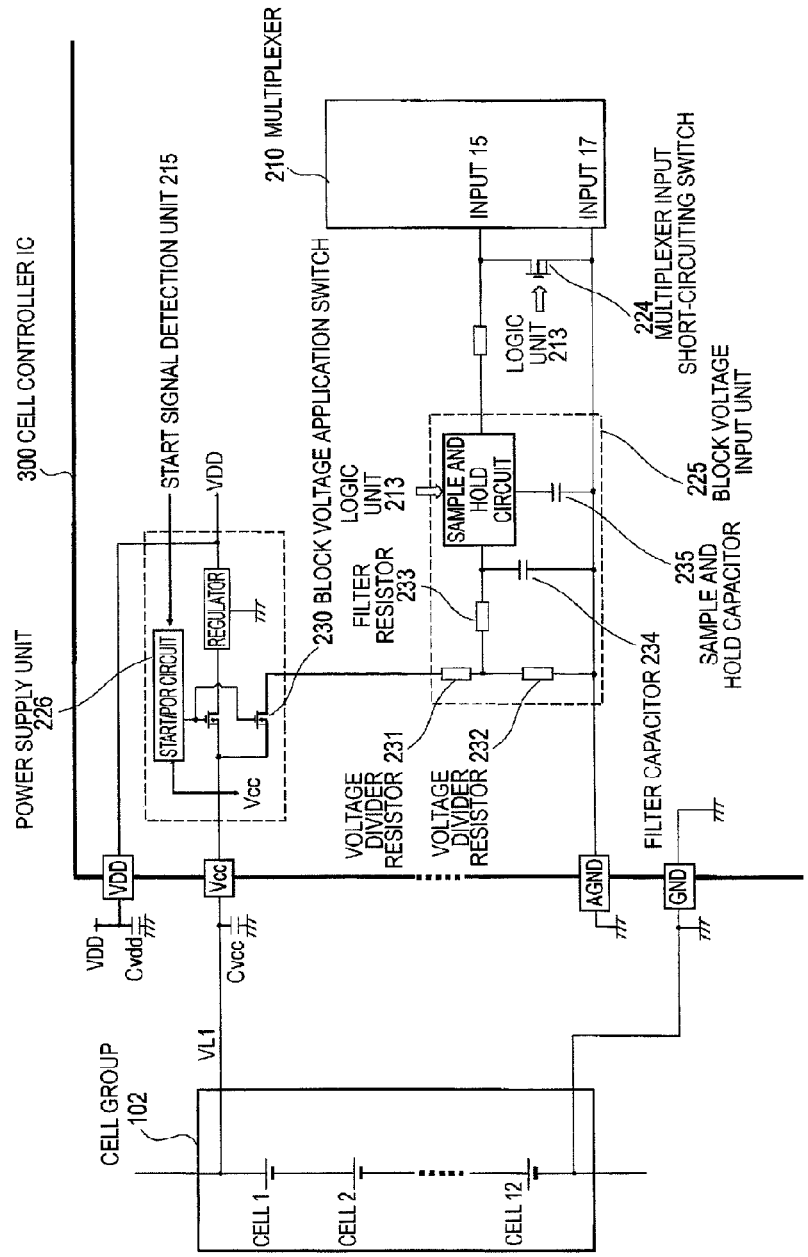
FIG. 10 is a schematic diagram of a circuit that inputs a block voltage to a multiplexer for measuring the block voltage.

Data for switching the multiplexer 210 to select the input is stored in the multiplexer input select register 245. Data for controlling the multiplexer input short-circuiting switches 224 for diagnosing the multiplexer which will be described later is stored in a multiplexer diagnosis register 246. Data for controlling the on/off operation of the balancing switch 222 provided for each of the cells is stored in a balancing switch control register 247. Data for controlling a switch circuit of the balancing switch state detector circuits 223 for diagnosing the balancing switch 222 is stored in a balancing switch state diagnosis register 248. Data for controlling a switch (not shown) within a sample and hold circuit 236 of the block voltage input unit 225 illustrated in FIG. 10 is stored in an S/H control register 249.

For a disconnection detection function of the voltage detection line and the diagnosis of the disconnection detection function, which will be described later, data for operating the variety of switches provided in the cell controller IC 300 is transmitted from the high-level controller (battery controller 500) together with an instruction for the disconnection detection, and an instruction for diagnosis of the disconnection detection function. Data for operating those various switches is stored in the above registers.

Upon receiving the instruction for the disconnection detection or the instruction for diagnosis of the disconnection detection function from the high-level controller, the cell controller IC 300 operates the various switches with the use of the data stored in those registers to conduct the disconnection detection or the diagnosis of the disconnection detection function.

An operating power supply of the cell controller IC 300 is supplied from a Vcc terminal (refer to FIGS. 5, 7, 8, and 10). A Vcc capacitor (Cvcc) 206 connected to the Vcc terminal is a capacitor that suppresses the noise. An inter-terminal voltage Vcc of the cell group 102 is input to the Vcc terminal through a power supply line VL1. As illustrated in FIGS. 5, 7, 8, and 10, the power supply line VL1 is connected to the highest-level voltage detection line SL1 on a cell group side with respect to the resistor Rcv 202, or on a positive electrode side of the cell 1 which is the highest-level cell of the cell group 102. The Vcc terminal is further connected to a power supply unit 226 within the cell controller IC 300, and a regulator within the power supply unit 226 applies 3.3 V operating power supply VDD to a circuit that operates with a VDD power supply including a logic unit. The power supply VDD is also connected to a VDD terminal of the cell controller IC 300. The VDD terminal is connected with a VDD capacitor (Cvdd) 205 for operation stabilization, and also supplies a power to a circuit that operates by an external Vdd.

The power supply unit 226 has a start signal detector circuit that starts in response to an output of a start signal detection unit 215, and upon receiving the start signal from the high-level cell controller IC or the microcomputer 504 through the insulating element 402, the power supply unit 226 supplies the power to the regulator, and also conducts the start and POR (power-on reset) operation. When the cell controller IC 300 starts, a start signal output unit 216 operates according to an output from the logic unit 213, and outputs the start signal to the low-level cell controller IC 300. The start signal output unit 216 is connected with a capacitor outside the cell controller IC 300. This capacitor conducts charge pump operation, and is intended to generate a voltage higher than the power supply Vcc of the cell controller IC 300 by a set voltage.

The Vcc terminal is always connected to the start signal detection unit 215, and even in a state where the overall operation of the cell controller IC 300 stops, the power is supplied only to the start signal detection unit 215. However, because the power is supplied from the battery (cell group 102) in a state where the cell controller IC stops the operation, the start signal detection unit 215 has a circuit configuration to reduce the current consumption as much as possible.

Figure 7:
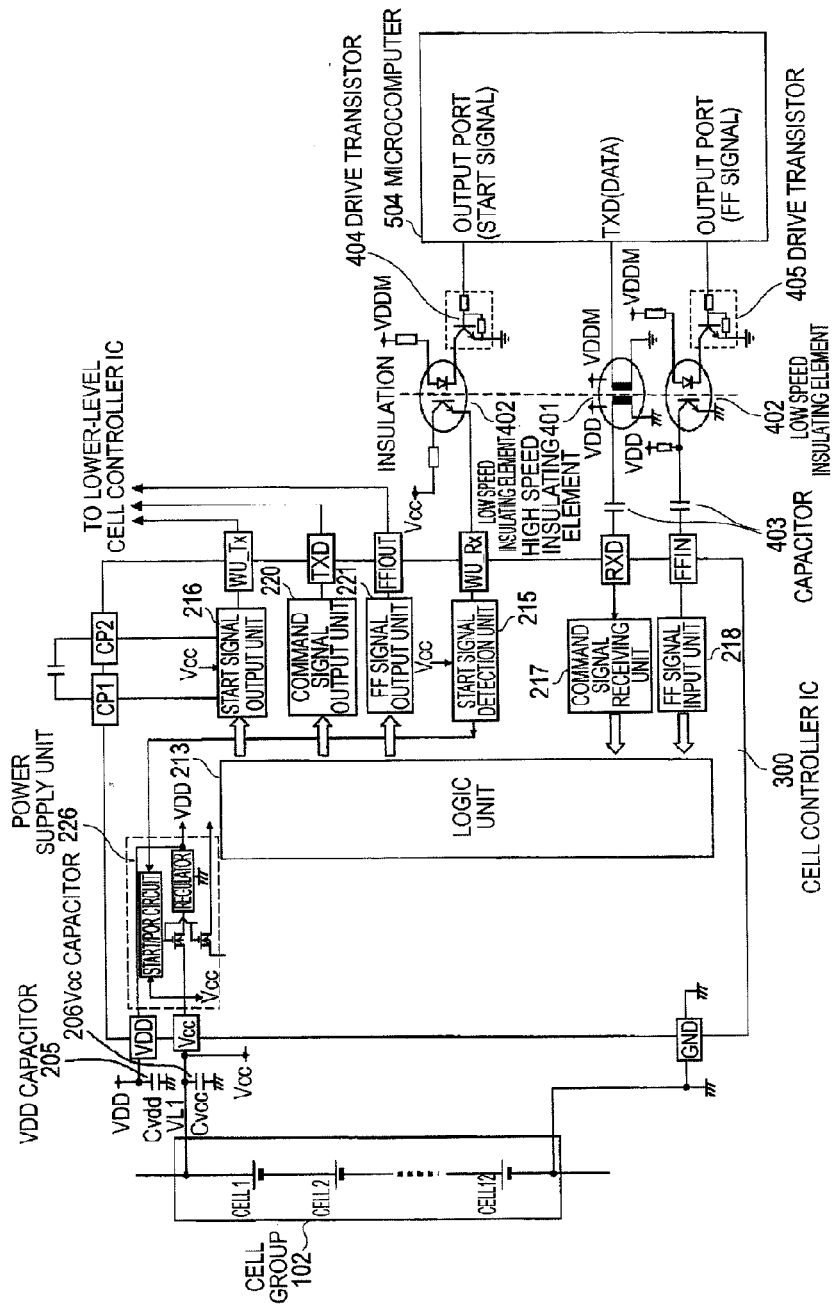
FIG. 7 illustrates a connection of a start detection unit, a communication receiving unit, and an external circuit of an FF input unit when the cell controller ICs 300 are set to a highest level.

FIG. 7 is a diagram illustrating a connection example of the start signal detection unit 215, a command signal receiving unit 217, and an FF signal input unit 218 to an external circuit in the highest-level cell controller IC 300a of FIG. 3. When the cell controller IC 300 is set to the highest level, a WU_RX terminal is used as the start signal input terminal. This terminal is connected with the low speed insulating element 402 for start which is a photocoupler, and the microcomputer 504 supplies a current to a diode of the low speed insulating element 402 for start through a drive transistor 404 to turn on the isolated transistor side. The transistor side of the low speed insulating element 402 is connected to Vcc of the cell controller IC 300 through a resistor. When the transistor side is turned on, Vcc is applied to the WU_RX terminal of the cell controller IC 300. The start signal detection unit 215 is a comparator having a set threshold value, and outputs a start detection signal to the power supply unit 226 upon detecting an on-state of the transistor of the insulating element 402. With this configuration, as described above, the current consumption of the operating stop state can be reduced.

Also, the terminal RXD is used for the command signal receiving unit 217. This terminal is connected with the down-sized communication high speed insulating element 401 using a transformer through the capacitor 403, and a communication signal is transmitted from the microcomputer 504.

For example, a digital isolator is used for the high speed communication insulating element. However, the digital isolator needs the operating power supply even on the transmitting side different from the photocoupler. This operating power is supplied from the power supply VDD of the cell controller IC 300 with the use of the VDD terminal. Because the VDD is not output when the operation stops, no dark current flows during the operation stop. The command signal receiving unit 217 is designed to detect a pulse signal, and the detected pulse signal is used in the logic unit 213 as a digital communication signal.

Also, a terminal FFIN is used for the FF signal input unit 218, and as with the command signal receiving unit 217, the microcomputer 504 drives a drive transistor 405 through the low speed insulating element 402, which is the photocoupler, and the capacitor 403 to transmit the FF signal. The FF signal input unit 218 detects the pulse signal, and the detected pulse signal is detected by the logic unit 213 as an overcharge or overdischarge signal.

Figure 8:
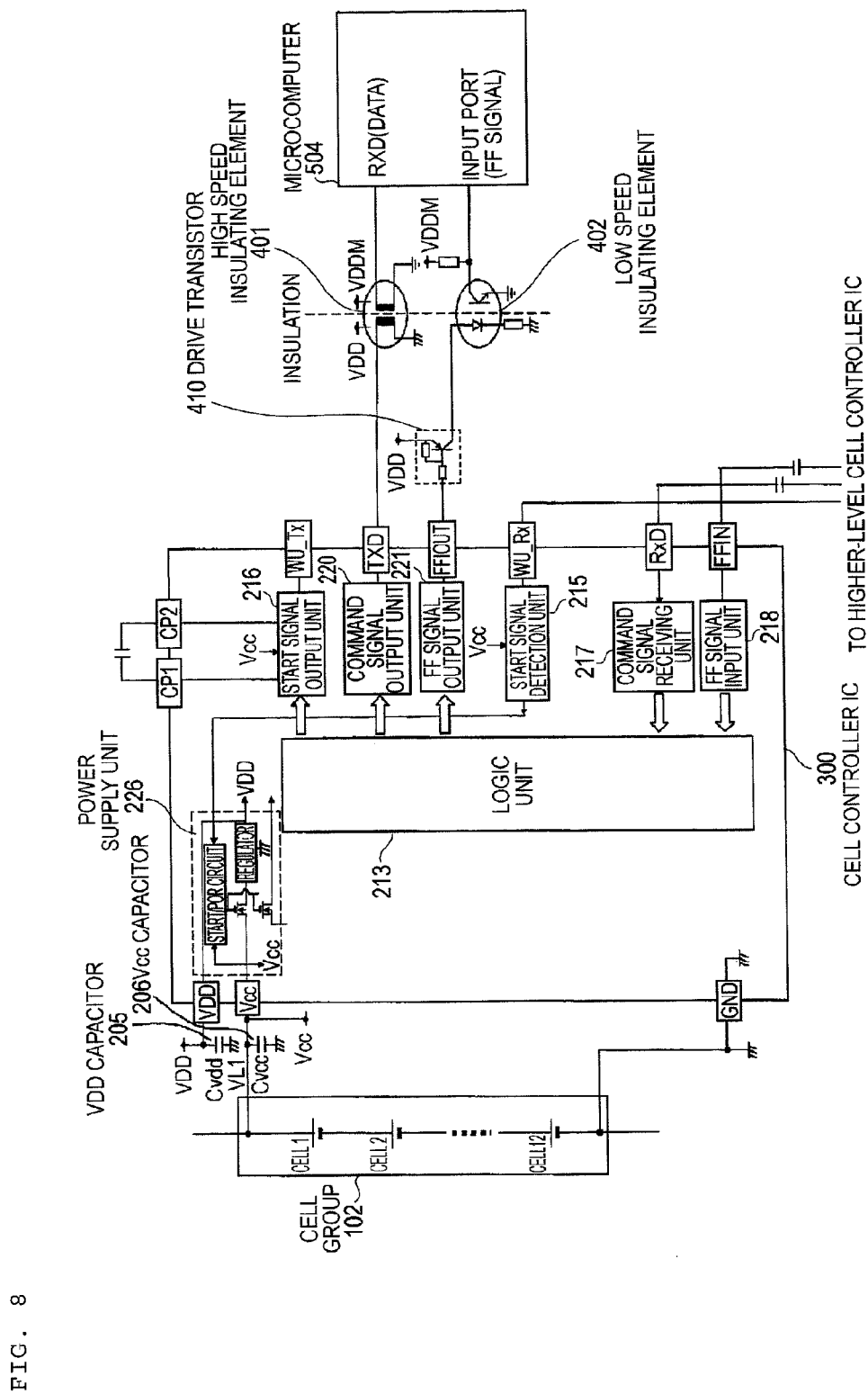
FIG. 8 is an illustrative view illustrating the details of a connection to the microcomputer 504 when the cell controller ICs 300 are set to a lowest level.

FIG. 8 is a diagram illustrating a connection example of a command signal output unit 220 and an FF signal output unit 221 to an external circuit in the lowest-level cell controller IC 300*d* of FIG. 3. A command output signal of the command signal output unit 220 is output from the output terminal TXD, and received by a data receiving port RXD of the microcomputer 504 through the high speed insulating element 401 for a command signal communication. In the communication high speed insulating element 401 using a transformer, VDD of the cell controller IC 300 is used as a supply power on a transmitter side. An output signal terminal FFO of the FF signal output unit 221 drives the start low speed insulating element 402, which is the photocoupler, through a drive transistor 410. An output signal from the photocoupler is input to the FF signal input port of the microcomputer 504. That all of the start signals output from the microcomputer 504 are received by the cell controller IC is confirmed by receiving the FF signal output after the lowest-level cell controller IC 300*d* has started by the microcomputer 504. Since transfer of the signals through the low-speed and high-speed insulating elements 401 and 402 is identical with that described in FIG. 7, its description will be omitted.

Figure 31:
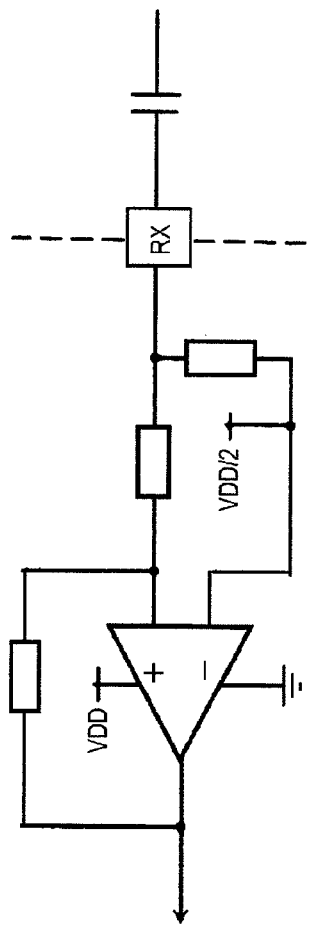
FIG. 31 is an illustrative view illustrating an internal configuration of a communication receiving unit in the cell controller IC 300.
Figure 32:
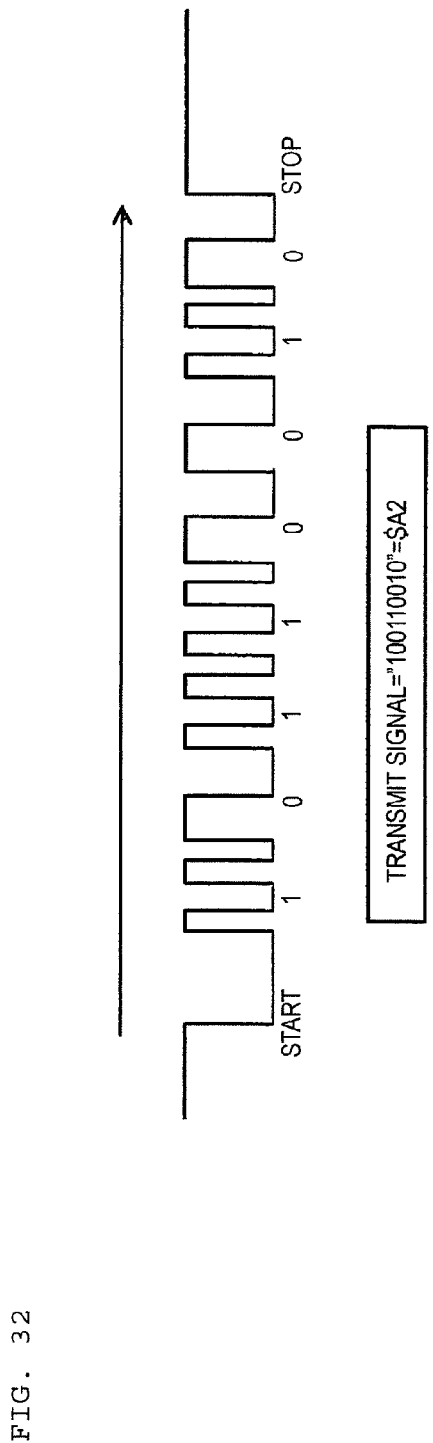
FIG. 32 is an illustrative view illustrating a communication waveform example of an FSK system.

As illustrated in FIGS. 3, 4, and 7, a communication between the cell controller ICs 300, and the transmission of the FF signals are conducted with the use of the capacitors 403. A specific circuit configuration of the receiving unit is illustrated in FIG. 31. A capacitive coupled input terminal RX is connected with a load resistor applied with a voltage of Vdd/2, its positive electrode side terminal is connected to a comparator having a hysteresis characteristic having Vdd/2 as a threshold value, and the pulse signal supplied to the input terminal RX is reproduced as the command signal.

Because a DC component is varied by a duty ratio of the command signal in the capacitive coupling, it is preferable that the duty ratio is 50% from the viewpoint of a noise resistance. Therefore, the FF signal is a rectangular wave having the duty ratio of 50%, but it is preferable that the high speed communication signal is also a signal having the duty ratio of 50%. As its communication signal system, there is an FSK system (frequency shift keying) that shifts a frequency of the rectangular wave by logic "0" and "1", or a PWM system (pulse width modulation) that modulates a pulse width of the rectangular wave by the logic "0" and "1". The use of those systems makes it possible to enhance the noise resistance and ensure the reliability. FIG. 31 illustrates a communication waveform example of the FSK system. As illustrated in the figure, since a pulse signal cycle at the time of transmitting data "1" is a half of the pulse signal cycle at the time of transmitting data "0", the duty ratio at the time of transmitting the data is 50%. Therefore, the DC component is not varied, and a communication high in the reliability can be conducted in the circuit configuration illustrated in FIG. 32.

In FIGS. 5, 7, and 8, the cell controller IC 300 illustrated on an upper side of those figures is set as the low-level cell controller IC 300, and the cell controller IC 300 illustrated on a lower side thereof is set as the upper-level cell controller IC 300. This is because as illustrated in FIGS. 3 and 4, in the example of the electric storage device according to the present invention, the instruction from the microcomputer 504 is first transmitted to the cell controller IC illustrated on the lower side of the figures, and the higher level and the lower level of the cell controllers are set on the basis of the order in the communication path. Since a circuit configuration in which the instruction from the microcomputer 504 is first received by the cell controller IC illustrated on the upper side of the figures is also acceptable, the higher level/lower level of the cell controller IC are not limited to a state illustrated in the figures.

Also, reference numerals 102*a* to 102*d* of the respective cell groups in FIGS. 3 and 4 are also set according to a relationship between the upper level and lower level of the cell controller IC illustrated in this example, and a cell group on the lowest side in the figures is denoted by 102*a*.

In the unit cells in the respective cell groups, since a potential of the unit cells on the upper side of the figures is higher, the unit cells illustrated on the upper side of the figures are set as the higher-level unit cells.

Figure 9:
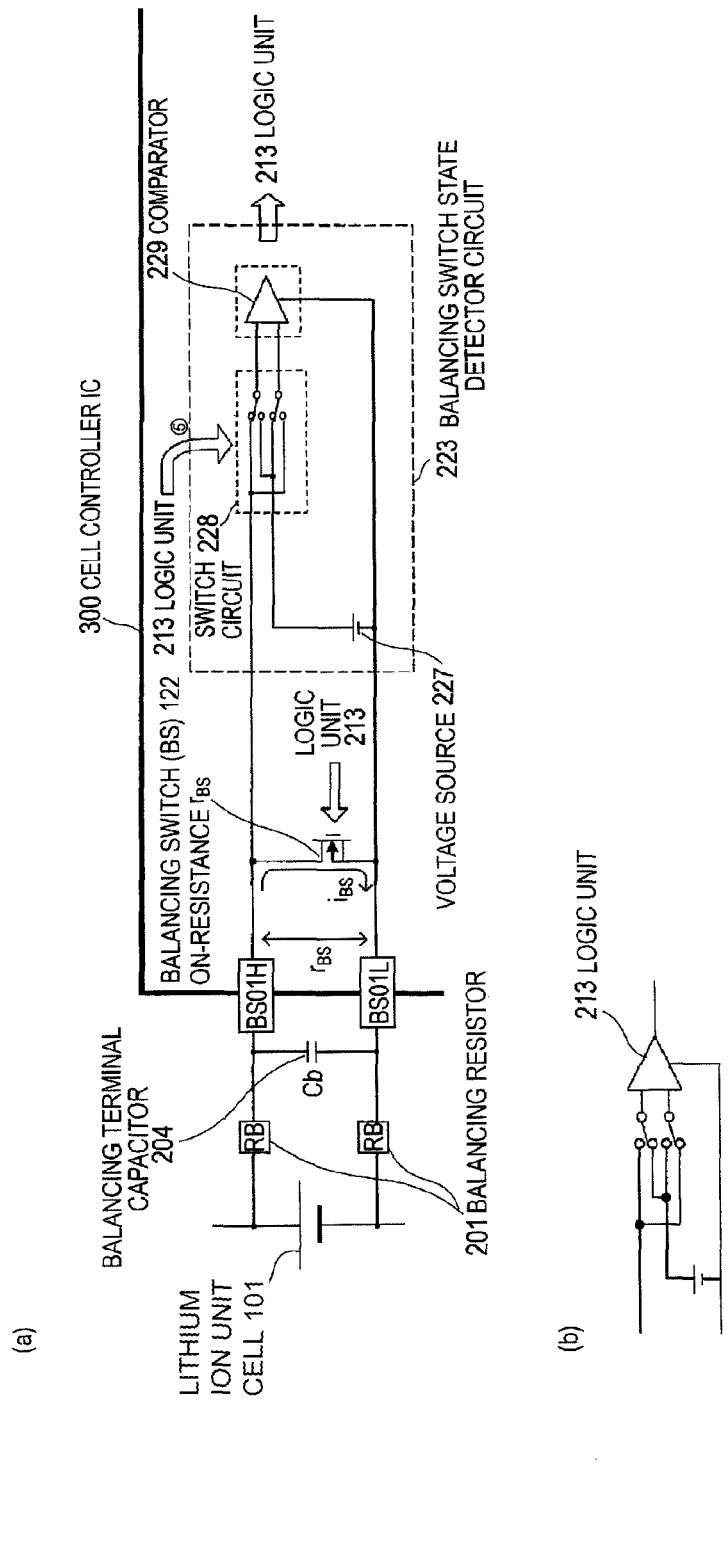
FIG. 9 is a schematic diagram illustrating each of balancing switch state detector circuits 223 that detect a balancing switch state, for diagnosing balancing switches 222. (a) illustrates the balancing circuit and the balancing switch state detector circuit 223 illustrated in FIG. 5, for one cell. (b) illustrates the operation of switching a switch circuit illustrated in (a) to invert a comparator output.

FIG. 9 is an illustrative view of the balancing switch state detector circuits 223 that diagnose the balancing switch (BS) 222. The balancing switch BS 222 is controlled according to an output of the balancing switch control register 247 in the logic unit 213. The balancing switch BS 222 is diagnosed by comparing the inter-terminal voltage of the BS 222 with a voltage source 227 by a comparator 229. That is, when the balancing switch BS 222 is on, the inter-terminal voltage $V_{BS}$ of the BS 222 becomes the balancing current $i_{BS} \times$ on-resistance $r_{BS}$ of the balancing switch. When the BS 222 is off, $V_{BS}$ becomes the inter-terminal voltage of the unit cells 101. Therefore, a threshold value of the comparator 229 is set to a voltage between a minimum value of a use range of the voltage across the unit cell 101, and an assumed maximum value of $i_{BS} \times r_{BS}$. For example, if it is assumed that a minimum use voltage of the unit cells 101 is 2 V, a maximum balancing current is 100 mA, and a maximum on-resistance value is 10Ω, the inter-terminal voltage of the BS 222 during the balancing operation becomes 1 V at maximum. Therefore, a threshold value of the comparator 229 may be set to 1.5 V. That is, a voltage across the voltage source 227 which is input as the threshold voltage of the comparator 229 is set to 1.5 V.

The diagnosis of the balancing switch BS 222 is conducted by detecting an output of the comparator 229 by the logic unit 213 when the BS 222 is off and on. The switch circuit (SW) 228 is normally operated so that a positive electrode side voltage of the BS 222 is input to a plus input side of the comparator 229, and a threshold voltage of the voltage source 227 is input to a minus input side. If the balancing switch BS 222 is off, the positive electrode side voltage of the BS 222 becomes the inter-terminal voltage of the unit cells 101. Therefore, the output of the comparator 229 becomes 1 (or high). Also, if the balancing switch BS 222 is on, since a balancing current flows in the BS 222, the positive electrode side voltage of the BS 222 becomes $i_{BS} \times r_{BS}$ as described above, and the output of the comparator 229 becomes 0 (or low).

In this way, the output of the comparator 229 is indicative of whether the balancing current flows, or not. Therefore, when the logic unit 213 controls the balancing switch (BS) 222 to turn on, the output of the comparator 229 becomes high. If it is determined that no balancing current flows, it can be determined that the BS 222 is in an open fault state, or the balancing current supply circuit is opened. Also, when the logic unit 213 controls the BS 222 to turn off, the output of the comparator 229 becomes low. If it is determined that the balancing current flows, it can be determined that the BS 222 is in a short fault state, the terminals of the BS 222 is short-circuited, or the balancing terminal capacitor (Cb) 204 is in the short fault state.

In this example, the number of threshold value in the comparator is set to one. Alternatively, the state of the BS 222 may be determined according to two kinds of threshold values with the use of two comparators. For example, if the two kinds of threshold values are each set to the inter-terminal voltage of the maximum BS 222 assumed when the balancing switch is on, and the assumed minimum inter-terminal voltage, it can be determined whether the flowing balancing current falls within the assumed range, or not. A detection timing of the comparator output is conducted by reading the output of the comparator when the balancing switch BS 222 is turned on according to an instruction from the high-level controller (battery controller 500).

(Diagnosis of BS Diagnosis Circuit by Switching Input of BS Diagnosis Circuit)

The switch circuit (SW) 228 is inserted into the input of the comparator 229, and as illustrated in FIGS. 9(a) and 9(b), a plus side input voltage and a minus side input voltage of the comparator are switched according to a signal of the logic unit 213. This is to diagnose the balancing switch state detector circuits 223. When the SW 228 switches, since the output of the comparator 229 is inverted, it can be confirmed whether the comparator 229 operates normally, or not, under a control from the high-level controller (battery controller 500) through the logic unit 213, and the reliability can be enhanced (refer to FIG. 9(b)). Also, at the time of diagnosing the disconnection according to a disconnection diagnosis command which will be described later, an artificial disconnection state can be created to diagnose the disconnection diagnosis operation. The switch circuit 228 is controlled according to the output of the balancing switch state diagnosis register 248 in the logic unit 213.

(Block Voltage Measurement)

FIG. 10 is an illustrative view of a circuit that measures the block voltage. As illustrated in FIG. 2, the battery controller 500 has no total voltage measurement circuit. Instead, when the battery controller 500 receives an instruction for measuring a total voltage of the battery system 104 from the high-level controller (inverter or vehicle controller) through a CAN (controller area network) communication, the battery controller 500 transmits an instruction for measuring a voltage (called "block voltage") across each overall cell group of the plurality of cell groups in the battery system 104 substantially at the same time, to the plurality of cell controller ICs 300, as described with reference to FIGS. 3 and 4. Each of the cell controller ICs 300 measures the voltage (block voltage) across the overall cell group including 12 unit cells to be controlled, and the battery controller 500 receives the measured data through a communication, and integrates the respective block voltages as the total voltage of the battery system 104.

(Block Voltage Measurement by Broadcast Command)

In this situation, the battery controller 500 issues the instruction for measuring the block voltage across the cell groups controlled by the respective cell controller ICs 300 to all of the cell controller ICs 300 by one command. This command does not designate the cell controller IC 300 of a specific address, but is issued to all of the cell controller ICs 300 by one command transmission. A difference of μ sec order occurs in timing at which the respective cell controller ICs 300 receive the instruction for measuring the block voltage due to a delay caused by a transmission path length of the signal, and therefore timing at which the respective cell controller ICs measure the block voltages is also deviated in the μsec order. However, a filter low in the cutoff frequency is inserted into the block voltage input unit 225 as will be described below, and a difference in the measured values of the block voltages is hardly caused by the timing difference of the μsec order. For that reason, it can be considered that the respective block voltages are measured substantially at the same time, which does not affect the measurement of the total voltage of the battery system 104.

In this way, the block voltage measurement is conducted by a broadcast command with the results that all of the cell controller ICs measure the inter-terminal voltages of the respective cell groups corresponding to those cell controller ICs substantially at the same time. The high-level controller (battery controller 500) reads the inter-terminal voltages of the respective cell groups through the communication lines, and can sum those voltages as a total voltage of the battery pack.

As illustrated in FIG. 10, a voltage across one overall cell group, that is, the inter-terminal voltage (=block voltage) of one cell group is applied to the power supply unit 226 through the Vcc terminal. A block voltage application switch 230 is incorporated into the power supply unit 226, and this switch is turned on when the cell controller IC 300 starts. An output voltage of the block voltage application switch 230 is divided by voltage divider resistors 231 and 232 each using a high resistance with high precision, and input to the sample and hold circuit 236 through a filter resistor 233 which is a noise removal RC filter, and a filter capacitor 234. A cutoff frequency of this RC filter is set to the same degree as the cutoff frequency of the RC filter of the above-mentioned CV terminal.

The sample and hold circuit 236 is controlled by the logic unit 213, and the above divided block voltage is held in the sample and hold circuit 236. An output of the sample and hold circuit 236 is input to the multiplexer 210 through the multiplexer input short-circuiting switches 224 which will be described later. When the block voltage is measured, an input switching of the multiplexer 210 is designated from the logic unit 213, and the block voltage divided into an input 15 and an input 17 is input to the multiplexer 210. The divided block voltage input to the multiplexer is further converted into a digital value by the AD converter 212 through the differential amplifier 211 (refer to FIG. 5). A switch (not shown) within the sample and hold circuit 236 is controlled to be turned on when sample and hold is conducted according to an output of the S/H control register 249 in the logic unit 213.

The measurement of the inter-terminal voltages of the respective cell groups by the block voltage measurement is conducted at the same time according to the broadcast command as described above, apart from the measurement of the inter-terminal voltages of the respective unit cells in the cell group. Also, because the total voltage of the battery system 104 needs to be always monitored, this block voltage measurement is frequently conducted substantially at regular intervals (for example, every 100 ms).

When the inter-terminal voltage measurement of the respective unit cells or the like is implemented in the disconnection diagnosis which will be described later, after the measurement is terminated, the sample and hold circuit 236 transmits the inter-terminal voltage of the cell group, and the inter-terminal voltages of the respective unit cells in this cell group to the high-level controller (battery controller 500) together. Therefore, there is a need to hold the measurement results of the block voltage until the inter-terminal voltage measurement of the unit cells in the disconnection diagnosis is terminated. Therefore, when the disconnection diagnosis is not conducted, there is no need to provide the sample and hold circuit 236.

The inter-terminal voltage values of the respective cell groups are calculated according to the voltage obtained by dividing the inter-terminal voltages (block voltages) of the above respective cell groups, with the use of the resistance values of the voltage divider resistors 231 and 232 by the high-level controller (battery controller 500). The summation of the inter-terminal voltages of all the cell groups is obtained as the total voltage across the battery pack.

(Dark Current Block of Block Voltage Input Unit 225)

Also, the reason that the block voltage application switch 230 is provided is because currents which flow in the voltage divider resistors 231 and 232 are blocked when the operation of the cell controller IC 300 stops to reduce the dark current.

(Frequency Characteristic Setting of RC Filter by External Connection of Filter Capacitor)

The filter resistor 233 configuring the above RC filter can be omitted by replacing its function with the voltage divider resistor 231. Further, the filter capacitor 234 is installed outside the cell controller IC 300, and a capacitance of the filter capacitor 234 is appropriately selected to enable the RC filter to have a desired frequency characteristic.

Figure 11:
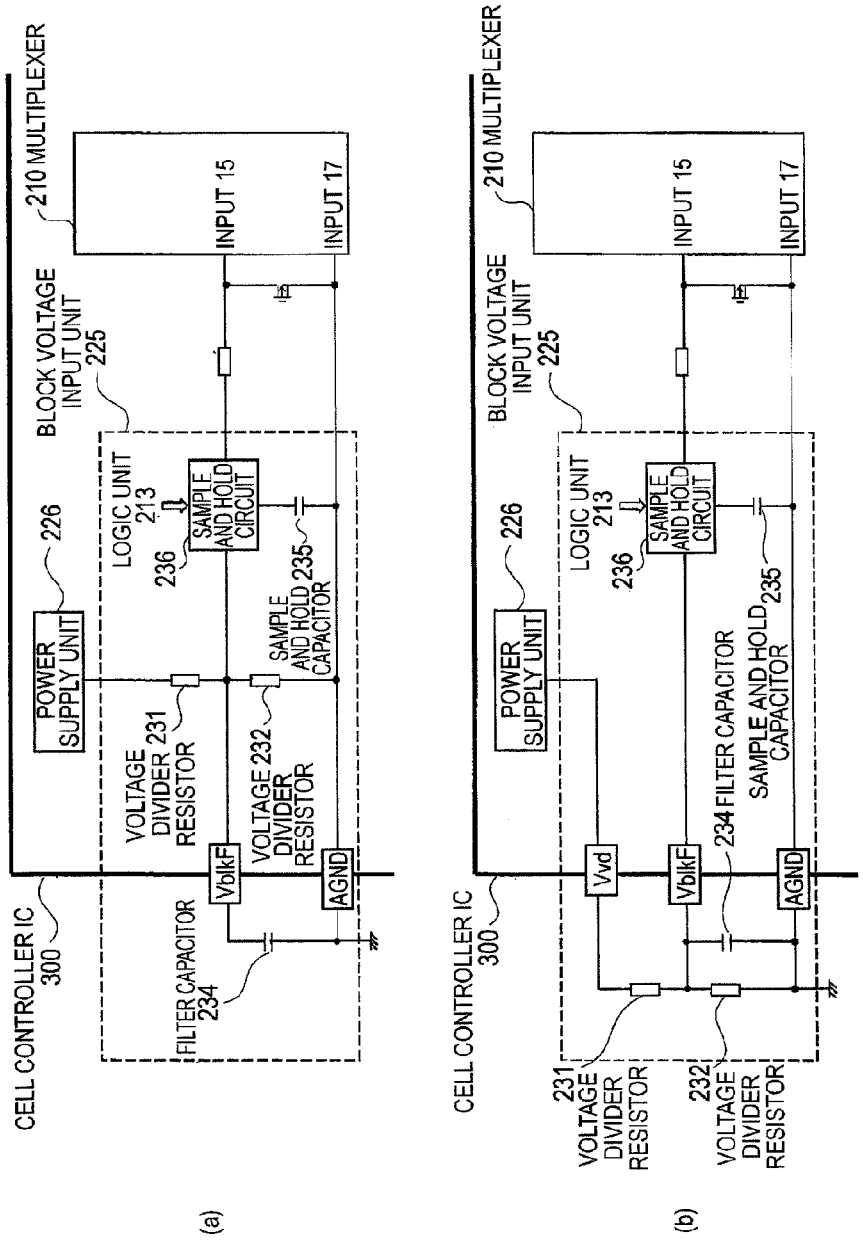
FIG. 11 is a schematic diagram of a circuit when an RC filter or voltage divider resistors of a block voltage input unit 225 illustrated in FIG. 10 are installed outside each cell controller IC 300. (a) illustrates an example in which only a filter capacitor is installed outside, and (b) illustrates an example in which both of the voltage divider resistors and the filter capacitor are installed outside.

FIG. 11(*a*) illustrates an example of the circuit in this case, and particularly illustrates a portion of the block voltage input unit 225 extracted from FIG. 10. In this example, because the filter capacitor 234 is installed outside the cell controller IC 300, an external connection terminal VdlkF is provided.

Also, if the high-precision voltage divider resistor cannot be integrated into the cell controller IC 300, for example, as illustrated in FIG. 11(*b*), an external connection terminal Vvd may be further provided, and the voltage divider resistors 231 and 232 may be installed outside the cell controller IC 300. In this example, because the voltage divider resistors 231 and 232 are installed outside the cell controller IC 300, the external connection terminal Vvd is further provided.

(MPX Diagnosis)

As illustrated in FIG. 5, the multiplexer input short-circuiting switches 224 are connected to the respective input terminals of the multiplexer 210 so that the respective input terminals can be short-circuited by the output of the logic unit 213 (refer to FIG. 6). This is intended to diagnose whether the multiplexer 210 operates normally, or not. The input designation of the multiplexer 210 is conducted by the multiplexer diagnosis register 246 present within the logic unit 213. If the register 246 is in failure, the normal input terminal cannot be designated, and all of the voltages including the cell voltages cannot be normally detected. Under the circumstances, the multiplexer diagnosis register 246 that controls the multiplexer input short-circuiting switches 224 is disposed within the logic unit 213 to conduct the diagnosis according to an output of the multiplexer diagnosis register 246.

A specific operation will be described with reference to FIG. 12. FIG. 12 illustrates a switching state of the multiplexer input short-circuiting switches 224 (SWX 1 to 12) for diagnosing whether the cell voltage input is normally switched, or not.

In the diagnosis of the multiplexer 210, in a state where one of the input short-circuiting switches SWX1 to SWX12 is turned on, and the others turned off, the multiplexer is so switched to measure the inter-terminal voltages of all the unit cells (cell 1 to cell 12), to conduct the measurement of the inter-terminal voltages. In order to confirm that the other unit cells are not selected in a state of the multiplexer for selecting a certain unit cell from this measurement result, the measurement is conducted in all combinations of the unit cells.

When the inter-terminal voltage of a unit cell is measured, the multiplexer is so switched as to select the voltage detection line connected to the positive electrode of this unit cell, and the voltage detection line connected to the negative electrode thereof. That is, for example, when the cell 1 is selected, the multiplexer 210 is controlled to select the input terminals Min1 and Min2 in FIG. 5. The control of the multiplexer 210 is conducted by the output of the multiplexer input select register 245 in the logic unit 213.

In one row illustrated in FIG. 12(*a*), only any one of the multiplexer input short-circuiting switches SWX1 to SWX12 is turned on (ON), and the other switches turned off (OFF) to measure the inter-terminal voltages of all the unit cells (cell 1 to cell 12). For example, a row of measurement No. "M1X 1 to 12" shows that the inter-terminal voltages of the cells 1 to 12 are measured in a state where only the multiplexer input short-circuiting switch SWX1 is on. The measurement Nos. at this time are M1X1 to M1X12.

For example, in the measurement of the measurement No. M1X1, the input terminals Min1 and Min2 are selected, and the inter-terminal voltage of the cell 1 is output from the multiplexer 210 to the differential amplifier 211. The output of the differential amplifier 211 is converted into a digital value by the AD converter 212, and input to the voltage comparison unit 240 in the logic unit 213, and also stored in the voltage measurement result register 244.

In the voltage comparison unit 240, if the output of the AD converter 212 corresponding to the inter-terminal voltage of the cell 1 is smaller than a given threshold value, for example, "0" is written into the detection result register 241, and if the output is larger than the given threshold value, "1" is written thereinto. "1" means that a normal voltage (for one unit cell) is detected. "0" means that 0V is detected because the multiplexer input short-circuiting switch SWX1 is turned on, and the multiplexer input terminals Min1 and Min2 are short-circuited. The "given threshold voltage" is set between a digital vale corresponding to the voltage for one unit cell, and a digital value corresponding to 0V.

In this way, the measurement results of the measurement Nos. M1×1 to M1×12 are written into the detection result register 241. If the multiplexer 210 operates normally to be switched, only the result of M1×1 among the measurements of the measurement Nos. M1×1 to M1×12 becomes "0", and the other measurements become "1".

FIG. 12(*b*) summarizes predicted detection results when all of the measurements (M1×1 to M12×12) illustrated in FIG. 12(*a*) are executed assuming that the switching operation of the multiplexer 210 is normal.

If a value different from the value illustrated in FIG. 12(*b*) is detected in any measurement of M1×1 to M12×12, it indicates that an abnormality is present in the changeover switch corresponding to this different value within the multiplexer 210.

If the value different from the predicted detection result when the multiplexer 210 is normal is detected, a fact that the abnormality is present in the multiplexer 210 is written into the diagnosis result register 243.

Also, if a plurality of measurement Nos. each having the abnormal value detected are detected, it can be resultantly determined which changeover switch has an abnormality in the multiplexer 210. Therefore, this determination result may be stored in the diagnosis result register 243. In this situation, the disconnection determination method corresponding to the circuit within the multiplexer 210 is incorporated into the disconnection determination unit 242, thereby making it possible to determine which switch has an abnormality within the multiplexer. However, since the disconnection determination method in this case is different depending on the circuit configuration within the multiplexer 210, the method will not be described.

When the operation diagnosis of the multiplexer 210 is not conducted by the disconnection determination unit 242, the results of the voltage detection by the voltage comparison unit 240 are not stored in the detection result register 241 once, but may be stored directly in the diagnosis result register 243. In the storage of the results in the diagnosis result register 243, all of the detection results may be stored therein, or the results may be stored therein only when the abnormality occurs.

This is because in the diagnosis of the multiplexer 210 described above, the disconnection determination unit 242 may determine whether the abnormality is present, or not, for each of the results of the respective measurements in the respective measurement Nos. M1×1 to M12×12 illustrated in FIG. 12, may conduct the determination together in a state where 12 measurement results for each row illustrated in FIG. 12 (*b*) are stored in the detection result register 241, or the disconnection determination unit 242 may not conduct the determination in a state where the 12 measurement results are stored in the detection result register 241, but may read data in the detection result register 241 into the high-level controller in a lump, and a diagnosis unit provided in the high-level controller may conduct the diagnosis. Furthermore, this is because all of the measurement results of the M1×1 to M12×12 may be stored in the diagnosis result register 243 together once, and read in the high-level controller likewise, and the high-level controller may conduct the diagnosis.

Similarly, when the multiplexer input short-circuiting switches break down, the detected value is different from the predicted detection results in FIG. 12(*b*). However, it cannot be determined whether the multiplexer input short-circuiting switches 224 or the multiplexer 210 breaks down. Therefore, in the MPX diagnosis, the abnormality detection of the multiplexer 210 includes the multiplexer input short-circuiting switches.

In the above description of the MPX diagnosis, there is described the method of selecting the two continuous inputs of the input terminals 1 to 13 (Min1 to Min13) of the multiplexer 210 to conduct the diagnosis. The multiplexer 210 has the input terminals 14 to 17 (Min14 to Min17) connected with the output of the block voltage input unit 225 and the GND potential. The diagnosis of those input terminals 14 to 17 can be also conducted in the above MPX diagnosis, but the details will be omitted. The combination of the input terminal 13 with the input terminal 14 is not selected. The input terminals 1 to 13 are intended for measurement of the inter-terminal voltage of the unit cells, and the input terminals 14 to 17 are intended for measurement of the output voltage of the block voltage input unit 225.

Since the MPX diagnosis described above short-circuits the input of the multiplexer 210, the MPX diagnosis may be affected by the transient characteristic of the RC filter configured by Rmpx, Rcv, Cin, and the like disposed on an input side.

However, the input resistor Rmpx of the multiplexer 210 illustrated in FIG. 5 is set to the same degree as that of the cell input resistance Rcv, and set to be sufficiently larger than an on-resistance of the multiplexer input short-circuiting switches 224. Therefore, even when the multiplexer input short-circuiting switches 224 are turned on, a reduction of the positive electrode side potential of the cell input capacitor (Cin) 203 can be sufficiently reduced more than the inter-terminal voltage for one unit cell. Also, the above respective voltage measurements conducted by operating the multiplexer input short-circuiting switches 224 and the multiplexer 210 can be conducted in a sufficiently shorter time than a reduction time of the potential of this Cin. With the use of this phenomenon, the multiplexer input short-circuiting switches 224 are turned on/off whereby the voltage for one unit cell or 0V can be switched, and applied to the input of the multiplexer 210 through the multiplexer 210.

The number of measurements illustrated in FIG. 12 (*a*) is as large as 12×12=144 in total, and as illustrated in FIG. 12 (*b*), the operation diagnosis of the multiplexer is conducted on the basis of the contents of the register in which the inter-terminal voltage measurement results of 12 unit cells are stored every time the respective multiplexer input short-circuiting switches are switched. Therefore, it takes time to complete all of the measurements and diagnoses. Therefore, it is preferable that this diagnosis is conducted not during the operation of the vehicle, but in a state where the vehicle stops, that is, at the time of starting the system, or during the shutdown operation. If the inverter 700 does not operate, no noise is generated. Therefore, it is also advantageous in that the multiplexer operates at a high speed, and high-speed and accurate diagnosis can be conducted with the use of the characteristics of the high-speed AD converter.

Also, it is easy to add a circuit that applies a voltage from a power supply other than the voltage of the unit cells to the multiplexer input. If a normal voltage can be input to the multiplexer even by any method, the diagnosis of the multiplexer described in this example can be executed. For example, for the diagnosis of the multiplexer 210, it is naturally possible to connect another battery system without any disconnection of the voltage detection line to conduct the diagnosis, but its description will be omitted.

If the disconnection of the voltage detection line is detected at the time of starting the vehicle, since the voltage for one normal unit cell is not input, an abnormality is found in the diagnosis of the multiplexer. When an abnormal inter-terminal voltage is measured, since it indicates that a failure occurs anywhere in a path where the voltage is detected, the abnormality or failure is resultantly detected, and this information is transmitted to the high-level controller.

(Disconnection Diagnosis by Cell Voltage Measurement)

Subsequently, a method of diagnosing the disconnection will be described. As the method of diagnosing the disconnection, there are a method using the measured cell voltage value, and a method of detecting the balancing current. In the disconnection diagnosis using the measured cell voltage value, there are a method using the balancing switches (BS) 222, and a method using the multiplexer input short-circuiting switches (MS) 224. In the method of detecting the balancing current, the balancing switches (BS) 222 are used. First, a method of conducting the disconnection diagnosis by detection of the cell voltage using the BS 222 will be described.

In the case where the balancing switches 222 are on/off controlled to conduct the disconnection diagnosis, as will be described below, when the inter-terminal voltage of one unit cell 101 is measured, on/off states of not only the balancing switch disposed in the one unit cell to be subjected to the voltage measurement, but also the balancing switches vertically adjacent to the one unit cell to be subjected to the inter-terminal voltage measurement affect the voltage measurement.

Therefore, as illustrated in FIGS. 1 to 4, when a plurality of cell groups and a plurality of cell controller ICs 300 for controlling those cell groups are connected in series, in the two cell groups connected directly to each other, in the measurement of the inter-terminal voltages of the respective unit cells in the two unit cells connected directly to each other, but belonging to different cell groups, on/off states of the respective balancing switches of those two unit cells affect the measurement of the respective inter-terminal voltages.

For example, as illustrated in FIG. 3 or 4, when the two cell groups each disposed above and below the service disconnect switch (SD-SW) 105 are connected in series, the on/off states of the respective balancing switches installed in two unit cells connected directly to each other between the respective two cell groups connected in series mutually affect the voltage measurement of those two unit cells. For example, the lowest-level unit cell of the cell group 102d and the highest-level unit cell of the cell group 102c are connected directly to each other, and the on/off states of the respective balancing switches installed in those unit cells mutually affect the respective voltage measurements.

Therefore, when a plurality of cell groups are connected in series, the on/off states of the respective balancing switches of the unit cells of the adjacent cell groups also need to be taken into account. In the description of the measurement of the inter-terminal voltages of the respective unit cells described below, a case in which one cell group and one cell controller IC that controls this cell group are provided will be first described for simplification. That is, an example in which only one cell group is each disposed above and below the SD-SW 105 in FIGS. 3 and 4 will be described. When the plurality of cell groups are connected in series, the following description can be simply expanded. Therefore, a case in which the plurality of cell groups are connected in series will be described in brief in the last of the present specification.

(Disconnection Diagnosis by Cell Voltage Measurement when Balancing Switches are Turned On/Off)

FIGS. 13 to 16 illustrate what cell voltage is detected if the balancing switches are turned on/off when the voltage detection line is disconnected. In this example, for further facilitation of description, a cell group in which three unit cells, that is, the cell 1 to cell 3 are connected in series is exemplified.

The voltage detection lines SL1 to SL14 mean respective lines extending from the positive and negative electrodes of the respective unit cells to the input terminals Min of the multiplexer through the detection voltage input terminals CV of each cell controller IC. The longest line interval of the voltage detection lines is a line between the positive and negative electrodes of the respective unit cells and the cell controller 200, and the lines in this interval are bundled for each cell group, or each battery module, and also called "harness". The voltage detection lines from the battery module are connected to the cell controller 200 by connectors (not shown). Most of the disconnections of the voltage detection lines occur between the connection portions of the positive and negative electrodes of the respective unit cells and the connector portions of the cell controller 200. Also, in the following description, it is assumed that the disconnections occur to input into the cell controller, and a method of detecting the disconnection of the voltage detection lines in this portion will be described. Also, it is assumed that the voltage detection system downstream of the multiplexer 210 operates normally.

(Case in which the Voltage Detection Line SL1 is Disconnected)

Figure 13:
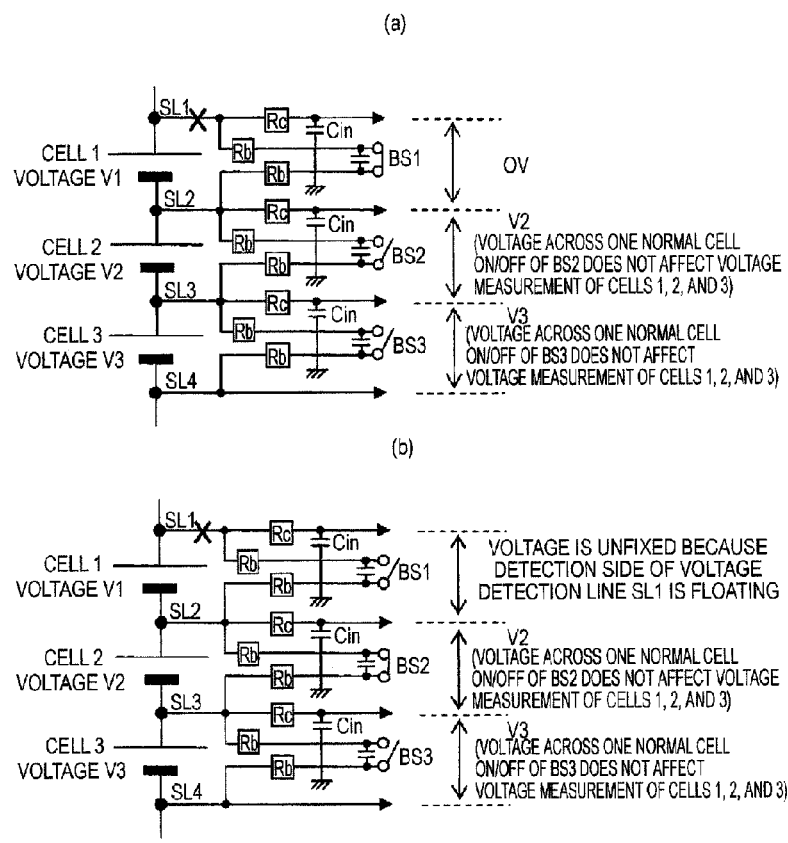
FIG. 13 is an illustrative view of a method for detecting the disconnection of a highest-level voltage detection line according to a detected cell voltage value with the use of the battery system monitoring apparatus according to the present invention. (a) and (b) illustrate detected voltages in switch states different from each other.

FIG. 13 illustrates the detected voltages of the cells 1 to 3 when balancing switches BS1 to BS3 of the cells 1 to 3 are turned on/off in the case where the highest-level (highest potential) voltage detection line, that is, the voltage detection line SL1 connected to the positive electrode side of the cell 1 is disconnected.

The inter-terminal voltage V1 of the cell 1, that is, a voltage between the voltage detection lines SL1 and SL2 becomes 0V when the balancing switch BS1 is on (FIG. 13(a)). Electric charge in a cell input capacitor Cin of the cell 1 is discharged to the same degree as that of the cell input capacitor of the cell 2. The charge/discharge of the electric charge corresponding to the applied voltage of the cell input capacitor Cin becomes apparent, and therefore will be omitted in the following description.

Also, when the balancing switch BS1 is off, because the voltage detection line SL becomes floating, a voltage becomes unstable. The on/off operation of the balancing switches BS2 and BS3 does not affect the voltage measurement of the cell 1 (FIGS. 13(a) and 13(b)).

(Case in which the Voltage Detection Line SL2 is Disconnected)

Figure 14:
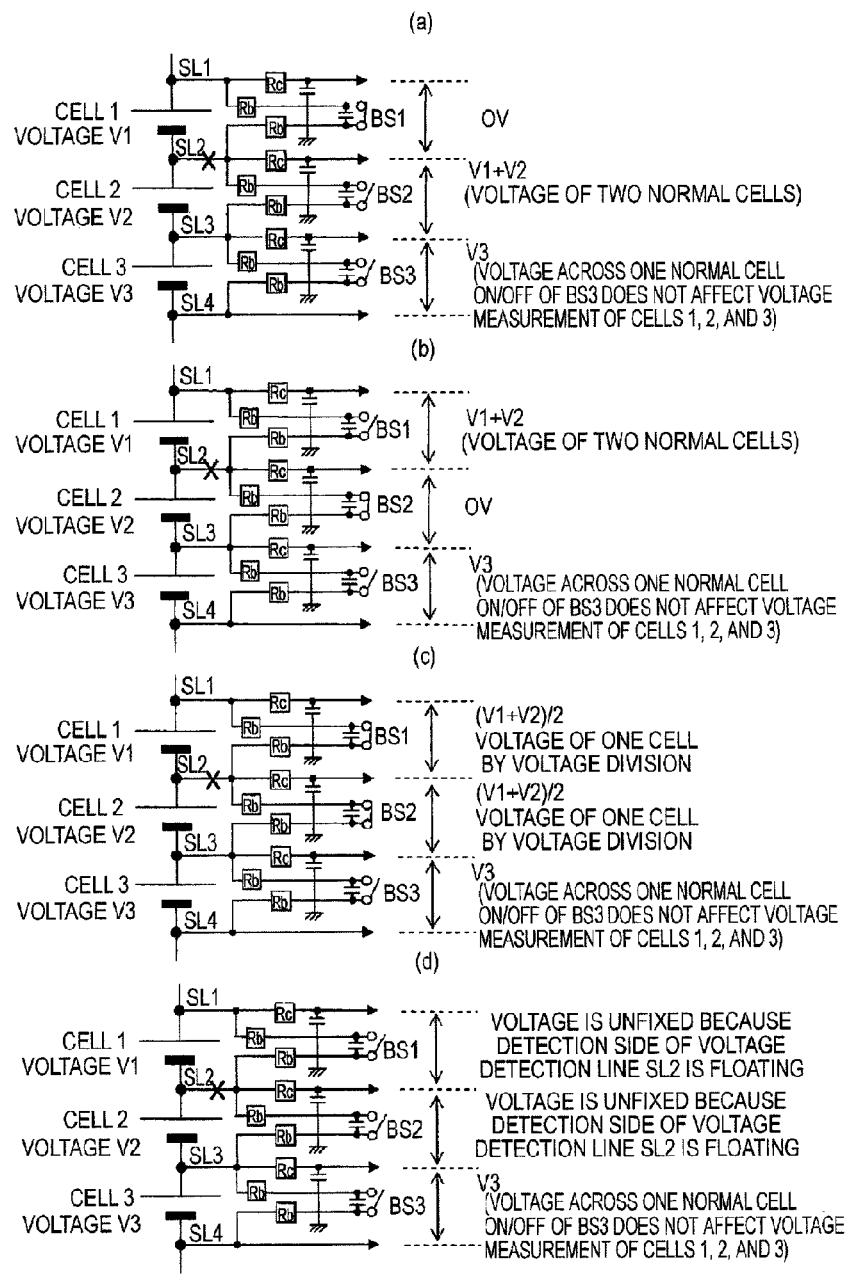
FIG. 14 is an illustrative view of a method for detecting the disconnection of a voltage detection line subsequent to the highest-level voltage detection line according to the detected cell voltage value with the use of the battery system monitoring apparatus according to the present invention. (a) to (d) illustrate detected voltages in the switch states different from each other.

FIG. 14 illustrates the detected voltages of the cells 1 to 3 when the balancing switches BS1 to BS3 of the cells 1 to 3 are turned on/off in the case where the voltage detection line SL2 connected to the negative electrode side of the cell 1, that is, the positive electrode side of the cell 2 is disconnected.

When any one of the balancing switches BS1 and BS2 is on, and the other is off, the detected voltage (cell voltage) across the unit cell whose balancing switch BS is on becomes 0V, and the detected voltage across the unit cell whose balancing switch BS is off becomes a sum of the voltage V1 of the cell 1 and the voltage V2 of the cell 2 (FIGS. 14(a) and 14(b)). The on/off operation of the BS3 does not affect the voltage measurement of the cell 1 and the cell 2. Also, the detected voltage of the cell 3 becomes an inter-terminal voltage V3 of the cell 3 regardless of the states of the BS1 and BS2.

When both of the BS1 and the BS2 are on, as the detected voltages of the cell 1 and the cell 2, a voltage divided by a resistor Rb (balancing resistor) connected between the voltage detection lines SL1 and SL2 is detected. In this example, since all of the Rb assume the same resistance value, both of the detected voltages across the cell 1 and the cell 2 become (V1+V2)/2 (FIG. 14(c)).

Since V1 to V3 are normally voltages of substantially the same degree, the normal voltage for one unit cell is detected as the detected voltages of the cell 1 and the cell 2.

When both of the BS1 and the BS2 are off, because the voltage detection line SL2 becomes in a floating state, both of the detected voltages across the cell 1 and the cell 2 become unstable (FIG. 14(d)).

(Case in which the Voltage Detection Line SL3 is Disconnected)

Figure 15:
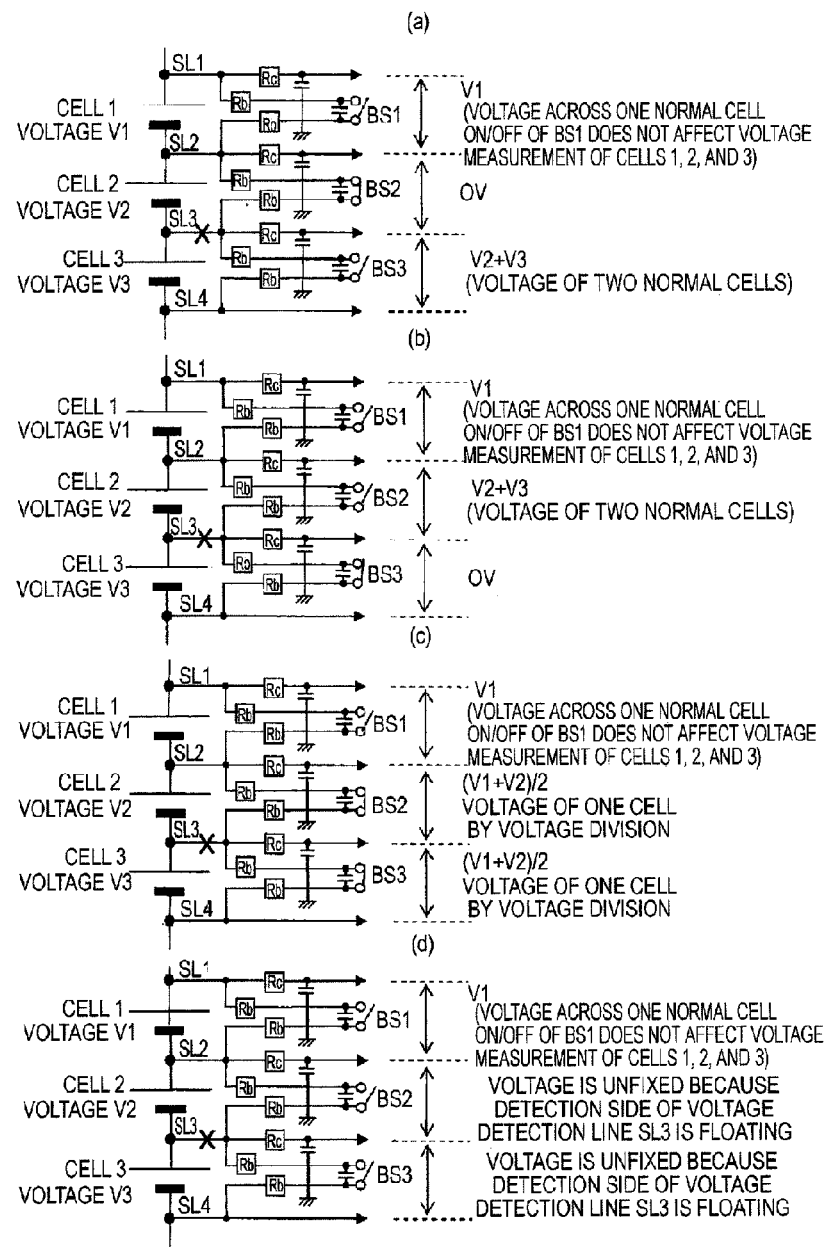
FIG. 15 is an illustrative view of a method for detecting the disconnection of a voltage detection line previous to a lowest-level voltage detection line according to the detected cell voltage value with the use of the battery system monitoring apparatus according to the present invention. (a) to (d) illustrate detected voltages in the switch states different from each other.

FIG. 15 illustrates the detected voltages of the cell 1 to cell 3 when the balancing switches BS1 to BS3 of the cell 1 to cell 3 are turned on/off in the case where the voltage detection line SL3 connected to the negative electrode side of the cell 2, that is, the positive electrode side of the cell 3 is disconnected.

When any one of the balancing switches BS2 and BS3 is on, and the other is off, the detected voltage across the unit cell whose balancing switch BS is on becomes 0V, and the detected voltage across the unit cell whose balancing switch BS is off becomes a sum of the voltage V2 of the cell 2 and the voltage V3 of the cell 3 (FIGS. 15(a) and 15 (b)). The on/off operation of the balancing switch BS1 does not affect the voltage measurement of the cells 2 and 3. Also, the detected voltage of the cell 1 becomes the inter-terminal voltage V1 of the cell 1 regardless of the states of the BS2 and BS3.

When both of the BS2 and the BS3 are on, as the detected voltages of the cells 2 and 3, a voltage divided by the resistor Rb (balancing resistor) connected between the voltage detection lines SL1 and SL2 is detected. In this example, since all of the Rb assume the same resistance value, both of the detected voltages across the cells 2 and 3 become (V1+V2)/2 (FIG. 15(c)).

Since V1 to V3 are normally voltages of substantially the same degree, the normal voltage for one unit cell is detected as the detected voltages of the cells 2 and 3.

When both of the BS2 and the BS3 are off, because the voltage detection line SL3 becomes in the floating state, both of the detected voltages across the cells 2 and 3 become unstable (FIG. 15(d)).

(Case in which the Voltage Detection Line SL4 is Disconnected)

Figure 16:
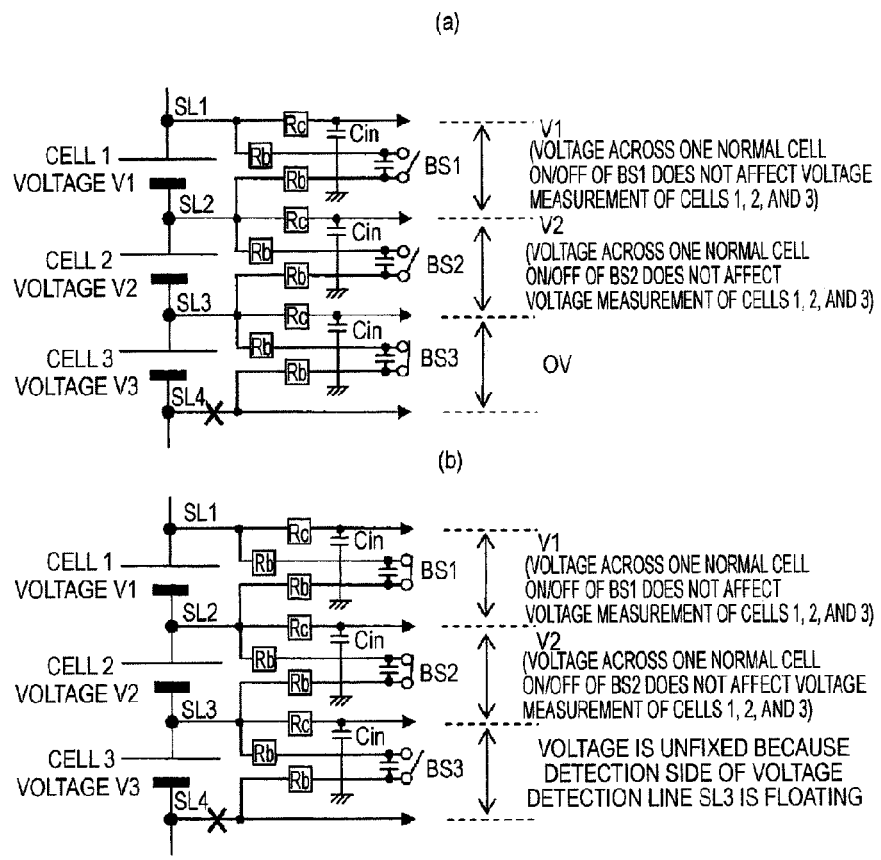
FIG. 16 is an illustrative view of a method for detecting the disconnection of the lowest-level voltage detection line according to the detected cell voltage value with the use of the battery system monitoring apparatus according to the present invention. (a) and (b) illustrate detected voltages in the switch states different from each other.
Figure 25:
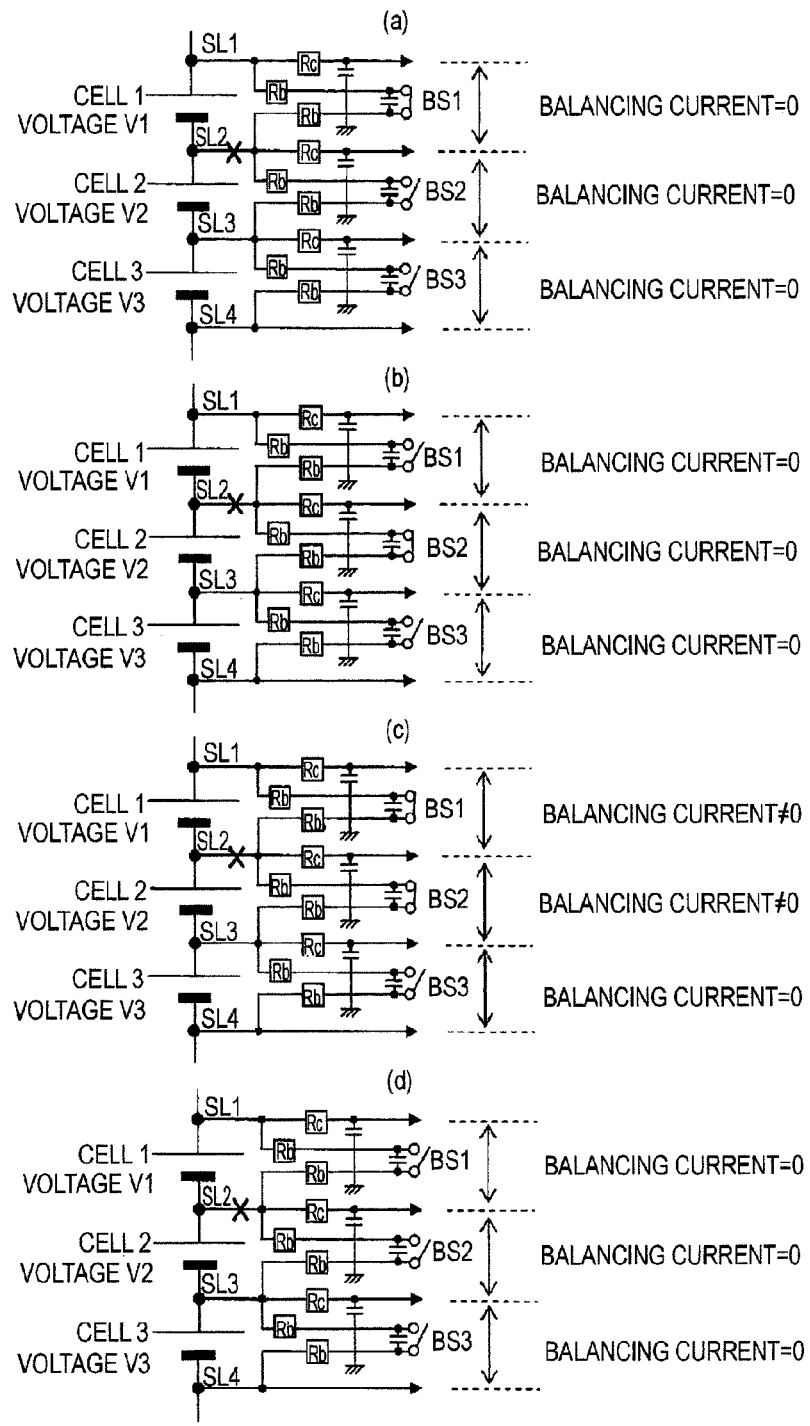
FIG. 25 is an illustrative view illustrating a method for detecting the disconnection of the voltage detection line subsequent to the highest-level voltage detection line according to presence or absence of the balancing current detection with the use of the battery system monitoring apparatus according to the present invention. (a) to (d) illustrate the presence or absence of the balancing current detection in the respective different switching states.
Figure 26:
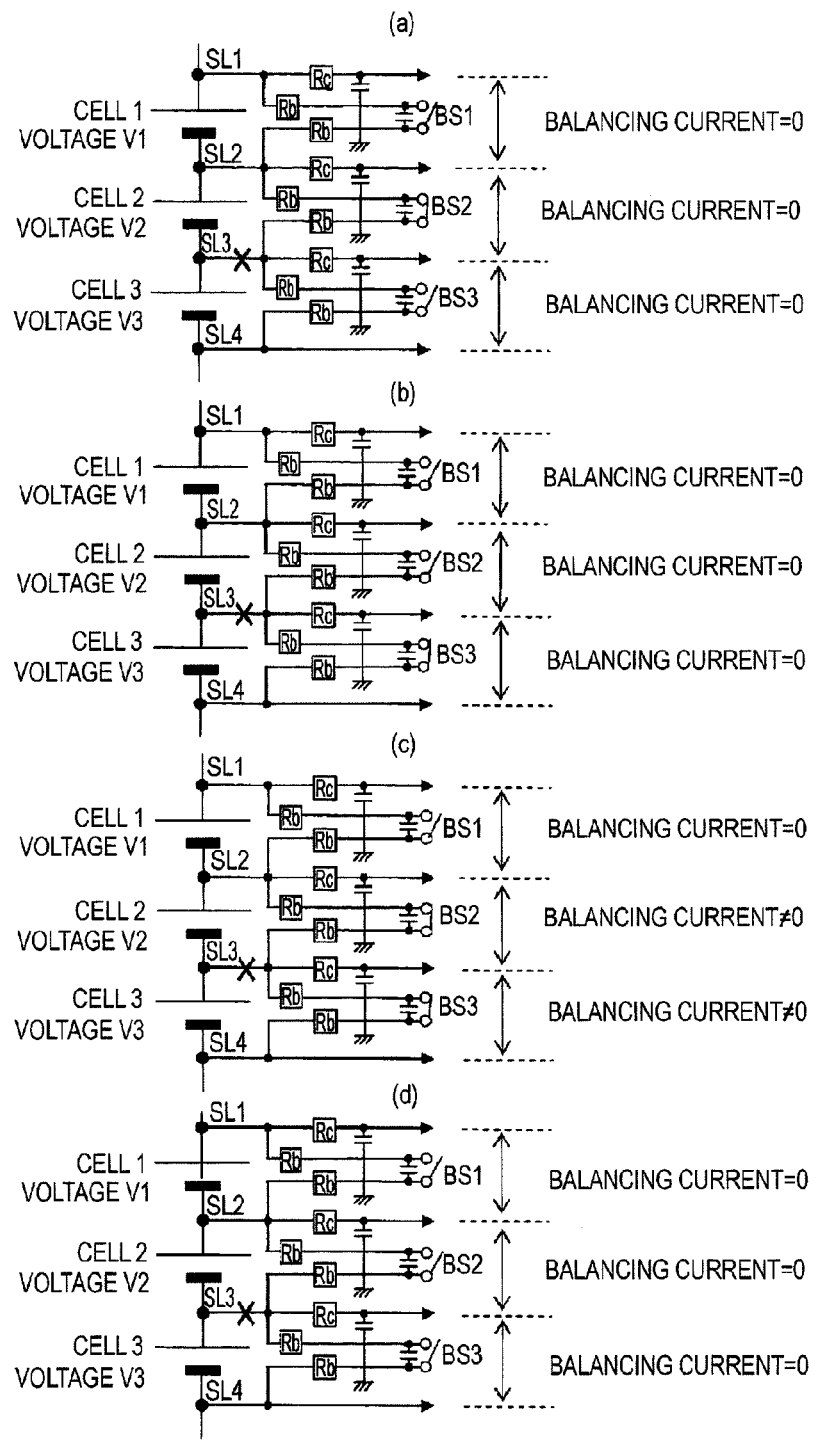
FIG. 26 is an illustrative view illustrating a method for detecting the disconnection of the voltage detection line previous to the lowest-level voltage detection line according to presence or absence of the balancing current detection with the use of the battery system monitoring apparatus according to the present invention. (a) to (d) illustrate the presence or absence of the balancing current detection in the respective different switching states.

FIG. 16 illustrates the detected voltages of the cell 1 to cell 3 when balancing switches BS1 to BS3 of the cell 1 to cell 3 are turned on/off in the case where the lowest-level (lowest potential) voltage detection line, that is, the voltage detection line SL4 connected to the negative electrode side of the cell 3 is disconnected.

The inter-terminal voltage V3 of the cell 3, that is, a voltage between the voltage detection lines SL3 and SL4 becomes 0V when the balancing switch BS3 is on (FIG. 16(a)). When the BS3 is off, because the voltage detection line SL4 becomes floating, the voltage becomes unstable 1 (FIG. 16(b)). The on/off operation of the balancing switches BS1 and BS2 does not affect the voltage measurement of the cell 3.

In the above description, a relationship between the detected values of the respective cell voltages illustrated in FIGS. 13 to 16, and the disconnection of the voltage detection lines as well as the on/off state of the balancing switch can be expanded to a case of the cell group in which m (m≥4) unit cells are connected in series. In this case, a relationship between the detected voltages (cell voltages) of the unit cells of the cell 2 to a cell m−1, and the balancing switches as well as the disconnection status of the voltage detection lines has the similar relationship. In the following description, n means a case of 2≤n≤m−1.

(Relationship Between the Detected Voltages, and the Disconnection State of the Voltage Detection Lines as Well as the On/Off State of the Balancing Switches)

It is found that the relationship between the on/off state of the two adjacent balancing switches, and the detected voltages is based on the following rules, from the disconnection state of the voltage detection lines, the on/off state of the balancing switches, and the detected values of the respective cell voltages illustrated in FIGS. 13 to 16. In this example, in FIGS. 13 to 16, a balancing switch illustrated on an upper side of a certain balancing switch is called "upper balancing switch", and a balancing switch illustrated on a lower side of a certain balancing switch is called "lower balancing switch". Therefore, for example, the two adjacent balancing switches BSn−1 and BSn are connected between the voltage detection lines SLn−1 and SLn, and between the voltage detection lines SLn and SLn+1, respectively.

(Condition) The voltage detection line SLn between the balancing switches BSn−1 and BSn is disconnected.

(Rule 1) When the balancing switch BSn−1 is on, and BSn is off, the detected voltage across the cell n−1 is 0V, and the detected voltage across the cell n is a voltage for two unit cells.

(Rule 2) When the balancing switch BSn−1 is off, and BSn is on, the detected voltage across the cell n−1 is a voltage for two unit cells, and the detected voltage across the cell n is 0V.

(Rule 3) When both of the balancing switches BSn−1 and BSn are on, both of the detected voltage across the cell n−1 and the voltage across the cell n are a voltage for one unit cell.

(Rule 4) When both of the balancing switches BSn−1 and BSn are off, both of the detected voltage across the cell n−1 and the voltage across the cell n are unstable.

When no disconnection is present at all, a normal state is obtained, and the detected voltages across the respective unit cells become the respective inter-terminal voltages, that is, a voltage for one unit cell, regardless of the on/off operation of the balancing switch.

Also, when the voltage detection line SLn−1 is not disconnected, and SLn−2 is disconnected, if the same voltage detection as that of the above rule 1 is conducted, a voltage different between the on/off states of the balancing switch BSn−2 is detected as the detected voltage across the cell n−1. This is because, as will be described below with reference to FIG. 18, there are a case in which the balancing switch is turned on, and a case in which the balancing switch is turned off, in the balancing operation. In the disconnection detecting method which will be described later, since the above cases need to be also taken into account, auxiliary rules will be described blow.

(Auxiliary rule 1) When the voltage detection line SLn−2 is disconnected, the balancing switch BSn−1 is on, and the balancing switch BSn is off, if the balancing switch BSn−2 is off, the detected voltage across the cell n−1 becomes 0V, and if the balancing switch BSn−2 is on, the detected voltage across the cell n−1 becomes the voltage for one unit cell.

Likewise, when the voltage detection line SLn−1 is not disconnected, but the voltage detection line SLn is disconnected, if the same voltage detection as that of the above rule 2 is conducted, a voltage different between the on/off states of the balancing switch BSn+1 is detected as the detected voltage across the cell n.

(Auxiliary rule 2) When the voltage detection line SLn is disconnected, the balancing switch BSn−1 is off, and the balancing switch BSn is on, if the balancing switch BSn+1 is off, the detected voltage across the cell n becomes 0V, and if the balancing switch BSn+1 is on, the detected voltage across the cell n becomes the voltage for one unit cell.

The reason that the voltage for one unit cell is detected under those auxiliary rules 1 and 2 is because the voltage is divided by the resistors (refer to FIGS. 14(c) and 15(c)).

It is found from the above description that when the inter-terminal voltages (cell voltages) of all the unit cells are measured while turning on/off the two adjacent balancing switches in synchronization under the rule 1 or the rule 2, since an abnormal voltage (0V or voltage for two unit cells) different from the voltage for one unit cell which is the normal detected voltage is detected, it can be determined which voltage detection line is disconnected.

When the balancing switch breaks down, and both of the balancing switches BSn−1 and BSn become off, because the state becomes equivalent to that of the above rule 4, the detected voltage becomes unstable, resulting in a possibility that normal voltages are detected as the detected voltages across the cell n−1 and the cell n by chance.

Even in this case, since a probability that both of the two balancing switches break down is low, a case in which only one balancing switch breaks down is considered. For example, if the measurement is conducted twice according to the rule 1 or the rule 2, the abnormal voltage measurement result is always obtained in any measurement. As a result, a possibility of the disconnection of the voltage detection line and the failure of the balancing switch can be determined. However, when the abnormal voltage measurement results are obtained, it is desirable that, for example, the disconnection detection using the multiplexer input short-circuiting switches which will be described later, and the disconnection diagnosis of the balancing circuits are conducted to make a comprehensive determination, so that it is determined whether the disconnection of the voltage detection line or the failure of the balancing switch occurs.

Likewise, the balancing switch breaks down, and both of the balancing switches BSn-1 and BSn become off, resulting in a possibility that the detected voltages across the cell n-1 and the cell n become abnormal voltages by chance.

In this case, if the normal (conceivable) voltage is not detected by the voltage detection according to the above rule 3, it can be determined that the possibility that the balancing switch breaks down is high.

However, when the abnormal voltage is detected, for example, the disconnection detection using the multiplexer input short-circuiting switches which will be described later, and the disconnection diagnosis of the balancing circuits are conducted with the result that it can be determined whether the disconnection of the voltage detection line or the failure of the balancing switch occurs. Therefore, the disconnection detection of the voltage detection lines can be more surely conducted by executing a plurality of different disconnection diagnoses.

(Voltage Detection when the Highest-Level Voltage Detection Line is Disconnected)

Since the highest-level voltage detection line SL1 is not sandwiched between the two adjacent balancing switches, the above rules cannot be applied.

However, in this case, when only the balancing switch BS1 is turned on as illustrated in FIG. 13(*a*), if the abnormal voltage 0V is detected, it can be determined that the voltage detection line SL1 is disconnected.

Also, in this case, for example, if a virtual state illustrated in FIG. 17(*a*) is considered, the above rule (2) can be applied.

However, there is a possibility that the balancing switch BS1 breaks down, and is turned off, and the voltage detection line SL1 becomes in the floating state, so that the abnormal voltage value (0V or voltage for two unit cells) is detected by chance. In this case, it is determined that the voltage detection line SL1 is disconnected. In determination of whether the balancing switch breaks down, or not, as in the above case, the disconnection detection using the multiplexer input short-circuiting switches which will be described later, and the disconnection diagnosis of the balancing circuits are conducted to make a comprehensive determination, so that it can be surely determined whether the disconnection of the voltage detection line or the failure of the balancing switch occurs.

Also, there is a possibility that the balancing switch BS1 breaks down, and is turned off, and the voltage detection line SL1 becomes in the floating state, so that the normal voltage value is detected by chance. In this case, since the detected voltage is normal, it cannot be determined whether the voltage detection line is disconnected, or not. However, as in the above case, the disconnection detection using the multiplexer input short-circuiting switches which will be described later, and the disconnection diagnosis of the balancing circuits are conducted to make a comprehensive determination, so that it can be surely determined whether the disconnection of the voltage detection line or the failure of the balancing switch occurs.

(Voltage Detection when the Lowest-Level Voltage Detection Line is Disconnected)

Since the lowest-level voltage detection line SLm+1 is not sandwiched between the two adjacent balancing switches either, the above rules cannot be applied.

However, in this case, when only the balancing switch BS3 is turned on as illustrated in FIG. 16(*a*), if the abnormal voltage 0V is detected, it can be determined that the voltage detection line SL1 is disconnected.

Also, in this case, for example, if a virtual state illustrated in FIG. 17(*a*) is considered, the above rule (1) can be applied.

As in the case where the highest-level voltage detection line is disconnected, if the balancing switch BS4 breaks down, and is turned off, and the abnormal voltage value is detected by chance, it is determined that the voltage detection line is disconnected. In the possibility that the balancing switch breaks down, the disconnection detection using the multiplexer input short-circuiting switches which will be described later, and the disconnection diagnosis of the balancing circuits need to be conducted to make a comprehensive determination.

In the disconnection diagnosis by the cell voltage measurement when the balancing switch is turned on/off which has been described above, the abnormal voltage is set to 0V or the voltage for two unit cells. However, if the voltage detection line becomes in the floating state due to the disconnection of the voltage detection line and the failure of the balancing switch, there is a possibility that a voltage value other than 0V or the voltage for two unit cells is detected.

Whether the detected voltage value is abnormal, or not, is determined by appropriately setting a threshold value in the logic unit 213. Since the inter-terminal voltage of the unit cells is changed according to the charge state of the respective unit cells, it is conceivable that the disconnection or failure is not accurately determined depending on the detected voltage value. In this case, as described above, it is desirable that the results by the plurality of diagnosis methods are put together to determine the disconnection or failure.

Figure 18:
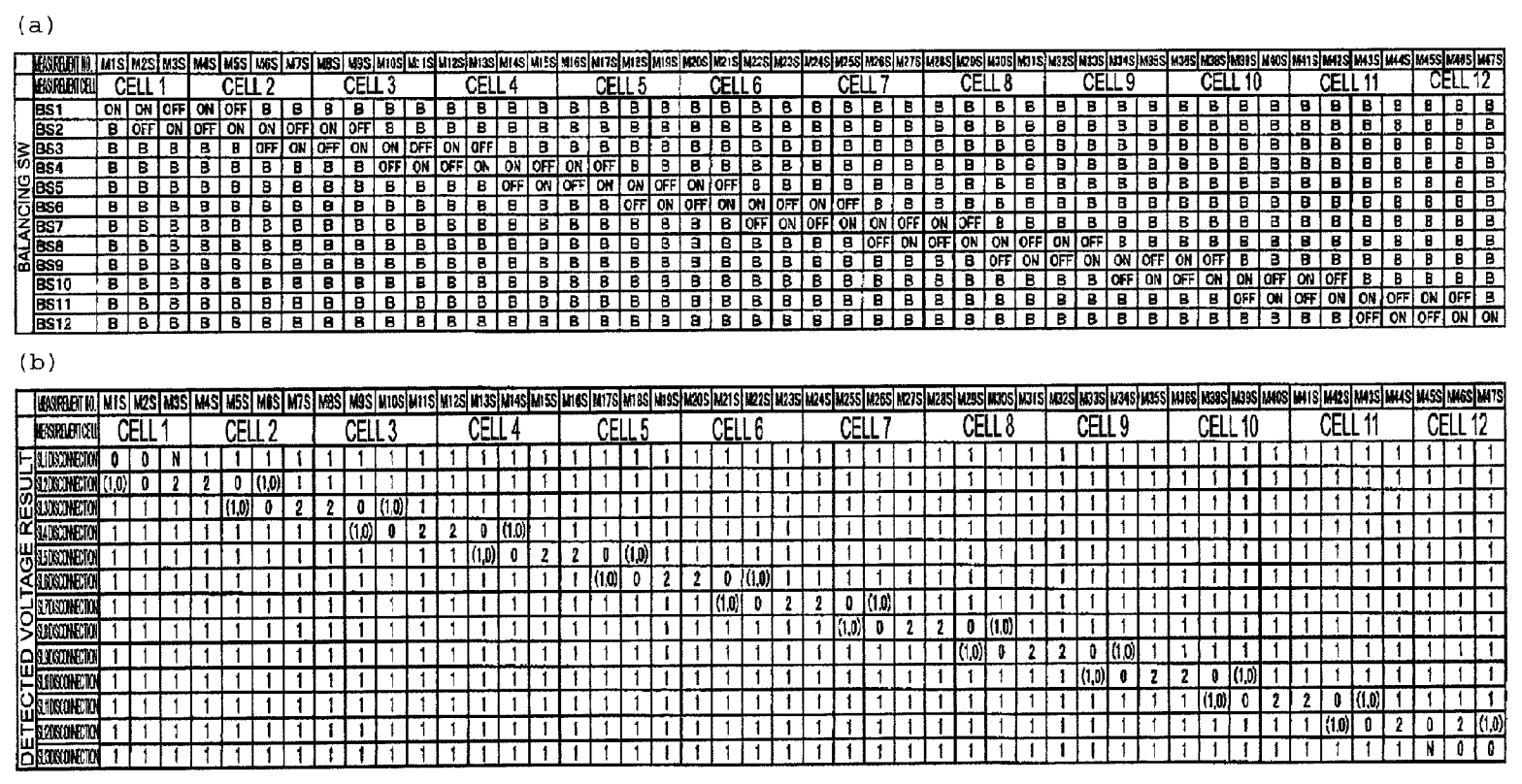

In FIG. 18, only cases in which the abnormal voltage (0V or voltage for two unit cells) is measured by combination of the disconnection state of the voltage detection line with the on/off states of the balancing switch, which are described with reference to FIGS. 13 to 17, are extracted and put together. FIG. 18(*a*) illustrates the combination of the on/off states of the balancing switches which can detect the abnormal voltage when there is a possibility that the abnormal voltage is detected by the respective unit cells, that is, when a disconnection is present in any one of two voltage detection lines that sandwich each unit cell and each balancing switch therebetween.

Fields in which symbol "B" is written indicate a state in which each balancing switch conducts the balancing discharge. This is because the balancing discharge of the respective unit cells is intended to be conducted as much as possible if the disconnection detection is not affected.

Alternatively, since a case in which the voltage of the normal voltage (voltage for one unit cell) is detected regardless of the disconnection as in FIGS. 14(*c*) and 15(*c*), and the voltage is apparently normal is also irrelevant to the voltage measurement, the balancing discharge is conducted. In this case, the balancing discharge is conducted by two unit cells. If this state is continued for a long time, because the residual capacity of each unit cell is not normally adjusted, there is a possibility that a real residual capacity is unbalanced. However, the disconnection detection described below is appropriately executed to detect the disconnection of the voltage detection line, so that the electric storage device 100 is not put into an operating state while keeping the disconnection state for a long time.

A case in which the disconnection diagnosis by the cell voltage measurement when the balancing switch is turned on/off as described above is applied to the cell group having 12 unit cells illustrated in FIG. 5 will be described.

FIG. 18(b) illustrates detected voltage values in the on/off state of the balancing switch illustrated in FIG. 18 (a) when any one of the voltage detection lines SL1 to SL13 is disconnected. Reference numeral 0 indicates that the 0V is detected by the voltage comparison unit 240, and 2 indicates that the voltage for two unit cells is detected.

Also, fields in which symbol "1" is written represent that the normal voltages (voltage for one unit cell) is detected. N represents a case in which the voltage detection line becomes in the floating state, and the detected voltage also becomes unstable (refer to FIGS. 13(b) and 16 (d)). Therefore, the voltage measurement having a possibility of N is not conducted.

The above description of FIGS. 13 to 18 show what voltage is detected when the disconnection state of a certain voltage detection line is assumed.

With the use of the relationship between the detected values of the inter-terminal voltages of the unit cells when the voltage detection line is disconnected, and the on/off states of the balancing switch as described above, all of the voltage detection lines are scanned to detect the voltages across the adjacent voltage detection lines while turning on/off the adjacent balancing switches in synchronization, thereby being capable of determining which voltage detection line is disconnected.

(Disconnection Detection Method A: Disconnection Detection Using the On/Off Operation of Two Continuous Balancing Switches)

FIG. 19 illustrates the disconnection detection using the above (rule 1) and (rule 2). That is, this disconnection detection employs a technique in which in the case where a certain voltage detection line is disconnected, when one of the two adjacent balancing switches that sandwich this voltage detection line therebetween is turned on, and the other switch is turned off, 0V is detected between the two voltage detection lines connected with the on-state balancing switch, that is, between the adjacent two voltage detection lines that sandwich the on-state balancing switch therebetween.

FIG. 19(a) illustrates the unit cells whose inter-terminal voltages are measured, and a state of the balancing switch in this measurement in the measurement Nos. M1A to M13A. Also, FIG. 19(b) illustrates the detection results of the inter-terminal voltages (cell voltages) of the respective unit cells, and which voltage detection line is determined as disconnection by the disconnection determination unit 242 on the basis of the detection results, in the measurement Nos. M1A to M14A. Reference numeral "0" indicates that the 0V is detected, and "1" indicates that the normal voltage (the voltage for one unit cell) is measured. As described above, the detection of 0V is conducted by providing a threshold value in the determination by the voltage comparison unit 240 of the logic unit 213.

When the voltage detection line SL1 is disconnected, if only the balancing switch BS1 is turned on (measurement No. M1A), the detected voltage across the cell 1 becomes "0".

Also, the disconnection of the voltage detection line SL1 does not affect the voltage measurement in measurement Nos. M2A to M14A (refer to FIGS. 13 (a) and 13(b)). Therefore, the normal voltage value (for one unit cell) is detected in the measurement Nos. M2A to M14A of FIG. 19(b).

When the voltage detection line SL2 is disconnected, as described in the above auxiliary rule 2, if the balancing switch BS2 is turned off during the balancing discharge operation (refer to FIG. 14(a)), the detected voltage becomes "0". If the balancing switch BS2 is turned on (refer to FIG. 14(c)), the detected voltage becomes "1". Therefore, there is a possibility that it cannot be determined whether the voltage detection line SL1 is disconnected, or not. In this case, the disconnection state is determined referring to the result of the subsequent measurement No. M2A.

Therefore, the determination of the disconnection of the voltage detection line SL1 is conducted with the use of the detection results in the two measurement Nos. M1A and M2A surrounded by a thick box on a row of "SL1 disconnection" in FIG. 19(b). This disconnection determination is executed by the disconnection determination unit 242. Also, if it is determined that the voltage detection line SL1 is disconnected, a value of a disconnection flag FL1 indicating that the voltage detection line SL1 is disconnected is written as 1 into the diagnosis result register 243.

In measurement No. M2A, if the voltage detection line SL2 is not disconnected, since "1" is detected (refer to FIG. 13(b)), it is determined that the voltage detection line SL1 is disconnected, according to the measurement results of measurement Nos. MLA and M2A.

Also, when the voltage detection line SL2 is disconnected, "0" is detected. However, like the above case where the voltage detection line SL1 is disconnected, as described in the above auxiliary rule 2, it cannot be determined whether the voltage detection line SL2 or SL3 is disconnected, depending on the on/off state of the balancing switch BS3. Therefore, this determination is conducted in combination with the detection result of the subsequent measurement No. M3A.

As is apparent from the above description, the reason that the BS1 is turned off, and the BS2 is turned on is because the detected voltage becomes "0" in the state of this balancing switch in both of the disconnections of the voltage detection lines SL1 and SL2, and therefore it cannot be determined whether the SL1 or SL2 is disconnected (refer to FIGS. 13(a) and 14 (a)).

Therefore, the determination of the disconnection of the voltage detection line SL2 is conducted with the use of the detection results in the two measurement Nos. M2A and M3A surrounded by a thick box on a row of "SL2 disconnection" in FIG. 19(b). If it is determined that the voltage detection line SL2 is disconnected, a value of a disconnection flag FL2 is written as 1 into the diagnosis result register as in the above case.

A case in which the voltage detection line SL13 is disconnected has a symmetrical relationship with a case in which the voltage detection line SL1 is disconnected. That is, if only the balancing switch BS12 is on (measurement No. M14A), the detected voltage across the cell 12 becomes "0".

Also, the disconnection of the voltage detection line SL13 does not affect the voltage measurements in the measurement Nos. M1A to M13A (refer to FIGS. 16(a) and 16(b)). Therefore, as illustrated in FIG. 19(b), the normal voltage value (for one unit cell) is detected in the measurement Nos. M1A to M13A.

When the voltage detection line SL12 is disconnected, as described in the above auxiliary rule 1, if the balancing switch BS11 is turned off during the balancing discharge operation (refer to FIG. 15(b)), the detected voltage becomes "0". If the balancing switch BS11 is turned on (refer to FIG. 15(c)), the detected voltage becomes "1". Therefore, there is a possibility that it cannot be determined whether the voltage detection line SL1 is disconnected, or not. In this case, the disconnection state is determined with reference to the result of the previous measurement No. M13A.

Therefore, the determination of the disconnection of the voltage detection line SL12 is conducted with the use of the detection results in the two measurement Nos. M12A and M13A surrounded by a thick box on a row of "SL12 disconnection" in FIG. 19(b). The determination of the disconnection of the voltage detection line SL13 is conducted with the use of the detection results in the two measurement Nos. M13A and M14A surrounded by a thick box on a row of "SL13 disconnection". If it is determined that the voltage detection line is disconnected, 1 is written as a value of the disconnection flag FL12 into the diagnosis result register 243.

Likewise, in the disconnection detection of the voltage detection lines SL3 to SL12, the disconnection is detected according to two continuous measurement results in the measurements of measurement Nos. M2A to M13A. For example, in the disconnection of the voltage detection line SL4, it is determined that the voltage detection line SL4 is disconnected if the detected voltage in the measurement No. M4A is "0", and the detected voltage in the measurement No. M5A is "1", and 1 is written as the value of the disconnection flag in correspondence with the respective disconnections.

However, as described above, in the detection of the disconnection of the voltage detection line SL1 and the disconnection of the voltage detection line SL13, the on/off state of the balancing switches in the cell voltage measurement for detecting those disconnections is reversed. Therefore, from the above description, the on/off states of the balancing switches in the measurement Nos. M1A, M2A, and the measurement Nos. M13A, M14A must be measured in this combination when the abnormality is to be detected by "0".

Therefore, there is a need to reverse the combination of the on/off states of the two continuous balancing switches so that the detection results of the balancing switch state of the voltage detection in the measurement No. M2A, and the balancing switch state of the voltage detection in the measurement No. M13A are suitably connected to each other, in somewhere between the measurement Nos. M2A and M13A.

In an example illustrated in FIG. 19, the combination of the on/off states of the balancing switches is reversed in the measurement No. M8A, and the voltage detection in the cell 6 and the cell 7 is conducted twice, respectively. Also, the determination of the disconnection of the voltage detection line SL7 is conducted by detecting "0" in both of the measurement Nos. M7A and M8A.

The disconnection determination in the voltage detection lines SL1 to SL11 can be conducted so that the detection results in the two continuous voltage measurements become 0-1. However, in the disconnection detection in the voltage detection lines SL12 and SL13, the disconnection must be determined in the combination of 1-0 of the detection results in the two continuous voltage measurement. Therefore, in order to perform this determination, one more measurement number of times needs to be increased.

As described in the above-mentioned MPX diagnosis, the results of the voltage detections (measurement Nos. M1A to M14A) of the cell 1 to cell 12 on rows corresponding to the disconnections of the respective voltage detection lines SL1 to SL13 in FIG. 19(b) are written into the detection result register 241 from the voltage comparison unit 240. The disconnection determination unit 242 conducts the disconnection determination on the basis of written data for one row, and determines which voltage detection line is disconnected.

When the disconnection of any voltage detection line is detected, as illustrated in FIG. 19(b), the disconnection flags (FL1 to FL13) corresponding to the voltage detection lines which are disconnected are set to, for example, 1. It is assumed that the disconnection flag corresponding to the voltage detection line not disconnected is 0. The data of the disconnection flag is stored in the diagnosis result register 243 which is disposed in the logic unit 213 (refer to FIG. 5). In FIG. 19(b), in the right disconnection flags, only the flags corresponding to the disconnected voltage detection lines are set to 1. Therefore, in this example, since it is assumed that only one voltage detection line is disconnected, all of the disconnection flags other than one disconnection flag being 1 are set to 0.

(Disconnection Detection Method B: Disconnection Detection Using On/Off States of Two Continuous Balancing Switches)

Likewise, in FIG. 20, the above (rule 1) and (rule 2) are used. That is, this disconnection detection employs a technique in which in the case where a certain voltage detection line is disconnected, when one of the two adjacent balancing switches that sandwich this voltage detection line therebetween is turned on, and the other switch is turned off, the voltage for two unit cells is detected between the two voltage detection lines connected with the off-state balancing switch, that is, between the two adjacent voltage detection lines (=inter-terminal voltage of the unit cell corresponding to the off-state balancing switch) that sandwich the off-state balancing switch therebetween.

In the disconnection detection method B, the number of voltage measurements is reduced by one as compared with the above disconnection detection method A. Also, in the disconnection detection of the voltage detection lines SL2 to SL12, the determination of whether the disconnection is conducted, or not, can be conducted, on the basis of not the continuous two measurement results, but only one measurement. This is because the measurement of the inter-terminal voltage of the unit cell corresponding to the off-state balancing switch is not affected by the on/off operation of the adjacent balancing switches, due to the on/off operation of the two continuous balancing switches (refer to FIGS. 14(b) and 15(a)).

FIG. 20(a) illustrates the unit cells whose inter-terminal voltages are measured, and states of the balancing switches in measuring the inter-terminal voltages, in measurement Nos. M1B to M13B. Also, FIG. 20(b) illustrates the measurement results of the inter-terminal voltages of the respective unit cells in the measurement Nos. M1B to M13B, and "2" represents that the voltage for two unit cells is detected. As in the disconnection detection method 1, the detection of the voltage for two unit cells is conducted by appropriately providing a threshold value in the determination in the logic unit 213.

In the measurement Nos. M1B and M13B for detecting the disconnection of the voltage detection lines SL1 and SL13, the same as the above disconnection detection method A is applied. This is because when the voltage detection line SL1 or SL13 is disconnected, if the balancing switch BS1 or BS12 is turned off, the voltage detection line SL1 or SL13 becomes floating, and the voltage is not decided (refer to FIGS. 13 (b) and 16 (b)).

As in the disconnection detection method A, even when the voltage detection line SL2 is disconnected, if the balancing switch BS2 is turned off during the balancing switch discharge operation by chance, "0" is detected in the measurement No. M1B, likewise. Therefore, there is a possibility that it cannot be determined whether the voltage detection line SL1 is disconnected, or not. In this case, the disconnection state is determined with reference to the results of the subsequent measurement No. (M2B).

In the case where the voltage detection line SL2 is disconnected, when the balancing switch BS2 is turned off, and the balancing switch BS1 is turned on, the voltage between the two adjacent voltage detection lines SL2 and SL3 sandwiching the balancing switch BS2 therebetween, that is, the detected voltage across the cell 2 becomes the voltage for two unit cells (measurement No. M2B). Therefore, it is determined that the voltage detection line SL2 is disconnected.

In this example, in the state of the balancing switch in the measurement No. M2B, if the voltage detection line SL1 is disconnected, not the voltage for two unit cells, but a normal voltage (for one unit cell) is detected (refer to FIG. 13(a)). Therefore, it is determined that the voltage detection line SL1 is disconnected, according to the measurement results of the measurement Nos. M1B and M2B.

In the measurement Nos. M2B to M12B, if the voltage detection line between the two adjacent balancing switches which become in the on- and off-states is disconnected, the inter-terminal voltage of the unit cell to be measured becomes the voltage for two unit cells, to thereby determine the disconnection. One of the two adjacent balancing switches may be on, and the other switch may be off.

The on and off of the balancing switches in the measurement Nos. M3B and M11B may be opposite to those illustrated in FIG. 20(b). In any two continuous balancing switches in the measurement Nos. M3B to M11B, in the voltage measurement of one cell (cell n), the measurement when the balancing switch BSn−1 is off, and the balancing switch BSn is on, and the measurement when the balancing switch BSn is off, and the balancing switch BSn+1 is on, are conducted (measurement Nos. M7B and M8B in an example of FIG. 20).

As in the above disconnection detection method A, in the disconnection detection method B, state data of the disconnection flags (FL1 to FL13) is stored in the diagnosis result register 243.

(Disconnection Detection Method C: Disconnection Detection Using On/Off States of Three Adjacent Balancing Switches)

In this disconnection detection method, the above (rule 1) and (rule 2) are used.

This disconnection detection employs a technique in which when three adjacent balancing switches are turned on, off, and on in synchronization, respectively, to thereby disconnect any one of the two voltage detection lines sandwiched among the respective three balancing switches, the inter-terminal voltage of the unit cell corresponding to a center balancing switch, that is, the detected voltage between the two voltage detection lines that sandwich the center balancing switch therebetween becomes 0.

FIG. 21(a) illustrates the unit cells whose inter-terminal voltages are measured, and states of the balancing switches in measuring the inter-terminal voltage, in measurement Nos. M1C to M12C. Also, FIG. 21(b) illustrates the measurement results of the inter-terminal voltages of the respective unit cells in the measurement Nos. M1C to M12C, and "0" represents that 0V is detected. As described above, the detection of "0" is conducted by providing a threshold value in the determination in the voltage comparison unit 240 of the logic unit 213.

In this disconnection detection method, the number of measurements is further reduced by one as compared with the number of measurements 13 in the above disconnection detection method B. This is because in the voltage detection illustrated in FIG. 21 (a) using the three adjacent balancing switches, any disconnection of the two voltage detection lines sandwiched among the respective three balancing switches is detected by the respective measurements.

In this disconnection detection method C, the disconnection diagnosis is conducted on the basis of the two continuous measurements. That is, if the measurement results of the inter-terminal voltages of the unit cells, which are conducted in a state illustrated in FIG. 21 (a), are "0" in both of the two adjacent unit cells, it is determined that the voltage detection line between those two unit cells is disconnected.

As illustrated in FIG. 21 (b), in the measurement No. M1C, as described in the disconnection detection method A, 0V is detected even if any one of the voltage detection lines SL1 and SL2 is disconnected (refer to FIGS. 13(a) and 14(a)). Therefore, whether the voltage detection line SL1 is disconnected, or the voltage detection line SL2 is disconnected, is determined with reference to the results of the subsequent measurement (measurement No. M2C).

Since the disconnection of the voltage detection line SL1 does not affect the voltage measurements in the measurement Nos. M2C to M12C (refer to FIGS. 13(a) and 13(b)), a normal voltage value (for one unit cell) is detected in the measurement Nos. M2C to M12C of FIG. 21(b).

If the normal voltage is measured in the measurement No. M1C, it is determined that both of the voltage detection lines SL1 and SL2 are not disconnected. Therefore, if only the disconnection of the voltage detection lines is determined, the measurement of the subsequent measurement No. M2C may be skipped, and the measurement in the measurement No. M3C may be conducted. This is because the disconnection of the voltage detection lines SL3 and SL4 is determined in the measurement of the measurement Nos. M3C and M4C.

In this case, the voltage measurement of the cell 2 is not conducted. In this example, a description will be made based on the execution of all the measurement Nos. M1C to M12C in FIG. 21(a), assuming that the inter-terminal voltages (cell voltages) of all the unit cells are also measured.

In the measurement No. M2C, when any one of the voltage detection lines SL2 and SL3 is disconnected, the detected voltage becomes "0" (refer to FIGS. 14(c), 15(a), and 21(b)).

Therefore, as described above, when the voltage detection line SL2 is disconnected, the detected voltage becomes "0" in both of the measurement Nos. M1C and M2C. That is, if both of the measurement results in the measurement Nos. M1C and M2C are "0", it is determined that the voltage detection line SL2 is disconnected (refer to FIGS. 14(a) and 14(b)).

If the normal voltage (for one unit cell) is detected in the measurement No. M2C, that is, if "1" is detected, it is determined that the voltage detection lines SL2 and SL3 are not disconnected. Therefore, when only the disconnection diagnosis is conducted, the subsequent measurement No. M3C may be skipped to conduct the measurement in the measurement No. M4C.

As described above, the respective cell voltages are measured up to the measurement No. M11C to determine the disconnection of the voltage detection lines SL1 to Sl12.

As in the case of the measurement No. M1C, in the measurement No. M12C, if the detected voltage is 0V, since it cannot be determined whether the voltage detection line SL12 or SL13 is disconnected, the measurement in the measurement No. M11C is also determined together.

(Disconnection Detection Method D: Disconnection Detection Using On/Off States of Three Adjacent Balancing Switches)

As in the disconnection detection method A, this disconnection detection method uses the above (rule 1) and (rule 2).

This disconnection detection employs a technique in which when three adjacent balancing switches are turned on, off, and on in synchronization, respectively, to thereby disconnect any one of the two voltage detection lines sandwiched between the respective three balancing switches, the inter-terminal voltage of the unit cell corresponding to the center balancing switch, that is, the detected voltage between the two voltage detection lines that sandwich the center balancing switch therebetween becomes the voltage for two unit cells. In the measurement Nos. M1D and M12D, the voltage measurement is conducted in the same setting of the balancing switches as that in the disconnection detection method A. This is because, as described in the disconnection detection method B, when SL1 or SL13 is disconnected, if the balancing switch BS1 or BS12 is turned off, the voltage detection line SL1 or SL13 becomes floating with the result that the voltage is not decided (refer to FIGS. 13(b) and 16(b)).

Figure 22:
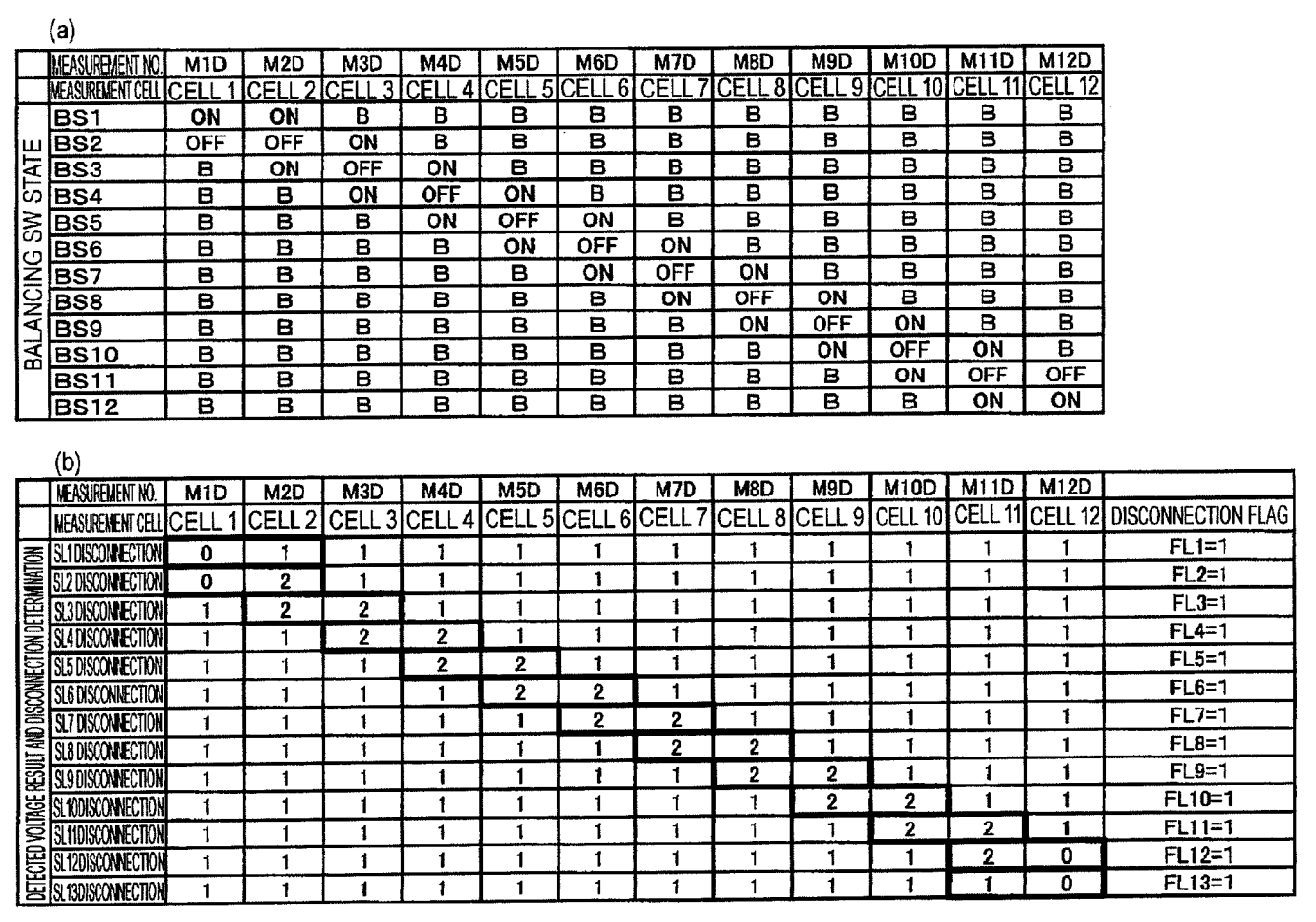

FIG. 22(a) illustrates the unit cells whose inter-terminal voltages are measured, and states of the balancing switches in measuring the inter-terminal voltage, in measurement Nos. M1D to M12D. Also, FIG. 22 (b) illustrates the measurement results of the inter-terminal voltages of the respective unit cells in the measurement Nos. MID to M12D, and "2" represents that the voltage for two unit cells is detected. As described above, the detection of this voltage is conducted by providing a threshold value in the determination in the voltage comparison unit 240 of the logic unit 213.

As illustrated in FIG. 22(b), as in the disconnection detection method C, in the measurement No. M1D, 0V is detected even if any one of the voltage detection lines SL1 and SL2 is disconnected (refer to FIGS. 13(a) and 14(a)). Therefore, whether the voltage detection line SL1 is disconnected, or the voltage detection line SL2 is disconnected, is determined with reference to the results of the subsequent measurement (No. M2D).

Since the disconnection of the voltage detection line SL1 does not affect the voltage measurements in the measurement Nos. M2D to M12D (refer to FIGS. 13(a) and 13(b)), a normal voltage value (for one unit cell), that is, "1" is detected in the measurement Nos. M2D to M12D of FIG. 22(b).

If the normal voltage is measured in the measurement No. M1D, it is determined that neither the voltage detection line SL1 nor SL2 is disconnected. Therefore, if only the disconnection of the voltage detection lines is determined, the measurement of the subsequent measurement No. M2D may be skipped to conduct the measurement in the measurement No. M3D. This is because the disconnection of the voltage detection lines SL3 and SL4 is determined in the measurement of the measurement Nos. M3D and M4D.

In this case, the voltage measurement of the cell 2 is not conducted. In this example, as in the disconnection detection method C, a description will be made based on the execution of all the measurement Nos. M1D to M12D in FIG. 22(a), assuming that the inter-terminal voltages (cell voltages) of all the unit cells are also measured.

In the measurement No. M2D, when any one of the voltage detection lines SL2 and SL3 is disconnected, the detected voltage becomes the voltage for two unit cells (refer to FIGS. 14(a), 15(b), and 22(b)).

Therefore, as described above, when the voltage detection line SL2 is disconnected, the detected voltage becomes "0" in the measurement No. M1D, and becomes the voltage for two unit cells in the measurement No. M2D. That is, the measurement results in the measurement Nos. M1D and M2D are different from each other, and it is determined that the voltage detection line SL2 is disconnected.

If the normal voltage (for one unit cell) is detected in the measurement No. M2D, it is determined that the voltage detection lines SL2 and SL3 are not disconnected. Therefore, when only the disconnection diagnosis is conducted, the subsequent measurement No. M3D may be skipped to conduct the measurement in the measurement No. M4D.

As described above, the respective cell voltages are measured up to the measurement No. M11D to determine the disconnection of the voltage detection lines SL1 to Sl12.

As in the case of the measurement No. MID, in the measurement No. M12D, if the detected voltage is 0V, since it cannot be determined whether the voltage detection line SL12 or SL13 is disconnected, the measurement in the measurement No. M11D is also determined together.

In the four disconnection detection methods described above, the description is made assuming that only one voltage detection line is disconnected.

A detailed description is omitted because of a complicated description. However, even if a plurality of disconnected voltage detection lines are present, the above four disconnection detection methods can be applied. Since an abnormal voltage can be detected in correspondence with the disconnected voltage detection line, it can be determined which voltage detection line is disconnected.

When both of the two adjacent voltage detection lines are disconnected, a voltage different from the detected voltage when only one voltage detection line is disconnected as described above may be detected. However, even in this case, it is possible to determine the disconnection with reference to a predicted detected voltage, and the measurement result by another cell voltage. However, a description will be omitted because of complicated description.

If the measuring operation of the above disconnection detection methods are conducted on the unit cells of n=1 to n=12, the disconnection diagnosis of the voltage detection lines of the cells can be conducted when measuring the cell voltages of the respective unit cells. Also, since the balancing switch of one unit cell is turned on, and the balancing switches of cells disposed above and/or below the one cell are turned off, the other balancing switches can conduct the original balancing operation.

(Modified Embodiment of Disconnection Detection Method C)

Only the disconnection detection can be conducted by about half number of voltage measurements with the use of the disconnection detection method C described above as follows.

AS illustrated in FIG. 21, if the voltage across the cell 1, which is measured by the measurement No. M1C, is normal, it can be determined that the voltage detection lines SL1 and SL2 are not disconnected. The subsequent measurement No. M2C is not executed, and the measurement No. M3C is executed.

If the measured voltage in the measurement No. M3C is normal, it is determined that the voltage detection lines SL3 and SL4 are not disconnected.

In this way, the measurement Nos. M1C to M12C in FIG. 21 are executed alternately. Since the disconnection of the voltage detection lines SL1 and SL13 is detected in only the measurement Nos. M1C and M12C, the measurement Nos. M1C and M12C are always executed.

When the voltage measurement is thus executed, it can be determined whether all of the voltage detection lines are disconnected, or not, on a two-line basis. If the disconnected voltage detection line is further specified, the disconnection detection methods A to D described above are appropriately used for determination so as to detect the disconnection of the voltage detection line involved in the voltage measurement in the measurement No. where the disconnection is detected. The detailed description will be omitted.

(Automatization of Disconnection Diagnosis by Cell Voltage Measurement)

Upon receiving one disconnection diagnosis command from the high-level controller (battery controller 500), the cell controller IC 300 can sequentially conduct the disconnection diagnosis such as in the disconnection detection methods A to D described above on all of the unit cells in the cell group controlled by this cell controller IC.

The voltage detection in the on/off states of all the balancing switches as described in the respective disconnection detection methods is sequentially conducted, and the voltage detection results are stored in the detection result register 241. The disconnection determination unit 242 sequentially conducts the disconnection determination of all the voltage detection lines on the basis of the detection results in all of the measurements stored in the detection result register 241, and stores the determination results in the diagnosis result register 243 of the logic unit 213.

Since the determination results of the disconnections are stored in the diagnosis result register 243 as a flag (disconnection flag), the high-level controller may transmit the disconnection diagnosis command to the cell controller IC 300 via a communication, and then read the flag of the determination results from a register of the logic unit 213 after completion of the disconnection diagnosis. The rightmost fields of FIGS. 19(*b*), 20(*b*), 21(*b*), and 22(*b*) represent the flags (disconnection flags) of the disconnection determination results.

In the disconnection detection method using the on/off states of the balancing switches as described above, a time to switch the detected voltage from the voltage for one unit cell to 0V or the voltage for two unit cells, and also return to the original normal voltage for one unit cell is affected by a time constant of an RC filter configured by a cell input resistor (Rcv) 202 and a cell input capacitor (Cin) 203 disposed on a CV terminal, as described above.

Therefore, since it takes some time to conduct the disconnection diagnosis on all of the voltage detection lines, it is preferable to conduct the disconnection diagnosis at the time of stopping a vehicle, for example, after key-off.

(Diagnosis of Disconnection Diagnosis Function Using Multiplexer Input Short-Circuiting Switches; Diagnosis Method E of Disconnection Diagnosis Function)

However, when the cell controller IC 300 conducts the diagnosis, if the register (diagnosis result register) in the logic unit which stores the determination results therein breaks down, there is a possibility that a value of the disconnection flag in the diagnosis result register 243 comes to a value of the disconnection flag value indicating that the disconnection is recognized although the voltage detection lines are not disconnected, or no disconnection is determined although the voltage detection line is disconnected. Also, there is a possibility that the disconnection state of the voltage detection line and the failure of the diagnosis result register further coincide with each other by chance.

Whether only the register function is normal, or not, is determined by inputting a value different from the value of the disconnection flag stored in the diagnosis result register to the register to confirm that the value of the disconnection flag is switched to another. Therefore, the operation of a register single unit can be confirmed by writing 0 or 1 directly into the register. However, in this example, the circuit operation until the flag is written into the diagnosis result register is conformed together with the operation of the voltage comparison unit 240, the detection result register 241, and the disconnection determination unit 242 (refer to FIG. 6) in the logic unit 213. For that reason, an artificial disconnection state is created with the use of the multiplexer input short-circuiting switches, and the operation (disconnection diagnosis function) of the multiplexer 210 to the diagnosis result register 243 in the logic unit 213 is confirmed. It is assumed that this diagnosis method is a diagnosis method E of the disconnection diagnosis function.

Figure 23:
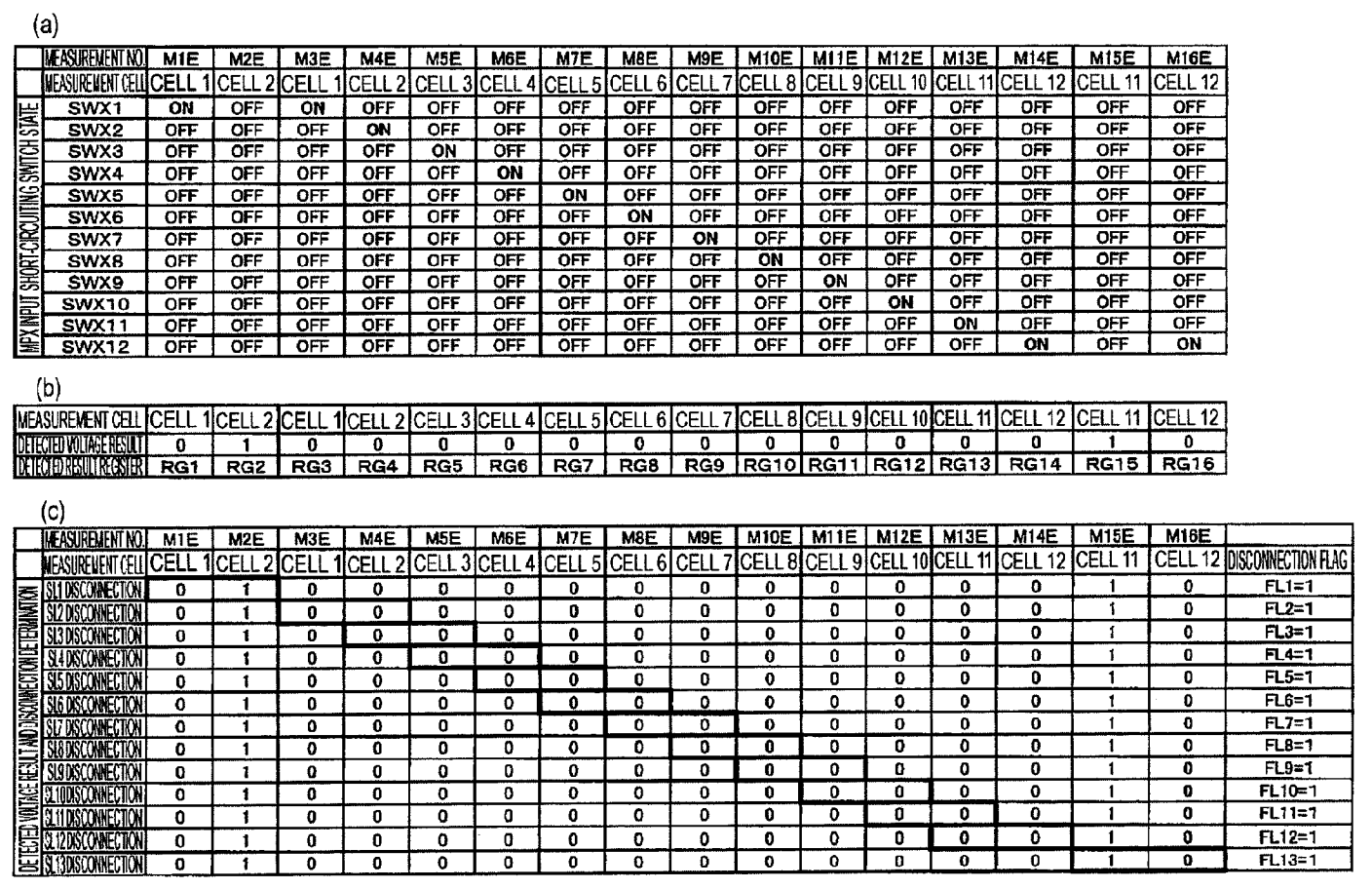

The artificial disconnection state is generated with the use of the multiplexer input short-circuiting switches 224 installed in the input of the multiplexer 210. A method of generating the artificial disconnection state is illustrated in FIG. 23(*a*). The multiplexer input short-circuiting switches 224 of the same number as that of the unit cells are provided. However, for simplification of description, it is assumed that the respective multiplexer input short-circuiting switches 224 are denoted by SWX1 to SWXn in correspondence with the cell 1 to cell n. Alternatively, it is assumed that the multiplexer input short-circuiting switches 224 installed in correspondence with the cell 1 to cell 12 are denoted by SWX1 to SWX12, according to the description of the above embodiments.

In measurement No. M1E, only the multiplexer input short-circuiting switch SWX1 is turned on to short-circuit the voltage detection lines SL1 and SL2, and the multiplexer 210 selects only inputs of the voltage detection lines SL1 and SL2 to output 0V to the differential amplifier 211.

In measurement No. M2E, all of the multiplexer input short-circuiting switches 224 SWX1 to SWX12 are turned off, and the multiplexer 210 selects only inputs of the voltage detection lines SL1 and SL2, thereby outputting the inter-terminal voltage (normal voltage) of the cell 1 to the differential amplifier 211.

The reason that the normal voltage is output to the differential amplifier 211 in the measurement of the measurement No. M2E is because, as described in the disconnection detection methods A to D, when the measured voltage in the measurement No. M1E is 0V, since it cannot be determined which of the voltage detection lines SL1 and SL2 is disconnected, the normal voltage (voltage for one unit cell) is output to the differential amplifier 211 in the measurement No. M2E in order to determine the disconnected voltage detection line.

In the measurement Nos. M3E to M14E, the multiplexer input short-circuiting switches SWX1 to SWX12 are turned on, respectively, and the multiplexer 210 selects the voltage detection lines above and below the respective multiplexer input short-circuiting switches that have been turned on, and outputs 0V to the differential amplifier 211.

In the measurement No. M13E, as in the measurement No. M2E, the multiplexer 210 outputs not 0V but the normal voltage (voltage for one unit cell) supplied from the cell 12 to the differential amplifier 211. This is also because, as described in the disconnection detection methods A to D, when the measured voltage in the M14E is 0V, since it cannot be determined which of the voltage detection lines SL12 and SL13 is disconnected, the normal voltage (voltage for one unit cell) is output to the differential amplifier 211 in the measurement No. M13E in order to determine the disconnected voltage detection line.

FIG. 23(*b*) illustrates the voltage detection results obtained by operating the multiplexer input short-circuiting switches SWX1 to SWX12 to output 0v or the normal voltage to the differential amplifier 211 as described above in a lump. The voltage detection results (measurement Nos. M1E to M16E) illustrated in FIG. 23 (b) are written into the detection result register 241. For description, it is assumed that the respective detection result registers 241 corresponding to the respective measurement Nos. are denoted by RG1 to RG16.

When 16 voltage detection results illustrated in FIG. 23(b) are written into the detection result register 241, the disconnection determination unit 242 conducts the disconnection determination of the voltage detection lines with reference to the values in the detection result register 241.

If the circuit operation until the flag is written into the diagnosis result register 243 and the operation of the logic (not shown in FIG. 5) are normal, as illustrated in FIG. 23(c), the disconnection of the respective voltage detection lines is determined, and the values of the respective disconnection flags are written into the diagnosis result register 243.

The diagnosis method E of the above disconnection diagnosis function is summarized in the following procedure.
(Step 1) Confirmation of the operation of the diagnosis result register 243 single unit
(Step 2) All of the disconnection flags FL1 to FL13 are set to 0
(Step 3) As illustrated in FIG. 23 (a), the multiplexer input short-circuiting switches SWX1 to SWX12 are turned on one by one to conduct the measurement Nos. M1E to M16E.
(Step 4) It is confirmed whether the value of the disconnection flag in the diagnosis result register 243, which is indicated on a right field of FIG. 23(b) is 1, or not.

In the above step 1, 1 or 0 is written or read directly with respect to the diagnosis result register 243. In this situation, if a failure occurs, the subsequent measurement is not conducted, and the battery controller 500 transmits a fact that the disconnection diagnosis function is in failure to the higher-level controller (vehicle controller, not shown).

The steps 1 to 3 are executed by the cell controller IC 300 according to an instruction of the high-level controller (battery controller 500).

In the step 4, the battery controller 500 determines whether the disconnection diagnosis function is normal, or not, on the basis of the value of the disconnection flag in the diagnosis result register 243, which is transmitted from the cell controller IC 300, and transmits the determination result to the high-level controller.

The disconnection diagnosis is executed as described above, thereby being capable of diagnosing whether the disconnection result register function is normal, or not. Since it takes time to diagnose the disconnection diagnosis function like the diagnosis of the multiplexer 210, the diagnosis of the disconnection diagnosis function may be conducted in a state where the vehicle stops at the time of starting the system or at the time of shutdown.

In this example, in order to input the normal voltage to the multiplexer 210, the inter-terminal voltage of the unit cells is used. However, if the voltage detection line is disconnected, the inter-terminal voltage of the unit cells cannot be used. However, the electric storage device according to the present invention is first characterized in that the disconnection diagnosis of the voltage detection line is conducted with using the on/off operation of the balancing switches, and the diagnosis of the function for diagnosing the disconnection diagnosis function is consistently auxiliary. With the combination of the disconnection diagnosis by the balancing diagnosis with the diagnosis of the disconnection diagnosis function, since it is detected that a failure occurs in a path of the voltage detection including the disconnection of the voltage detection line when any diagnosis is conducted, the battery controller 500 transmits failure information to the higher-level controller (vehicle controller) on the basis of the detected failure.

Also, although its detailed description is omitted, a circuit that inputs the normal voltage to the multiplexer 210 from another power supply can be provided. With this configuration, an artificial voltage corresponding to the disconnection of the voltage detection line is developed without voltage application from the unit cells, and the disconnection diagnosis function subsequent to the multiplexer 210 can be diagnosed.

Since it takes time to diagnose the disconnection diagnosis function using the above multiplexer input short-circuiting switches like the diagnosis of the above multiplexer, the diagnosis of the disconnection diagnosis function may be conducted in a state where the vehicle stops at the time of starting the system or at the time of shutdown.

However, if the circuit that inputs the normal voltage to the multiplexer input from another power supply is further provided as described above, there is no need to input the voltage across the unit cell to the multiplexer 210 through input resistors and an input capacitor (Rmpx, Rcv, and Cin in FIG. 5) provided for protection. Therefore, the disconnection diagnosis can be conducted in a short time.
(Disconnection Diagnosis by Balancing Circuit Diagnosis; Diagnosis Detection Method F)

Also, the disconnection diagnosis of the voltage detection lines is not conducted by the measured cell voltage value, but the disconnection diagnosis of the voltage detection lines can be conducted by conducting the disconnection diagnosis of the balancing circuit. As described above, since the balancing switch state detector circuits 223 can detect whether the normal balancing circuit flows, or not, the balancing switches are controlled as in the case of the disconnection diagnosis by the voltage measurement of the unit cells described above, and it is determined that the balancing current does not flow, according to the output of the balancing switch state detector circuits 223, instead of the cell voltage measurement, so that the disconnection diagnosis of the voltage detection lines can be conducted.

Since the output of the balancing switch state detector circuits 223 is the output of the comparator 229, the output is high or low. In this example, the detection results are stored in the detection result register 241 as high (=1) when the balancing current is detected, and low (=0) when the balancing current is not detected (refer to FIG. 6).

FIGS. 24 to 28 illustrate illustrative views of the above case. In FIGS. 24 to 28, as easily compared with the above disconnection detection methods A to D, FIGS. 13 to 17 are used substantially as they are, and whether the balancing current flows, or not, is indicated in the respective cases.

In those cases, only one voltage detection line is disconnected. However, those exemplifications can be easily expanded to a case where a plurality of voltage detection lines are disconnected.

As is apparent from FIGS. 24 to 27, in the case of the disconnection detection method F, the following two rules may be considered unlike the above disconnection detection methods A to D. In this case, for description, like the description with reference to FIGS. 13 to 16, it is assumed that Nos. of the unit cells, Nos. of the voltage detection lines, and Nos. of the balancing switches are denoted by cell 1 to cell m, SL1 to SLm+1, and BS1 to BSm, respectively. Also, it is assumed that the number n satisfies $2 \leq n \leq m$.
(Rule 5) When the balancing switch BSn−1 is off, and the balancing switch BSn is on, if the voltage detection line SLn is disconnected, no balancing current flows into the balancing switch BSn.

(Rule 6) When the balancing switch BSn is on, and the balancing switch BSn+1 is off, if the voltage detection line SLn+1 is disconnected, no balancing current flows into the balancing switch BSn.

In order to detect that the voltage detection line is disconnected according to a fact that no balancing current flows, there is a need to use the above rules 5 and 6 together, and turn off, on, and off the three adjacent balancing switches, respectively.

This is because, for example, when the balancing switch BSn is on, and the voltage detection line SLn+1 is disconnected, if the balancing switch BSn+1 conducts the balancing operation, and is turned on, a current flows in the cell n and the cell n+1 through the balancing switches BSn and BSn+1 both of which have been turned on (refer to FIGS. 25(c) and 26(c)).

Figure 27:
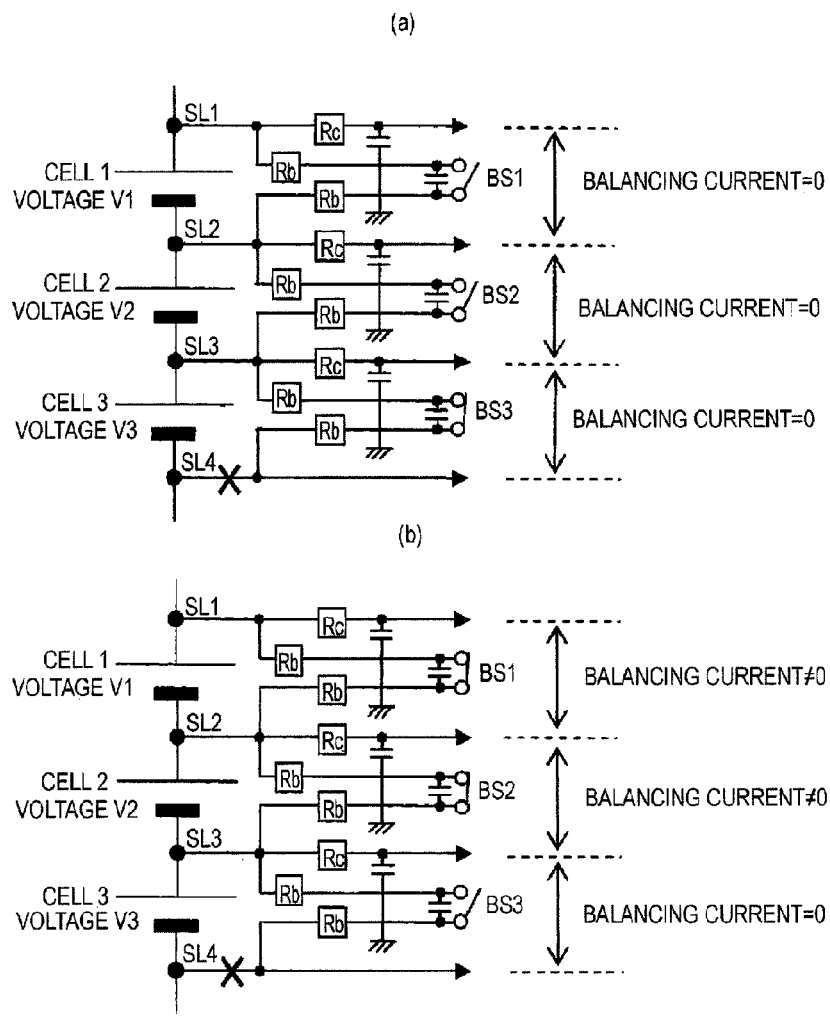
FIG. 27 is an illustrative view illustrating a method for detecting the disconnection of the lowest-level voltage detection line according to presence or absence of the balancing current detection with the use of the battery system monitoring apparatus according to the present invention. (a) and (b) illustrate the presence or absence of the balancing current detection in the respective different switching states.

In the highest-level voltage detection line SL1 and the lowest-level voltage detection line SL13, the three continuous balancing switches cannot be operated. However, as illustrated in FIG. 27, the above rules 5 and 6 can be applied by considering a virtual cell X and a virtual balancing switch BSX.

As a result, in this disconnection detection method F, the balancing switch can be operated to conduct the voltage detection in the same manner as that of the above-described disconnection detection method C. Also, a technique of conducting the disconnection determination of the voltage detection line according to the results of the two continuous measurements is also identical with that in the disconnection detection method C. In the disconnection diagnosis of the voltage detection lines SLn and SLn+1 on both ends of the n-th unit cell, the balancing switch 222 (BSn) of the n-th unit cell (cell n) is turned on, and the balancing switches 222 (BSn−1 and BSn+1) above and below that balancing switch 222 are turned off. In this situation, whether a current flows in the balancing switches BSn−1, BSn, and BSn+1, or not, is detected according to the output of the balancing switch state detector circuits 223. As illustrated in FIGS. 25(b) and 26(a), if the voltage detection line SLn on a positive side of the cell n, or the voltage detection line SLn+1 on a negative side thereof is disconnected, since no balancing current flows in the cell n, this state can be detected. As in the method using the cell voltage detection, in the measurement of the balancing currents in the two adjacent unit cells, if neither of the balancing currents can be detected, it can be determined that the voltage detection line between those two unit cells is disconnected.

(Disconnection Detection of Highest-Level Voltage Detection Line SL1)

As is apparent from FIGS. 24(a) and 25(a), it cannot be determined whether the voltage detection line SL1 or the voltage detection line SL2 is disconnected, even if the balancing switch BS1 is merely turned on so that no balancing current flows.

Under the circumstances, if the balancing current is detected when the balancing switch BS2 is turned on at subsequent timing, it is determined that the voltage detection line SL2 is not disconnected, and it is also determined that the voltage detection line SL1 is disconnected.

(Disconnection Detection of Lowest-Level Voltage Detection Line SLm+1)

As is apparent from FIGS. 26(b) and 27(a), it cannot be determined whether the voltage detection line SLm or the voltage detection line SLm+1 is disconnected, even if the balancing switch BSm is merely turned on so that no balancing current flows.

Under the circumstances, if the balancing current is detected when the balancing switch BSm−1 is turned on at previous timing, it is determined that the voltage detection line SLm is not disconnected, and it is also determined that the voltage detection line SLm+1 is disconnected.

(Automatization of Disconnection Diagnosis by Balancing Diagnosis)

A case in which the above disconnection detection method F is applied to the cell group having 12 unit cells illustrated in FIG. 5, as in the above-mentioned disconnection detection methods A to E, will be described.

The control of the balancing switches like the disconnection diagnosis by the cell voltage detection as in the disconnection detection method C illustrated in FIG. 21, and the detection of whether the balancing current flows, or not, are sequentially conducted on all of the unit cells 101 in the cell group 102 connected with the cell controller IC 300. The diagnosis is sequentially enabled by detection of the balancing current instead of the cell voltage detection. FIG. 29(a) illustrates an on/off state of the balancing switches when the respective balancing switches BS1 to 12 are turned on to detect the balancing currents. This is completely identical with the disconnection detection method C illustrated in FIG. 20.

As illustrated in FIG. 29(a), two balancing switches are turned on/off to measure the balancing currents in measurement No. M1F and measurement No. M12F. Those states can be considered like the measurement Nos. M2F to M11F by considering the virtual balancing switch as illustrated in FIG. 28.

The measurement of the measurement Nos. M1F to M12F is sequentially executed according to one instruction from the high-level controller (battery controller 500), and the outputs of the balancing switch state detector circuits 223 in all the measurements are stored in the detection result register 241. The disconnection determination unit 242 determines the disconnection of the voltage detection lines on the basis of the balancing current detection results in the measurement Nos. M1F to M12F, which are stored in the detection result register 241.

FIG. 29(b) illustrates the results obtained by executing the measurement Nos. (M1F to M12F) illustrated in FIG. 29(a) when it is determined that the respective voltage detection lines are disconnected in a lump. Reference numeral "0" indicates that no balancing current flows, and "1" indicates that a normal balancing current flows.

When any one of the voltage detection lines SL1 to SL12 is disconnected, data (detection results in the measurement Nos. M1F to M12F) on a row of the disconnected voltage line among data of the disconnections (SL1 disconnection to SL13 disconnection) of the respective voltage detection lines illustrated in FIG. 29(b) is stored in the detection result register 241.

The disconnection determination of the voltage detection lines SL2 to SL12 in the disconnection determination unit 242 (refer to FIG. 6) is completely identical with that in the above-mentioned disconnection detection method C. If the balancing currents are not detected in the measurement of the two continuous measurement Nos. Mn−1F and MnF, that is, if both of the results are "0", it is determined that the voltage detection line SLn between the two balancing switches BSn−1 and BSn is disconnected.

(Case in which Highest-Level Voltage Detection Line is Disconnected)

As described above, it cannot be determined whether the highest-level voltage detection line SL1 or the voltage detection line SL2 is disconnected, even if it is detected that no balancing current flows in the measurement No. M1F. In this case, it is determined by whether the balancing current is detected in the subsequent measurement No. M2F, or not.

When the normal balancing current is detected in the measurement No. M2F, it is determined that there is no disconnection in either of the voltage detection lines SL1 and SL2. Therefore, if no balancing current is detected in the measurement No. M1F, it is determined that the voltage detection line SL1 is disconnected.

(Voltage Detection when Lowest-Level Voltage Detection Line is Disconnected)

Also, in the lowest-level voltage detection line SL13, it cannot be determined whether the highest-level voltage detection line SL13 or the voltage detection line SL2 is disconnected, even if it is detected that no balancing current flows in the measurement No. M12F. In this case, it is determined whether the balancing current is detected in the measurement No. M11F at previous timing, or not.

When the normal balancing current is detected in the measurement No. M11F, it is determined that there is no disconnection in either of the voltage detection lines SL11 and SL12. Therefore, if no balancing current is detected in the measurement No. M12F, it is determined that the voltage detection line SL13 is disconnected.

As described above, the balancing terminal capacitor (Cb) 204 is provided as a bypass capacitor, and a time constant of an RC filter configured by this capacitor and a balancing resistor is considerably smaller than that of the RC filter configured by the cell input capacitor Cv and the cell input resistor Rcv. Therefore, the disconnection detection by the balancing current detection is also conducted at high speed.

Further, as described above, the on/off operation of the balancing discharge circuit can be conducted during the normal balancing discharge operation. Also, this operation does not affect the measurement of the inter-terminal voltages of the respective unit cells. Therefore, the above disconnection detection method F can be also implemented even during the operation of the vehicle.

(Diagnosis of Disconnection Diagnosis Function in the Disconnection Diagnosis by the Balancing Circuit Diagnosis; Diagnosis Method G of Disconnection Determination Function)

As in the case of the disconnection detection using the cell voltage detection, there is a need to diagnose whether the register within the logic unit 213 which stores the disconnection detection results therein functions, or not. Since the diagnosis method G of the disconnection determination function is quite similar to the above-mentioned diagnosis method E of the disconnection diagnosis function, common portions will be described in brief.

In the function diagnosis of this register, the outputs of the comparator 229 that turns on/off the balancing switch to come to a state where the balancing current flows, and a state where the balancing current does not flow are artificially generated in correspondence with the disconnection of the voltage detection line. There are three methods for generating the artificial comparator outputs.

A first generating method is a method for turning on/off the balancing switch to switch the output of the comparator 229.

A second method is a method for switching the switch circuit 228 of the balancing switch state detector circuit 223 in a state where the balancing switch is turned on, to switch the output of the comparator 229.

A third method is a method for directly rewriting the contents of the detection result register 241 to diagnose only the operation of the disconnection determination unit 242 and the operation of the diagnosis result register 243.

In the first and second generating methods, as in the above-mentioned respective diagnoses, the respective voltage detection lines are not disconnected, and therefore it is assumed that the normal balancing current flows when the respective balancing switches are turned on. Alternatively, as has already been described, it is possible to surely connect the battery modules 103 without disconnection of the voltage detection line, or input a voltage corresponding to the inter-terminal voltage of the unit cell from another power supply, to thereby artificially generate the output of the comparator 229.

When the diagnosis method G of the disconnection determination function described in this example is executed, the disconnection determination results, that is, all of the values of the disconnection flags FL1 to FL13 stored in the diagnosis result register 243 are set to 0 in advance. If the disconnection flag in which 0 is not set has already been present in this stage, the diagnosis result register 243 is in failure.

The on/off state of the balancing switch using the above first method is illustrated in FIG. 30(a). This is just opposite to the on/off states of the multiplexer input short-circuiting switches illustrated in FIG. 23(a). In this example, the measurements Nos. corresponding to the comparator outputs artificially generated are denoted by M1G to M16G.

When the balancing switch is off, since no balancing current flows, the comparator output becomes "0". Also, when the balancing switch is on, since the balancing current flows, the comparator output becomes "1". Therefore, the artificial detection results illustrated in FIG. 30(b) are written into the detection result register 241. FIG. 30(b) illustrates 16 artificial detection data (corresponding to measurement Nos. M1G to M16G) necessary to conduct the balancing diagnosis. Also, the respective detection result registers 241 into which the data is stored are denoted by RG1 to RG16.

Even when the above second method is used, the outputs of the comparator 229 are made identical with those in FIG. 30(b).

When the balancing switch is turned on, the output of the comparator 229 normally becomes "1". Under the circumstance, the switch circuit 228 of each balancing switch state detector circuit 223 is switched to invert the output of the comparator 229 and output "0". That is, when "OFF" is indicated in FIG. 30(a), the switch circuit 228 is switched to output an output opposite to the normal output from the comparator 229.

The artificial data also generated in the second method is identical with that illustrated in FIG. 30(b).

In the third method, the outputs of the artificial comparator 229 illustrated in FIG. 30(b) are written directly into the detection result register 241. This write data may be stored in a ROM (not shown) provided in the cell controller IC 300 in advance, and this data may be read and written. Also, the data may be supplied from the high-level controller (battery controller 500) through the communication.

FIG. 30(c) illustrates a method for conducting the disconnection detection with the use of the artificial comparator output corresponding to the disconnection state of the voltage detection line.

Figure 29:
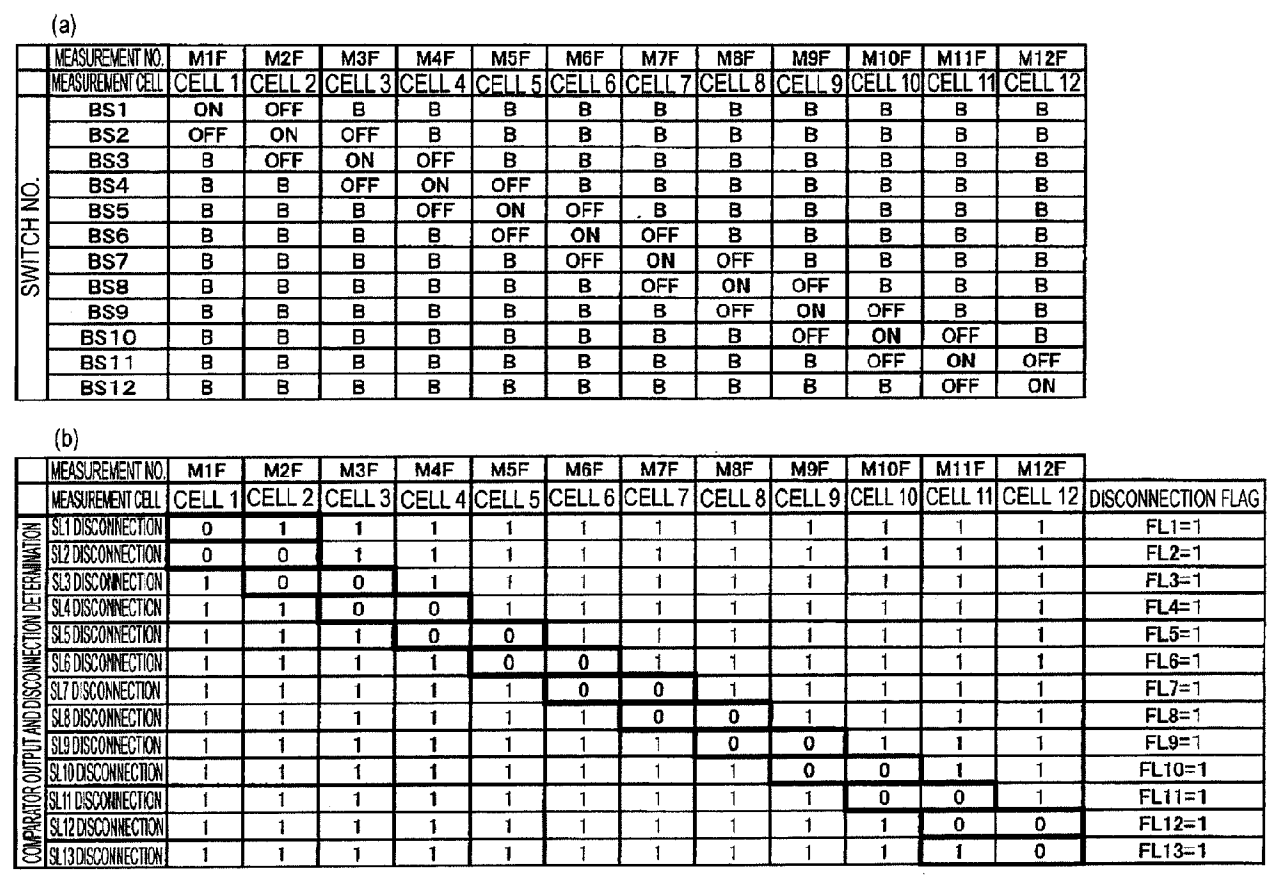
Figure 30:
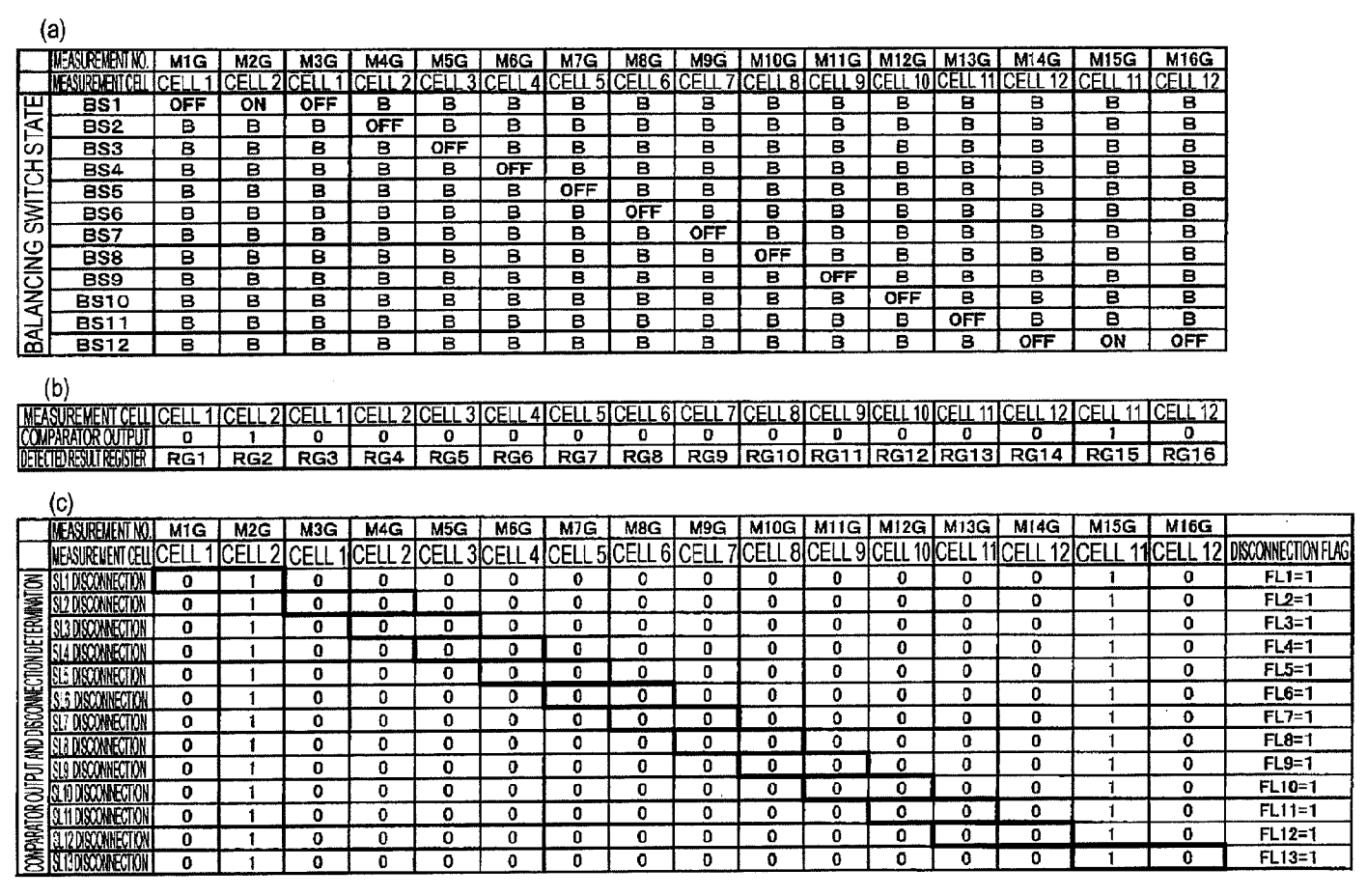

The disconnection detection in the disconnection detection method F described with reference to FIG. 29 is conducted by sequentially comparing the artificial comparator output data written in the detection result register 241 as illustrated in FIG. 30(b) with the disconnection determination patterns of the respective voltage detection lines SL1 to SL13.

(Diagnosis of Disconnection Determination Function)

In the determination of the disconnection of the voltage detection line SL1, the comparator output results of the cell 1 and the cell 2 are indicated by 0 and 1 (measurement Nos. M1G and M2G) for determination. This is identical with the case described in FIG. 29.

In the determination of the disconnection of the voltage detection line SL13, the comparator output results of the cell 11 and the cell 12 are indicated by 1 and 0 (measurement Nos. M15G and M16G) for determination.

In the determination of the disconnection of the voltage detection lined SL2 to SL12, the comparator outputs in the respective two continuous cells are indicated by 0 and 0 for determination.

When the disconnection determination of the respective voltage detection lines is conducted as described above, if the functions of the disconnection determination unit 242 and the diagnosis result register 243 are normal, all of the disconnection flags FL1 to FL13 are rewritten into 1. The disconnection flags FL1 to FL13 are transmitted to the high-level controller (battery controller 500) via a communication. If it is confirmed that all of the disconnection flags are rewritten into 1, it is determined that the disconnection diagnosis function in the disconnection diagnosis by the balancing circuit diagnosis operates normally.

As described above, in the disconnection detection system using the balancing current detection circuit, it is merely detected whether the balancing current flows, or not. Therefore, it is advantageous in that a response can be quickened as compared with a case using the cell voltage. In the case of the cell voltage detection, because an accurate detected cell voltage value is necessary, a time constant of the input RC filter is set to be large. Therefore, the voltage detection requires a sufficient long time as compared with this time constant. In the method using the balancing current detector circuit, since it is merely determined whether the balancing current flows, or not, there is no need to lengthen time.

An input 14 for measuring a supply voltage VDD is installed in the multiplexer 210 within the cell controller IC 300. This supply voltage VDD voltage is independent from a reference voltage source of the AD converter 212, and this voltage is measured whereby it can be diagnosed whether the voltage measurement system operates normally, or not. In the example of FIG. 5, the supply voltage VDD is used. However, another reference voltage source may be used if the voltage source is independent from the reference voltage source of the AD converter 212. In this case, if a precision of the reference voltage source is enhanced, a precise diagnosis of the voltage measurement system is enabled. Also, the diagnosis operation may be included in the disconnection diagnosis command. In this case, in order to diagnose the register (refer to FIG. 6) that stores the diagnosis results of the voltage measurement system therein, the multiplexer input short-circuiting switches 224 installed in the multiplexer input may be short-circuited. The multiplexer input short-circuiting switches 224 may be installed in a VDD voltage measurement input as well as a block voltage measurement input, and a temperature measurement input, and can be used in the switching operation determination of the multiplexer 210, and the diagnosis result determination at the time of diagnosis.

The logic unit 213 also includes a register (not shown in FIGS. 5 and 6) which stores the determination results of overcharge. The results obtained by comparing a digital output of the inter-terminal voltage from the AD converter 212 with a given threshold value indicative of the overcharge to detect the overcharge are output from this register as an FF signal. Also, in order to diagnose the operation of the voltage comparison unit 240, the logic unit 213 has a function of changing the cell voltage measurement results which are the output of the AD converter 212 into the measured voltage value equal to or larger than an overcharge threshold value, and inputting the measured voltage value to the voltage comparison unit 240 (not shown in FIGS. 5 and 6). This function is operated according to a communication instruction from the high-level controller (battery controller 500) to rewrite the detected cell voltage value into a value equal to or larger than the overcharge threshold value, and if the FF output of the register that stores the overcharge detection results from the voltage comparison unit 240 is indicative of a value of the overcharge, it can be diagnosed that the operation of the voltage comparison unit 240 is normal.

The command that conducts the disconnection diagnosis may include the operation of steadily conducting a variety of diagnoses such as the disconnection diagnosis, the diagnosis of the balancing switches, and the diagnosis of the voltage measurement system, and the measurement of the cell voltage, the block voltage, the temperature, and the like. In this case, the respective operations are conducted by merely regularly transmitting this command from the high-level controller to the cell controller IC 300, and necessary information is obtained by merely reading the diagnosis results or the measured value after the respective operations have been completed. This leads to such an advantage that a communication load of the high-level controller (battery controller 500) is reduced.

(Disconnection Detection Method when a Plurality of Cell Groups are Connected in Series)

In the above disconnection detection method, for simplification, the case in which one cell group and one cell controller IC that controls this cell group are provided has been exemplified.

As described above, when a plurality of cell groups are connected in series, the on/off states of the balancing switches in the unit cells belonging to the different cell groups connected directly to each other, which are two adjacent cell groups, mutually affect the measurement of the inter-terminal voltages of the respective unit cells or the measurement of the balancing currents. Therefore, in this case, even if the inter-terminal voltage or the balancing current of the unit cells in a certain cell group is detected, there is a need to also control the balancing switches in the adjacent cell group at the same time.

The disconnection detection method described above can be easily expanded even to a case where a plurality of cell groups are connected in series.

A case in which the disconnection detection method C described above is expanded to a case where two cell groups are connected in series will be described with reference to FIG. 21. The other disconnection detection methods can be expanded and executed in the same manner.

FIG. 33 illustrates an example in which the disconnection detection method C is applied to the two cell groups connected in series which are disposed on an upper side or a lower side of the service disconnect switch (SD-SW) 105, for example, as illustrated in FIGS. 3 and 4.

In this example, for example, it is assumed that 12 unit cells in the cell group 102b are the cell 1 to the cell 12, 12 unit cells in the cell group 102a are the cell 13 to the cell 24, and the balancing switches installed in the respective cells are BS1 to BS24. Also, it is assumed that 13 voltage detection lines that connect the 12 unit cells in the cell group 102b to the cell controller IC 300b are denoted by SL1 to SL13, and 13 voltage detection lines that connect the 12 unit cells in the cell group 102a to the cell controller IC 300a are denoted by SL13 to SL25. In this case, the voltage detection line SL13 is shared by those two cell groups.

It is assumed that the respective measurement Nos. of the inter-terminal voltages of the cell 1 to the cell 24 are M1CC to M24CC, and the disconnection detection flags of the voltage detection lines SL1 to SL25 are FL1 to FL25.

As understood from FIGS. 21 (a) and 33 (a), when the two cell groups are connected in series, the on/off state of the cell balancing switch in measurement No. M12C of FIG. 21 (a) is merely moved to the measurement number M24CC of FIG. 33 (a).

Figure 33B:
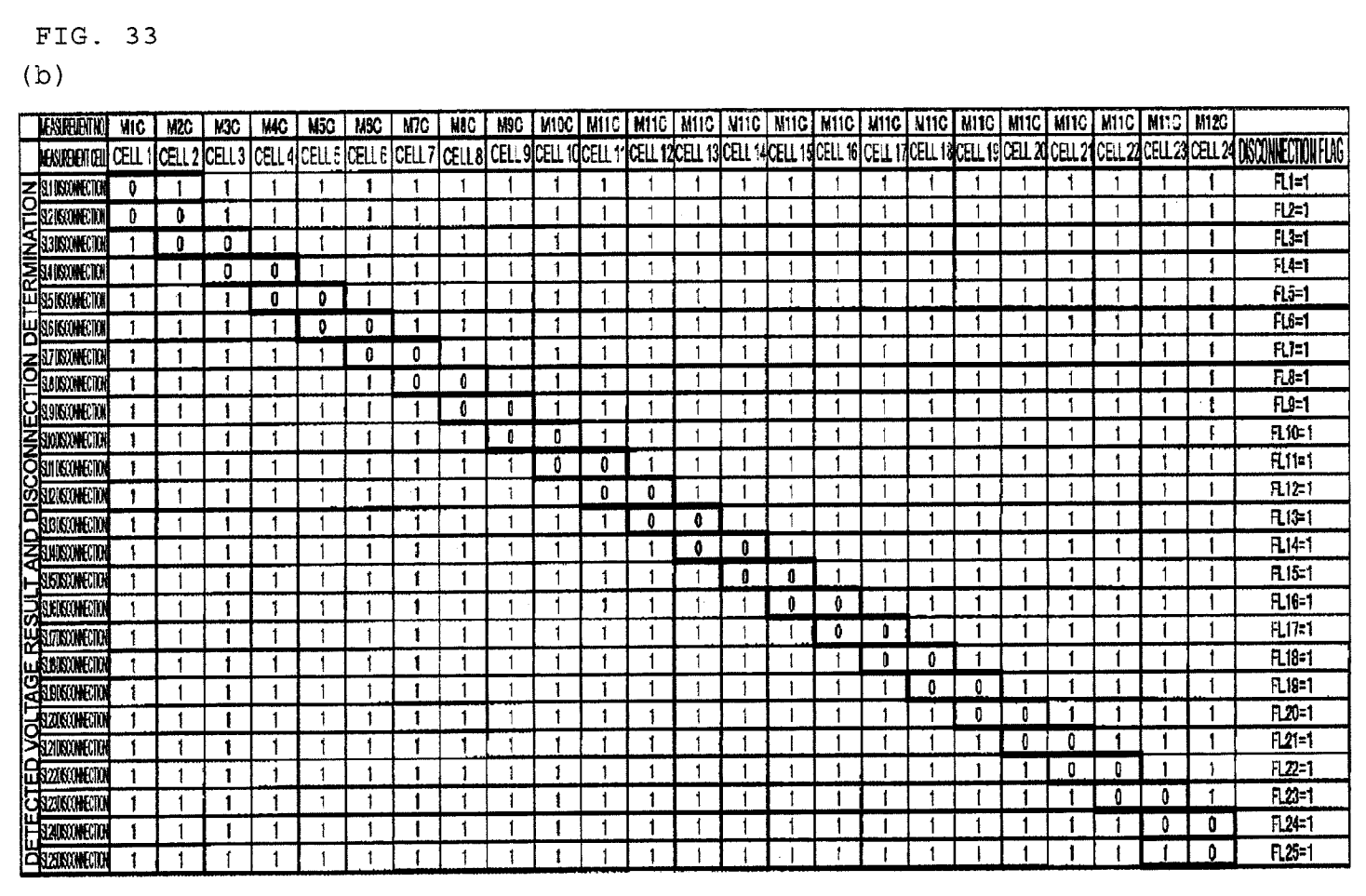

Also, as apparent from FIGS. 21(b) and 33 (b), the disconnection determination of the SL13 in FIG. 21 (b) is merely moved to the disconnection determination of the SL25 in FIG. 33(b).

All of the balancing switches in the two cell groups are controlled according to an instruction from the high-level battery controller 500, and can be controlled without any problem even if the balancing switches controlled at the same time belong to the two cell groups, separately.

Therefore, as apparent from this, likewise, the disconnection determination can be conducted even in the case where three or more cell groups are connected in series.

When the two cell groups are connected in series, as described above, the inter-terminal voltages of 24 unit cells in total are not sequentially measured, but, for example, the inter-terminal voltage measurements of only the cell 1 to cell 12 belonging to one cell group, and the cell 13 to cell 24 belonging to the other cell group can be conducted, separately. In the measurement of the cell 12 (M12CC), there is a need to turn off the balancing switch BS13 of the cell 13 in advance. If the BS13 conducts the balancing operation in the measurement of the cell 12, because the BS13 has on and off states, the measured value of the inter-terminal voltage in the cell 12 is not decided as described above.

It is more effective to measure the inter-terminal voltages of all the unit cells in the two cell groups as described above. However, since a measurement time becomes longer, it is preferable to measure the inter-terminal voltage in a state where the vehicle stops when all of the measurements are sequentially conducted, depending on the disconnection determination method.

The example of the disconnection detection method C has been described above. However, it would be easily understood that the other disconnection detection methods can be also expanded to a case where two or more cell groups are connected in series.

Second Embodiment

Figure 34:
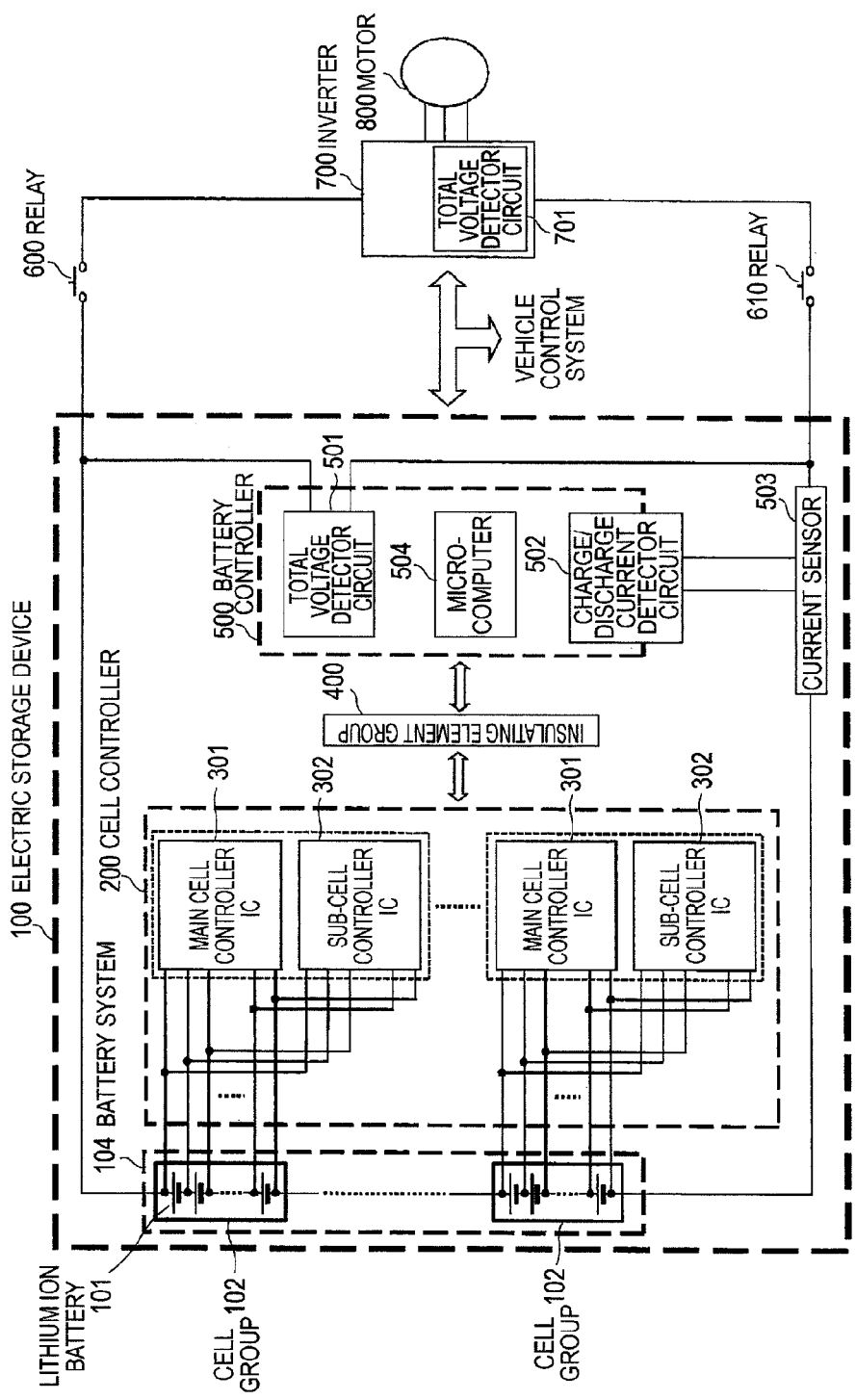
FIG. 34 illustrates a configuration example of an electric storage device for a hybrid electric vehicle including a battery system monitoring apparatus according to a second embodiment of the present invention.

FIG. 34 illustrates a configuration example of an electric storage device for a hybrid electric vehicle having a battery system monitoring apparatus according to a second embodiment of the present invention. This is an example in which the total voltage detector circuit 501 is also incorporated into the battery controller 500, which corresponds to FIG. 2 illustrating the first embodiment. As described in the first embodiment, if a total voltage of the battery system 104 can be measured in another method, the total voltage detector circuit 501 may not be disposed within the battery controller 500 as illustrated in FIG. 1.

The electric storage device 100 mainly includes cell groups 102 each having a plurality of lithium ion unit cells 101, a battery system 104 having a plurality of the cell groups 102 connected in series, a cell controller (battery monitoring device) 200 having plural pairs of a main cell controller IC 301 that mainly detects the inter-terminal voltages of the respective unit cells 101, and a sub cell controller IC 302 that mainly conducts the balancing discharge operation of the respective unit cells 101, and a battery controller 500 that controls the operation of the cell controller 200, and determines states of the respective unit cells.

As is apparent from a comparison of FIGS. 1 and 2 from FIG. 34, one of the cell controller ICs 300 according to the first embodiment corresponds to one pair of the main cell controller IC 301 and the sub cell controller IC 302 according to the second embodiment.

The battery controller 500 communicates with the plurality of main cell controller ICs 301 and sub cell controller ICs 302 through an insulating element group 400, and controls those main/sub cell controller ICs. A set of main cell controller IC 301 and sub cell controller IC 302 is installed for each of the cell groups 102 as in the first embodiment. The voltage detection lines between the battery system 104 and the cell controller 200 are connected to the cell controller 200 by a connector not shown.

This second embodiment is directed to a battery system monitoring apparatus having a configuration in which a function of the inter-terminal voltage measurement and a function of the balancing discharge of the respective unit cells in the cell controller IC 300 which is described in the first embodiment are conducted by different cell controller ICs. Each of the main cell controller ICs 301 and the sub cell controller ICs 302 has the same configuration and function as those of the cell controller IC 300.

However, in the battery system monitoring apparatus having the configuration according to the second embodiment, the balancing switch state detector circuits 223 according to the first embodiment as described in FIG. 5 becomes unnecessary. The function of the balancing switch state detector circuits 223, that is, the diagnosis function of the balancing switches 222 can be realized by measuring the inter-terminal voltages of the balancing switches 222, and comparing the measured inter-terminal voltages with a given threshold voltage, with the use of the sub cell controller IC 302, in the second embodiment.

Figure 35:
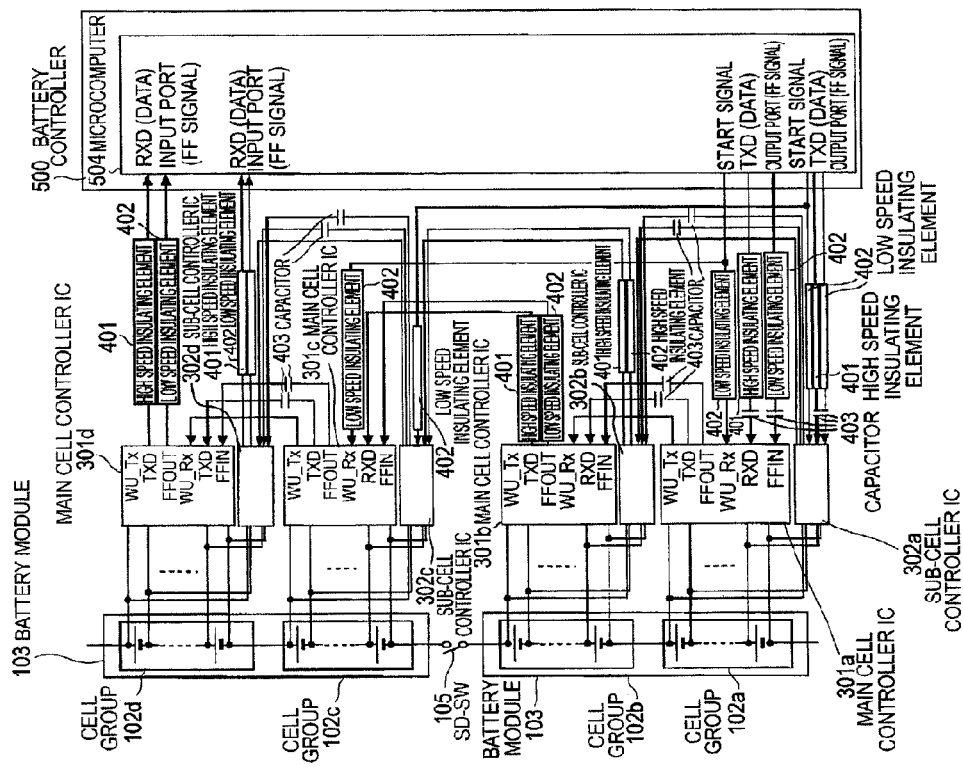
FIG. 35 is a diagram illustrating communication paths between respective main cell controllers, between respective sub cell controllers, and among the main cell controllers, the sub cell controllers, and the microcomputer in a battery control device having plural pairs of main cell controller ICs and sub cell controller ICs illustrated in FIG. 34.

FIG. 35 illustrates a communication connection example between the main cell controller ICs 301a to 301d, and the sub cell controller ICs 302a within the cell controller 200, and the microcomputer 504 within the battery controller 500. The microcomputer 504 has a start signal output port that outputs a start signal for staring the main cell controller ICs 301a to 301d or the sub cell controller ICs 302a to 302d within the cell controller 200, a transmit port TXD for transmitting a command and data, and an FF signal output port for outputting a data packet (FF signal) for detecting an overcharge state. As illustrated in FIG. 35, the start signal output port, the data output port TXD, and the FF signal output port are provided for each of the main cell controller ICs 301 and the sub cell controller, separately. Those output ports are completely identical in configuration between the main cell controller 301 and the sub cell controller.

A configuration illustrated in FIG. 35 corresponds to that of FIG. 3 described in the first embodiment. The main cell controller ICs 301a to 301d, and the sub cell controller ICs 302a to 302d are disposed in correspondence with the cell groups 102a to 102d, respectively. The high speed insulating element or the low speed insulating element between the main cell controller ICs 301 as corresponding to FIG. 4 in the first embodiment may be replaced with a capacitor. The use of the capacitor can reduce the power consumption.

In the following description, it is assumed that the main cell controller ICs 301a to 301d and the sub cell controller ICs 302a to 302d are not particularly restricted, respectively, if those components are merely called "main cell controller IC" or "sub cell controller IC". Further, if those components are merely called "cell controller IC", the main cell controller IC and the sub cell controller IC are collectively designated by the cell controller IC.

A communication path of each main cell controller IC 301 and a communication path of each sub cell controller IC 302 are configured, separately. However, those communication paths are completely identical in configuration with each other, and completely identical with the communication path and the communication method described in the first embodiment. As in the first embodiment, the bottom main cell controller IC 301*a* and the bottom sub cell controller IC 302*a* in FIG. 35 are set as a highest-level main cell controller IC and a highest-level sub cell controller IC which first receive the signals from the microcomputer 504, respectively. As described in the first embodiment, the top cell controller ICs in FIG. 35 may be configured by the highest-level cell controller ICs. For convenience of the drawings, in FIG. 35, the main cell controller ICs 301 and their communication paths are largely illustrated as compared with the sub cell controller ICs 302.

As illustrated in FIG. 35, the reason that the communication paths between the main cell controller ICs 301, and the communication paths between the sub cell control ICs are configured by different paths is because communications from the battery controller 500 to the main cell controller ICs and the sub cell controller ICs are conducted at a high speed.

All of the main cell controller ICs 301 and all of the sub cell controller ICs 302 can be connected to each other by the same communication path. However, since the communication paths become longer as much, it takes time for an instruction and data to reach the last main cell controller IC 301 or the last sub cell controller IC 302 from the battery controller 500.

Also, although omitted from the description, the main cell controller IC and the sub cell controller IC may operate in synchronization. If the communication paths between the main cell controller ICs 301, and the communication paths between the sub cell controller ICs are configured by the different paths, the main cell controller IC and the sub cell controller IC are easily synchronized.

Figure 36:
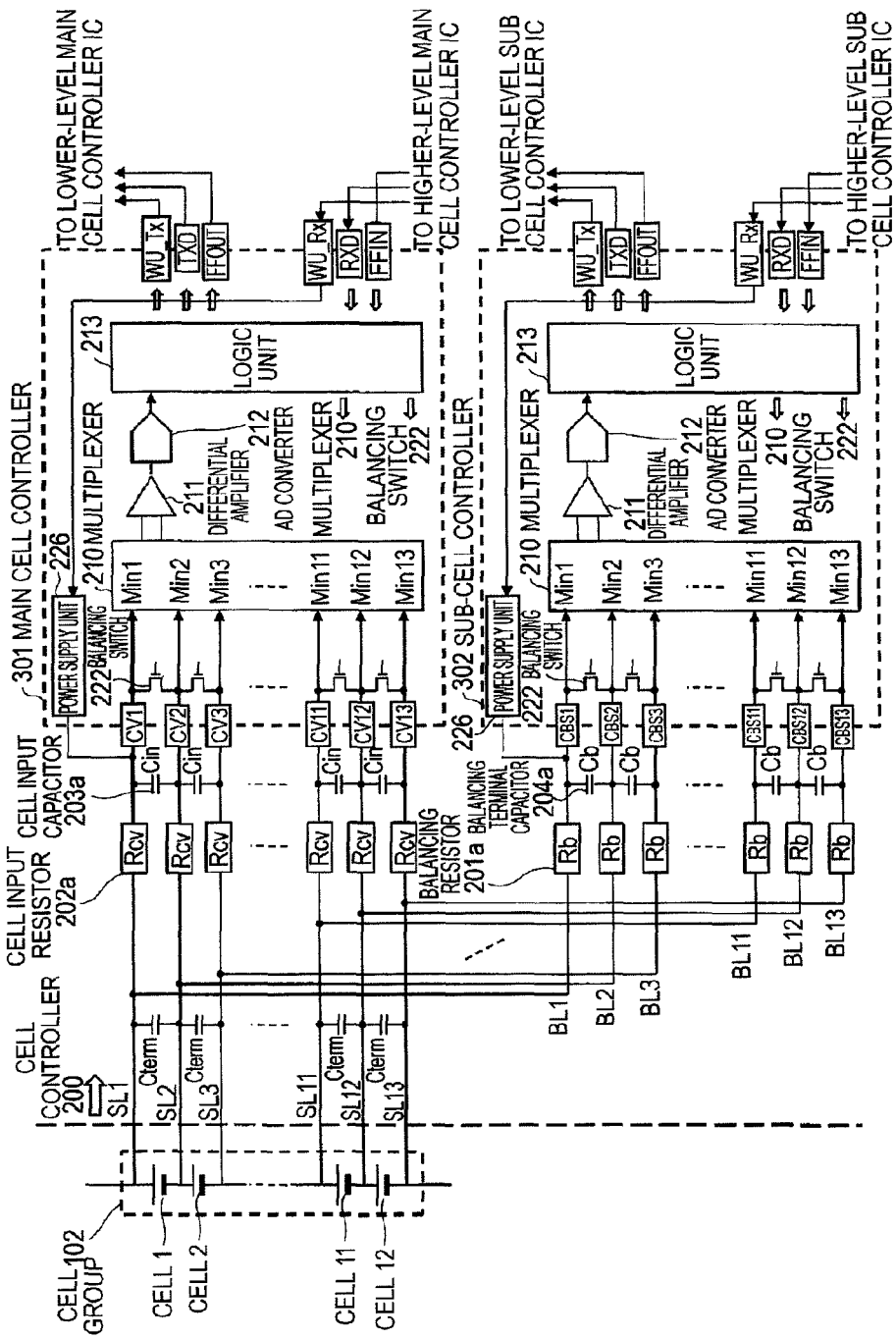
FIG. 36 is a schematic diagram illustrating function sharing of a pair of main cell controller IC and sub cell controller IC for controlling one cell group illustrated in FIG. 35.

FIG. 36 is a schematic diagram illustrating function sharing of the pair of main cell controller IC and sub cell controller IC that controls one cell group illustrated in FIG. 35. In this example, the main cell controller ICs 301 and the sub cell controller ICs 302 are configured by cell controller ICs having the same specification.

Differences in configuration and function between the main cell controller ICs 301 and the sub cell controller ICs in FIG. 36, and the cell controller IC 300 illustrated in FIG. 5 reside in the following aspects, and the other configuration and function are identical with each other. Therefore, the components illustrated in FIG. 5 but not illustrated in FIG. 36 except for the following aspects are merely omitted because of common components between FIGS. 5 and 36. Their description is omitted, but the functions and operation are described in the first embodiment. Therefore, their description will be omitted below.

Comparison in the Configuration of Cell Controller 200 Between the First Embodiment and the Second Embodiment The functions of the balancing terminals (BS01H to 12H, BS01L to 12L) of the cell controller IC 300 in FIG. 5 are replaced with balancing terminals CBS1 to 13 of the sub cell controller ICs 302.

In FIG. 36, the balancing switches 222 are connected directly between the two adjacent voltage detection lines (SL1 to 13) or the two adjacent balancing connection lines (BL1 to 13).

The cell input resistors 202 of the cell controller IC 300 in FIG. 5 correspond to cell input resistors 202*a* of the main cell controller IC 301 in FIG. 36, and the balancing resistors 201 of the cell controller IC 300 in FIG. 5 correspond to balancing resistors 201*a* in FIG. 36.

The balancing resistors 201*a* in FIG. 36 are disposed in the respective balancing connection lines BL1 to BL13 one by one. That is, the balancing resistors 201*a* of the balancing connection lines BL2 to BL12 are shared by the two adjacent balancing switches when conducting the balancing discharge.

The cell input capacitors 203 in the cell controller IC 300 of FIG. 5 correspond to cell input capacitors 203*a* of the main cell controller ICs 301 in FIG. 36, and the balancing terminal capacitors 204 in the cell controller IC 300 of FIG. 5 correspond to balancing terminal capacitors Cb of the sub cell controller ICs 302 in FIG. 36. The cell input capacitors 203*a* of the main cell controller IC 301 are connected between the two adjacent voltage detection lines.

Comparison of the Function of Cell Controller 200 Between First Embodiment and Second Embodiment In the cell controller IC 300 (first embodiment) in FIG. 5, one cell controller IC 300 conducts the inter-terminal voltage measurement of the respective unit cells, and the balancing discharge. On the other hand, in FIG. 36 (second embodiment), the inter-terminal voltage measurement of the respective unit cells is conducted by the main cell controller ICs 301, and the balancing discharge is normally conducted by the sub cell controller ICs 302.

In conducting the balancing discharge, in the second embodiment, when the two adjacent balancing switches 222 are turned on by the sub cell controller ICs 302 at the same time, a current twice as large as that when one balancing switch is turned on flows. Therefore, the balancing is conducted taking this phenomenon into account. If a problem about heat generation arises, the two adjacent balancing switches are controlled not to be turned on at the same time.

The disconnection diagnosis is normally conducted by the main cell controller ICs 301. However, in the second embodiment, since each of the cell input capacitors 203*a* is connected between the two adjacent voltage detection lines, if the balancing switch 222 connected to the disconnected voltage detection line is turned on/off, electric charge in the cell input capacitor 203*a* is changed, and it may take time to settle the voltage.

Except for the above aspects, there is no difference in the operation between the first embodiment and the second embodiment. Also, the internal configuration and operation of the cell controller IC 300, the main cell controller ICs 301, and the sub cell controller ICs 302 are common between the first embodiment and the second embodiment. In FIG. 36, protective capacitors Cterm are disposed between the two adjacent voltage detection lines in a portion closer to the cell group 102 in the voltage detection lines SL1 to SL13 on the cell controller 200 side. The protective capacitors Cterm are intended to remove noise entering the cell controller 200 from the cell group side or the inverter 700 side connected to the battery system 104, which is so-called ESD countermeasure capacitor. In fact, the Cterm is used even in the first embodiment, but omitted in FIG. 5.

In the second embodiment, the balancing discharge BS terminals of the respective unit cells, and the inter-terminal voltage measurement CV terminals are disposed in different cell controller ICs as respective dedicated terminals. Also, the balancing discharge circuits each including the balancing resistor (Rb) 201*a*, and the balancing switch BS 222 of the sub cell controller IC 302 are connected to the voltage detection lines SL1 to SL13 through the balancing connection lines BL1 to 13 on the unit cell side with respect to the cell input resistor (Rcv) 202*a*.

With the above configuration, as in the first embodiment, because no balancing current flows in the cell input resistor (Rcv) 202*a*, the inter-terminal voltage can be accurately measured by the main cell controller ICs 301. In a normal state where there is no disconnection in the voltage detection line, the balancing resistors (Rb) 201*a* and balancing terminal capacitors (Cb) 204*a* in the balancing discharge circuit, and the on/off operation of the balancing switches 222 in the sub cell controller IC 302 do not affect the inter-terminal voltage measurement of the respective unit cells in the main cell controller ICs 301. Up to now, for example, as disclosed in JP-A-2010-228523, the inter-terminal voltage measurement of the respective unit cells, and the balancing discharge are conducted by one cell controller IC. Also, since a part of the balancing discharge circuit is common to the inter-terminal voltage measurement circuit (voltage detection lines and cell input resistor), the inter-terminal voltage is reduced when the balancing discharge is conducted. Therefore, the accurate inter-terminal voltage measurement is implemented with the stop of the balancing discharge.

(RC Filter of Unit Cell Inter-Terminal Voltage Measurement Circuit and RC Filter of Balancing Discharge Circuit)

As has been also described in the first embodiment, also in the second embodiment, a time constant of an RC filter of the unit cell inter-terminal voltage measurement circuit including the cell input resistor (Rcv) 202*a* and the cell input capacitor (Cin) 203*a* is set to be larger than a time constant of the RC filter of the balancing discharge circuit including the balancing resistor 201*a* and the balancing terminal capacitor (Cb) 204*a*.

In the first embodiment and the second embodiment, the reason that the time constant of the RC filter in the balancing discharge circuit is set to be smaller than the time constant of the RC filter in the unit cell inter-terminal voltage measurement circuit is described below.

A resistance value of the balancing resistor 201 or 202*a* is reduced to quickly conduct the balancing discharge.

When the disconnection diagnosis is conducted with the use of the on/off states of the balancing switch in the balancing discharge circuit, the disconnection can be diagnosed at a high speed.

The function of the balancing switch state detector circuits 223 (refer to FIG. 5) of the cell controller IC 300 according to the first embodiment is replaced with the measurement function of the inter-terminal voltage of the balancing switches 222 by the sub cell controller ICs 302 in the second embodiment. The diagnosis of the balancing switches 222 can be conducted at a high speed by the sub cell controller ICs 302.

As described in the first embodiment, also in the second embodiment, a cutoff frequency of the RC filter in the unit cell inter-terminal voltage measurement circuit is set to about 50 Hz. However, in the second embodiment, each of the cell input capacitors 203*a* is connected between the two adjacent voltage detection lines, and configured as a common mode filter including the cell input capacitor 203*a* and the two cell input resistors 202*a* provided on the respective two voltage detection lines. A resistance value of the cell input resistor 202*a* and a capacitance value of the cell input capacitor are appropriately selected so that noise (about 20% in p-p, about 20 kHz) by switching of a semiconductor switching element of the inverter 700 is reduced to ⅟10 or lower as in the first embodiment.

Also, like the first embodiment, in the second embodiment, the RC filter of the balancing discharge circuit is configured as the common mode filter including the balancing terminal capacitor 204*a* and the two balancing resistors 201*a* disposed in the respective two adjacent balancing connection lines. The capacitance value of the balancing terminal capacitor 204*a* and the resistance value of the balancing resistor 201*a* are appropriately selected so that the cutoff frequency of the RC filter is set to about 10 times as large as that of the RC filter in the unit cell inter-terminal voltage measurement circuit. In this case, the balancing terminal capacitor 204*a* can be replaced with an inter-terminal parasitic capacitance of the sub cell IC controller 302, and a configuration having no balancing terminal capacitor 204*a* is also considered.

In the disconnection diagnosis using the on/off state of the balancing switches 222, or the diagnosis of the balancing switch 222, the inter-terminal voltage of the balancing switch 222 is largely different from each other between the on/off states of the balancing switch 222. As a result, there is no need to obtain the inter-terminal voltage of the determination threshold value balancing switch 222 with high precision.

In order to quickly conduct the balancing discharge, the balancing resistance is set to about 10Ω to several tens Ω, and an on-resistance of the balancing switches 222 configured by a MOSFET switch or the like is normally about 10Ω. Therefore, since the inter-terminal voltage of a lithium ion unit cell is about 4V, the inter-terminal voltage of the balancing switch when the balancing switch is turned on is about 1V. Since the noise by switching of the semiconductor switching element of the inverter 700 is reduced to ⅟10 or less, the noise is about 40 mV or lower. For example, if a threshold value of the determination of the on/off states of the balancing switches is set to 500 mv, the on/off states of the balancing switch can be determined without any problem.

The measurement of the inter-terminal voltage of the unit cells by the sub cell controller ICs 302 can be conducted with high precision. As occasion demands, the number of sampling in the sub cell controller ICs 302 is increased, or the measurement is conducted by a large number of times to average the inter-terminal voltages, thereby being capable of reducing the noise.

Also, as has already been described, the balancing discharge can be conducted with the use of the main cell controller ICs 301 although time is required.

Also, in the description of the second embodiment, the main cell controller ICs 301 and the sub cell controller ICs 302 are configured by the cell controllers having the same specification. However, the main cell controller ICs 301 and the sub cell controller ICs 302 have only to execute the respective operations described above, and may be different in the specification therebetween.

In particular, in the battery control device according to the present invention as described above, the balancing switches of the main cell controller ICs 301 are used in an off-state except that the balancing switches are used in the diagnosis operation. Also, the diagnosis operation can be also implemented by the balancing switch of the sub cell controller ICs 302. Therefore, in conducting the operation of the battery control device described above, the balancing switches of the main cell controller ICs 301 may be omitted.

However, it is important to securely conduct the diagnosis operation or the like in safety confirmation of vehicles, and therefore, the safety of vehicles can be improved by both of the main cell controller ICs 301 and the sub cell controller ICs 302 which keep the same functions as each other.

In the example described in the above embodiment, the battery system 104 is configured by connecting the cell groups 102 in series. The battery system 104 may be configured by connecting a plurality of cell groups in series-parallel or parallel.

Also, in the above description, the cell controller ICs 300 are disposed on a one-to-one with the cell groups 102. Alternatively, a plurality of cell groups can be controlled by one cell controller. Also, one cell group can be controlled by a plurality of cell controllers. The number of unit cells configuring the cell group can be variously modified according to the specifications of the battery module having a plurality of cell groups, or the battery system. Therefore, for example, n cell groups can be controlled by m cell controllers. Also, the specification of the various battery systems is set according to the power specification necessary for electric vehicles such as the HEV or EV having this battery system mounted therein.

Therefore, for example, when one cell controller IC 300 is arranged to control the plurality of cell groups 102 connected in series, the inter-terminal voltages of all the plural cell groups are input to the block voltage input unit 225. The output of the block voltage input unit 225 is selected by the multiplexer 210, and input to the differential amplifier 211 to conduct the voltage measurement. Also, when a plurality of cell controller ICs 300 control one cell group, the respective inter-terminal voltages of a portion of the cell groups controlled by the respective cell controller ICs 300 are input to the block voltage input units 225 of the respective cell controller ICs 300 to conduct the voltage measurement.

In the battery system monitoring apparatus according to the present invention, for example, the configuration and function of the cell controller described above are also applicable to the battery system having the above various configurations. In this manner, the battery system monitoring apparatus according to the present invention can be applied to the battery system of the various configurations, and also to the electric vehicles of the various specifications.

In the example described in the above embodiments, as described in FIGS. 5 and 6, the disconnection determination of the voltage detection lines and the diagnosis of the disconnection detection function are conducted by the disconnection determination unit 242 in the logic unit 213 of the cell controller IC 300. Alternatively, the function of the disconnection determination unit may be disposed in the battery controller 500 which is the high-level controller. For example, the data stored in the detection result register 241 may be read in the battery controller 500 as the FF signal, and the disconnection determination and the diagnosis of the disconnection determination and the diagnosis of the disconnection detection function may be conducted by the disconnection determination unit installed in the battery controller 500. In this case, the variety of tables (FIG. 19(a), FIG. 20(b), FIG. 21(b), FIG. 22(b), FIG. 23(c), FIG. 29(b), FIG. 30(b), and FIG. 33(b)) necessary for the disconnection determination and the diagnosis of the disconnection detection function may be also held in the battery controller 500.

The above description is applied to the examples of the embodiments according to the present invention, and the present invention is not limited to those embodiments. An ordinary skilled person in the art could implement various modifications without departing from the features of the present invention. In particular, in the disconnection detection of the voltage detection lines, the appropriate combination of the above-mentioned disconnection detection methods A to D, and F can be implemented. For example, the disconnection detection of a part of the plurality of voltage detection lines can be conducted by any one of the disconnection detection methods A to D, and F, and the disconnection detection of the remaining voltage detection lines can be conducted by another one of the disconnection detection methods A to D, and F.

Therefore, other examples conceivable within the technical concept of the present invention also fall within the scope of the present invention.

The content of the following Japanese Patent Applications is incorporated herein by reference.
JP-A-2011-122730 (filed on May 31, 2011)
JP-A-2011-122731 (filed on May 31, 2011)

The invention claimed is:

1. A battery system monitoring apparatus for a battery system having a cell group having a plurality of unit cells connected in series, the battery system monitoring apparatus comprising:
    a first control device that is disposed in correspondence with the cell group;
    a plurality of voltage detection lines that are disposed to connect a positive electrode and a negative electrode of each unit cell of the unit cells to the first control device, and input an inter-terminal voltage of each unit cell of the unit cells to the first control device;
    a first resistor disposed in series with each of the voltage detection lines;
    a first capacitor connected to each of the voltage detection lines; and
    a balancing discharge circuit disposed in correspondence with each unit cell of the unit cells and discharging said each unit cell when said each unit cell is discharged,
    wherein the first capacitor is connected between the voltage detection lines in a position between the first resistor and the first control device, and the first capacitor is connected to a part which is a lowest-level potential of the cell group on a side opposite to a side connected to the voltage detection line,
    wherein the balancing discharge circuit includes a balancing switch turned on or off when the unit cell is discharged, and a second resistor connected in series with the balancing switch, and
    wherein the balancing discharge circuit is connected to the voltage detection line connected to the positive electrode of the unit cell and the voltage detection line connected to the negative electrode of the unit cell in a position on a side of the cell group with respect to the first resistor.

2. The battery system monitoring apparatus according to claim 1,
    wherein the first control device includes:
    a selection unit that selects the positive electrode and the negative electrode of one unit cell of the plurality of unit cells to be measured for an inter-terminal voltage, and outputs a potential of each of the positive electrode and the negative electrode of the one unit cell;
    a voltage measurement unit that measures the inter-terminal voltage of the one unit cell according to the potential of each of the positive electrode and the negative electrode of the one unit cell, which is output from the selection unit;
    a voltage comparison unit that compares the inter-terminal voltage of the one unit cell, which is measured by the voltage measurement unit, with a given voltage threshold value;
    a first storage unit that stores a comparison result of the voltage comparison unit therein;

a determination unit that determines a disconnection of the voltage detection line based on the comparison result stored in the first storage unit; and a second storage unit that stores a determination result of the determination unit therein.

3. The battery system monitoring apparatus according to claim 2, wherein the determination unit determines whether the voltage detection line connected to the one unit cell is disconnected or not based on the inter-terminal voltage of the one unit cell, which is detected when the first balancing switch corresponding to the one unit cell, and a second balancing switch corresponding to a unit cell connected adjacent to and in series with the one unit cell are turned on or off, and wherein the determination result of the disconnection of the voltage detection line connected to the one unit cell is stored in the second storage unit.

4. The battery system monitoring apparatus according to claim 3, wherein the first control device sequentially measures the inter-terminal voltages with respect to all of the unit cells in the cell group, wherein the determination unit determines whether the disconnection is present in all of the voltage detection lines that connect the cell group to the first control device or not based on a measurement result of the inter-terminal voltages of all of the unit cells, and wherein the determination results of the disconnection of all of the voltage detection lines are stored in the second storage unit.

5. The battery system monitoring apparatus according to claim 1, wherein the first control device further includes:

a balancing current detection unit that is disposed in correspondence to each of the unit cells and detects whether a balancing current flowing into the balancing discharge circuit corresponding to the unit cell is present or not when the balancing switch corresponding to the unit cell is turned on, a first storage unit that stores a detection result detected by the balancing current detection unit, a determination unit that determines a disconnection of the voltage detection line based on the detection result stored in the first storage unit, and a second storage unit that stores a determination result of the determination unit therein, wherein the determination unit determines whether the voltage detection line connected to one unit cell of the plurality of unit cells is disconnected or not on the basis of the presence or absence of the balancing current flowing into the balancing discharge circuit corresponding to the one unit cell when the first balancing switch corresponding to the one unit cell is turned on, and the second balancing switch corresponding to a unit cell connected adjacent to and in series with the one unit cell is turned off, and wherein a determination result of the disconnection of the voltage detection line connected to the one unit cell is stored in the second storage unit.

6. The battery system monitoring apparatus according to claim 5, wherein the first control device sequentially detects whether the balancing current is present in correspondence with all of the unit cells in the cell group or not, wherein the determination unit determines whether the disconnection is present in all of the voltage detection lines that connect the cell group to the first control device or not based on detection results of whether the balancing current is present in correspondence with all of the unit cells or not, and wherein all of the determination results are stored in the second storage unit.

7. The battery system monitoring apparatus according to claim 5, wherein the balancing current detection unit includes: a reference voltage source;

a comparator that compares the inter-terminal voltage of the balancing switch corresponding to the unit cell with a reference voltage output from the reference voltage source to detect whether the balancing current flowing into the balancing discharge circuit corresponding to the unit cell is present or not; and an input switching unit that reverses inputs of the reference voltage and a terminal voltage of the balancing switch to the comparator and inputs the reference voltage and the terminal voltage of the balancing switch to the comparator, wherein an output value of the comparator is switched to the same output value as that when the voltage detection line connected with the balancing switch corresponding to the unit cell is disconnected when input of the reference voltage and the inter-terminal voltage of the balancing switch to the comparator is reversed by the input switching unit, and wherein the determination result of the determination unit based on the output value of the comparator when input of the reference voltage and the inter-terminal voltage of the balancing switch to the comparator is reversed by the input switching unit is stored in the second storage unit.

8. The battery system monitoring apparatus according to claim 1, further comprising an short-circuiting switch that is disposed in correspondence with each unit cell of said each unit cells and short-circuits the voltage detection lines connected to the unit cell, wherein the first control device includes:

a selection unit that selects the positive electrode and the negative electrode of one unit cell of the plurality of unit cells to be measured for an inter-terminal voltage, and outputs a potential of each of the positive electrode and the negative electrode of the one unit cell;

a voltage measurement unit that measures the inter-terminal voltage of the one unit cell according to the potential of each of the positive electrode and the negative electrode of the one unit cell, which is output from the selection unit;

a voltage comparison unit that compares the inter-terminal voltage of the one unit cell, which is measured by the voltage measurement unit, with a given voltage threshold value; and a determination unit that conducts determination based on a comparison result;

wherein the voltage measurement unit measures 0V or the inter-terminal voltage of the unit cell connected to the voltage detection lines as a voltage based on a potential difference between the voltage detection lines selected and output by the selection unit by turning on or off the short-circuiting switch, wherein the voltage comparison unit compares the voltage measured by the voltage measurement unit with a given voltage threshold value, and wherein the determination unit determines whether the selection unit operates normally or not based on a comparison result of the voltage comparison unit.

9. The battery system monitoring apparatus according to claim 1,
wherein the cell group includes N (N≥1) of the cell groups that are connected in series with each other,
wherein M (M≥1) of the first control devices are disposed so as to provide the first control device for each of the N cell groups, and the M first control devices are connected in series with each other through a communication line,
wherein a second control device is disposed to the M first control devices, and each of a highest-level first control device and a lowest-level first control device among the M first control devices and the second control device are connected through a communication line provided with an insulating element, and
wherein the M first control devices serially transmit a signal transmitted from the second control device through the communication line provided with the insulating element and transmit a signal to the second control device through the communication line provided with the insulating element.

10. The battery system monitoring apparatus according to claim 1, further comprising: a second capacitor which is connected in parallel to the balancing switch.

11. The battery system monitoring apparatus according to claim 10,
wherein a time constant of the first filter circuit including the first resistor and the first capacitor is larger than a time constant of the second filter including the second resistor and the second capacitor.

12. A battery system monitoring apparatus for a battery system having a cell group having a plurality of unit cells connected in series, the battery system monitoring apparatus comprising:
a first control device that is disposed in correspondence with the cell group;
a plurality of voltage detection lines that are disposed to connect a positive electrode and a negative electrode of each unit cell of the unit cells to the first control device, and input an inter-terminal voltage of each unit cell of the unit cells to the first control device; and
a power supply line that applies the inter-terminal voltage of the cell group to the first control device,
wherein the first control device includes:
a power supply unit;
a voltage input unit that inputs the inter-terminal voltage of the cell group;
a voltage measurement unit that measures the voltage; and
a selection unit that selects an output from the inter-terminal voltage input unit, and inputs the output to the voltage measurement unit,
wherein the power supply line is connected to the positive electrode of a highest-level unit cell of the cell group,
wherein the inter-terminal voltage of the cell group is input to the power supply unit through the power supply line, and
wherein the power supply unit includes an energization switch that applies the inter-terminal voltage of the cell group to the voltage input unit.

13. The battery system monitoring apparatus according to claim 12, further comprising
a first resistor connected in series to each of the voltage detection lines; and
a balancing discharge circuit disposed in correspondence with each unit cell of said each unit cells and discharging said each unit cell when the unit cell is balanced,
wherein the balancing discharge circuit including:
a balancing switch turned on or off when said each unit cell is balanced, and
a second resistor connected in series with the balancing switch, and
wherein the balancing discharge circuit is connected the voltage detection line connected to the positive electrode of said each unit cell, and the voltage detection line connected to the negative electrode thereof in a position on a side of the cell group with respect to the first resistor.

14. The battery system monitoring apparatus according to claim 12,
wherein the power supply unit turns on the energization switch to apply the inter-terminal voltage of the cell group to the voltage input unit when the first control device starts according to a start signal received from an external.

15. The battery system monitoring apparatus according to claim 12,
wherein the voltage input unit includes:
a voltage divider circuit that divides the inter-terminal voltage of the cell group; and
a sample and hold circuit that holds a divided voltage divided by the voltage divider circuit.

16. The battery system monitoring apparatus according to claim 15,
wherein the voltage input unit further includes a filter circuit that removes noise of the inter-terminal voltage of the cell group, which is input from the power supply unit,
wherein the filter includes a capacitor installed outside the first control device,
wherein the first control device further includes a filter connection terminal for connecting the capacitor, and
wherein the capacitor is connected to the voltage divider circuit through the filter connection terminal.

17. The battery system monitoring apparatus according to claim 16,
wherein the voltage divider circuit includes a voltage divider resistor installed outside the first control device,
wherein the first control device includes a voltage divider resistor connection terminal for connecting the voltage divider resistor, and
wherein the voltage divider resistor is connected to the power supply unit and the sample and hold circuit through the voltage divider resistor connection terminal.

18. The battery system monitoring apparatus according to claim 15,
wherein the voltage divider circuit includes a voltage divider resistor installed outside the first control device,
wherein the first control device includes a voltage divider resistor connection terminal for connecting the voltage divider resistor, and
wherein the voltage divider resistor is connected to the power supply unit and the sample and hold circuit through the voltage divider resistor connection terminal.

19. The battery system monitoring apparatus according to claim 12,
wherein the cell group includes N (N≥1) of the cell groups that are connected in series with each other,
wherein M (M≥1) of the first control devices are disposed so as to provide the first control device for each of the N cell groups, and the M first control devices are connected in series with each other through a communication line, wherein a second control device is disposed to the M first control devices, and each of a highest-level first control device and a lowest-level first control device among the M first control devices and the second control device are connected through a communication line provided with an insulating element, wherein the M first control devices serially transmit a signal transmitted from the second control device through the communication line provided with the insulating element and transmit a signal to the second control device through the communication line provided with the insulating element, wherein the second control device transmits voltage measurement instruction signals for allowing the M first control devices to measure the inter-terminal voltages of the corresponding cell groups substantially at the same time to the M first control devices, and calculates a total voltage of the battery system according to the inter-terminal voltages of the corresponding cell groups, which are transmitted from the M first control devices.

20. A battery system monitoring apparatus for a battery system having a cell group having a plurality of unit cells connected in series, the battery system monitoring apparatus comprising:
- a first control device that is disposed in correspondence with the cell group and measures an inter-terminal voltage of each unit cell of the unit cells;
- a second control device that is disposed in correspondence with the cell group and controls discharge of the unit cells when charge states between the unit cells are balanced;
- a plurality of voltage detection lines that connect a positive electrode and a negative electrode of each unit cell of the unit cells to the first control device, and are disposed to input the inter-terminal voltage of each unit cell of the unit cells to the first control device;
- a first resistor disposed in series with each of the voltage detection lines;
- a first capacitor connected to the positive electrode and the negative electrode of each unit cell of the unit cells;
- a plurality of balancing lines branched from the respective voltage detection lines and connected to the second control device;
- a second resistor connected in series with each of the balancing lines;
- a second capacitor connected between the balancing lines branched from the voltage detection lines connected, respectively, to the positive electrode and the negative electrode of each unit cell of the unit cells; and
- a balancing switch that is disposed in correspondence with each unit cell of the unit cells, connected between the balancing lines branched from the voltage detection lines connected, respectively, to the positive electrode and the negative electrode of each unit cell of the unit cells, and turned on or off when said each unit cell is discharged, wherein the first capacitor is connected to the voltage detection lines in a position between the first resistor and the first control device, and wherein the second capacitor is connected to the balancing lines in a position between the second resistor and the second control device.

21. The battery system monitoring apparatus according to claim 20,
wherein the cell group includes N (N≥1) of the cell groups that are connected in series with each other, wherein M (M≥1) of the first control devices and M (M≥1) of the second control devices are disposed so as to provide the first control device and the second control device for each of the N cell groups, the M first control devices are connected in series with each other through a communication line and the M second control devices are connected in series with each other through a communication line, wherein a third control device is provided to the M first control devices and the M second control devices, a highest-level first control device and a lowest-level first control device among the M first control devices and the third control device are connected through a communication line provided with an insulating element, and a highest-level second control device and a lowest-level second control device among the M second control devices and the third control device are connected through a communication line provided with an insulating element, wherein the M first control devices serially transmit a signal transmitted from the third control device through the communication line provided with the insulating element and transmit a signal to the third control device through the communication line provided with the insulating element, and wherein the M second control devices serially transmit a signal transmitted from the third control device through the communication line provided with the insulating element and transmit a signal to the third control device through the communication line provided with the insulating element.

22. The battery system monitoring apparatus according to claim 20,
wherein a time constant of a first filter circuit including the first resistor and the first capacitor is larger than a time constant of a second filter circuit including the second resistor and the second capacitor.

* * * * *